United States Patent
Oda et al.

(10) Patent No.: US 9,966,517 B2
(45) Date of Patent: May 8, 2018

(54) LED LEADFRAME OR LED SUBSTRATE, SEMICONDUCTOR DEVICE, AND METHOD FOR MANUFACTURING LED LEADFRAME OR LED SUBSTRATE

(71) Applicant: DAI NIPPON PRINTING CO., LTD., Tokyo-To (JP)

(72) Inventors: Kazunori Oda, Kawaguchi (JP); Akira Sakamoto, Kumagaya (JP); Yoshinori Murata, Iruma-gun (JP); Kenzaburo Kawai, Matsudo (JP); Koichi Suzuki, Asaka (JP); Megumi Oishi, Fujimi (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days. days.

(21) Appl. No.: 14/965,083

(22) Filed: Dec. 10, 2015

(65) Prior Publication Data

US 2016/0099395 A1     Apr. 7, 2016

Related U.S. Application Data

(63) Continuation of application No. 13/578,563, filed as application No. PCT/JP2011/058042 on Mar. 30, 2011, now Pat. No. 9,263,315.

(30) Foreign Application Priority Data

| Mar. 30, 2010 | (JP) | ................................ 2010-078854 |
| Jul. 16, 2010 | (JP) | ................................ 2010-162086 |
| Jul. 26, 2010 | (JP) | ................................ 2010-167298 |

(51) Int. Cl.
*H01L 33/00* (2010.01)
*H01L 33/62* (2010.01)
(Continued)

(52) U.S. Cl.
CPC .......... *H01L 33/62* (2013.01); *H01L 21/4828* (2013.01); *H01L 21/56* (2013.01);
(Continued)

(58) Field of Classification Search
CPC ... H01L 2224/48091; H01L 2924/3025; H01L 2224/48247; H01L 33/60; H01L 33/62
See application file for complete search history.

(56) References Cited

U.S. PATENT DOCUMENTS

| 6,501,156 B1 | 12/2002 | Nakanishi et al. |
| 6,756,610 B2 * | 6/2004 | Sakamoto ............. H01L 33/486 257/100 |

(Continued)

FOREIGN PATENT DOCUMENTS

| CN | 101060157 A | 10/2007 |
| CN | 101159302 A | 4/2008 |

(Continued)

OTHER PUBLICATIONS

Kim et al., Korean Publication Date Jan. 4, 2009, machine translation provided Oct. 12, 2016.*

(Continued)

*Primary Examiner* — Mohsen Ahmadi
*Assistant Examiner* — Frederick B Hargrove
(74) *Attorney, Agent, or Firm* — Oliff PLC

(57) ABSTRACT

An LED leadframe or LED substrate includes a main body portion having a mounting surface for mounting an LED element thereover. A reflection metal layer serving as a reflection layer for reflecting light from the LED element is disposed over the mounting surface of the main body portion. The reflection metal layer comprises an alloy of platinum and silver or an alloy of gold and silver. The reflection metal layer efficiently reflects light emitted from the LED element and suppresses corrosion due to the
(Continued)

US 9,966,517 B2

Page 2 presence of a gas, thereby capable of maintaining reflection characteristics of light from the LED element.

12 Claims, 43 Drawing Sheets

(51) Int. Cl.
| | |
|---|---|
| *H01L 23/495* | (2006.01) |
| *H01L 33/52* | (2010.01) |
| *H01L 21/48* | (2006.01) |
| *H01L 21/56* | (2006.01) |
| *H01L 21/683* | (2006.01) |
| *H01L 33/48* | (2010.01) |
| *H01L 33/60* | (2010.01) |
| *H01L 23/31* | (2006.01) |
| *H01L 33/56* | (2010.01) |
| *H01L 23/498* | (2006.01) |
| *H01L 23/00* | (2006.01) |

(52) U.S. Cl.
CPC ...... *H01L 21/6835* (2013.01); *H01L 23/3121* (2013.01); *H01L 23/49503* (2013.01); *H01L 23/49541* (2013.01); *H01L 24/97* (2013.01); *H01L 33/486* (2013.01); *H01L 33/52* (2013.01); *H01L 33/56* (2013.01); *H01L 33/60* (2013.01); *H01L 23/49582* (2013.01); *H01L 23/49861* (2013.01); *H01L 24/16* (2013.01); *H01L 24/29* (2013.01); *H01L 24/32* (2013.01); *H01L 24/45* (2013.01); *H01L 24/48* (2013.01); *H01L 24/81* (2013.01); *H01L 24/83* (2013.01); *H01L 24/85* (2013.01); *H01L 2224/131* (2013.01); *H01L 2224/13144* (2013.01); *H01L 2224/16225* (2013.01); *H01L 2224/16245* (2013.01); *H01L 2224/2919* (2013.01); *H01L 2224/29101* (2013.01); *H01L 2224/32245* (2013.01); *H01L 2224/45144* (2013.01); *H01L 2224/48091* (2013.01); *H01L 2224/48245* (2013.01); *H01L 2224/48247* (2013.01); *H01L 2224/48465* (2013.01); *H01L 2224/48599* (2013.01); *H01L 2224/48639* (2013.01); *H01L 2224/48644* (2013.01); *H01L 2224/48669* (2013.01); *H01L 2224/73265* (2013.01); *H01L 2224/83* (2013.01); *H01L 2224/85439* (2013.01); *H01L 2224/85444* (2013.01); *H01L 2224/85469* (2013.01); *H01L 2224/92247* (2013.01); *H01L 2224/97* (2013.01); *H01L 2924/0104* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01014* (2013.01); *H01L 2924/01019* (2013.01); *H01L 2924/01022* (2013.01); *H01L 2924/01028* (2013.01); *H01L 2924/01029* (2013.01); *H01L 2924/01033* (2013.01); *H01L 2924/01045* (2013.01); *H01L 2924/01047* (2013.01); *H01L 2924/01049* (2013.01); *H01L 2924/01072* (2013.01); *H01L 2924/01074* (2013.01); *H01L 2924/01078* (2013.01); *H01L 2924/01079* (2013.01); *H01L 2924/01082* (2013.01); *H01L 2924/01327* (2013.01); *H01L 2924/078* (2013.01); *H01L 2924/10329* (2013.01); *H01L 2924/12041* (2013.01); *H01L 2924/15747* (2013.01); *H01L 2924/15787* (2013.01); *H01L 2924/15788* (2013.01); *H01L 2924/181* (2013.01); *H01L 2924/1815* (2013.01); *H01L 2933/005* (2013.01); *H01L 2933/0058* (2013.01); *H01L 2933/0066* (2013.01)

(56) References Cited

U.S. PATENT DOCUMENTS

| | | | |
|---|---|---|---|
| 8,338,926 B2 | 12/2012 | Kobayashi et al. | |
| 2005/0001219 A1* | 1/2005 | Minamio | H01L 27/14618 257/79 |
| 2006/0065901 A1 | 3/2006 | Aoyagi et al. | |
| 2008/0083973 A1* | 4/2008 | Yamada | H01L 33/60 257/676 |
| 2008/0093715 A1 | 4/2008 | Lange et al. | |
| 2009/0141498 A1* | 6/2009 | Kawanobe | H01L 33/60 362/267 |
| 2010/0013069 A1* | 1/2010 | Kasuya | H01L 21/561 257/676 |
| 2010/0314654 A1* | 12/2010 | Hayashi | H01L 33/486 257/99 |
| 2011/0031526 A1 | 2/2011 | Han et al. | |
| 2011/0210354 A1* | 9/2011 | Ichikawa | B29C 45/0055 257/98 |
| 2012/0061822 A1 | 3/2012 | Pagaila | |
| 2012/0168800 A1 | 7/2012 | Kobayashi et al. | |

FOREIGN PATENT DOCUMENTS

| | | |
|---|---|---|
| CN | 101452904 A | 6/2009 |
| JP | H03-008459 A | 1/1991 |
| JP | 2004-241766 A | 8/2004 |
| JP | 2006-072013 A | 3/2006 |
| JP | 2006-100500 A | 4/2006 |
| JP | 2006-173605 A | 6/2006 |
| JP | 2006-245032 A | 9/2006 |
| JP | 2007-109887 A | 4/2007 |
| JP | 2007-294631 A | 11/2007 |
| JP | 2008-091818 A | 4/2008 |
| JP | 2008-147511 A | 6/2008 |
| JP | 2008-182242 A | 8/2008 |
| JP | 2009-055006 A | 3/2009 |
| JP | 2009-076948 A | 4/2009 |
| JP | 2009-135355 A | 6/2009 |
| JP | 2009-224536 A | 10/2009 |
| JP | 2009-272345 A | 11/2009 |
| JP | 2010-062272 A | 3/2010 |
| JP | 2010-103164 A | 5/2010 |
| JP | 2010-135729 A | 6/2010 |
| JP | 2010-166044 A | 7/2010 |
| JP | 2010-199105 A | 9/2010 |
| JP | 2011-003777 A | 1/2011 |
| JP | 2011-222881 A | 11/2011 |
| KR | 2008-0088827 A | 10/2008 |
| KR | 10-0877881 B1 | 1/2009 |
| WO | 2009/005042 A1 | 1/2009 |
| WO | WO 2010026716 A1 * | 3/2010 ........ B29C 45/0055 |
| WO | 2010-071182 A1 | 6/2010 |
| WO | 2010-074184 A1 | 7/2010 |
| WO | 2010-150824 A1 | 12/2010 |

OTHER PUBLICATIONS

Nov. 7, 2014 Office Action issued in Japanese Application No. 2011-075968.
Dec. 5, 2014 Office Action issued in Japanese Application No. 2010-167298.
Dec. 1, 2014 Office Action issued in Chinese Patent Application No. 201180014468.0.
Mar. 10, 2015 Office Action issued in Japanese Patent Application No. 2011-156710.
May 15, 2015 Office Action issued in Japanese Patent Application No. 2010-167298.
May 19, 2015 Office Action issued in Japanese Patent Application No. 2011-075968.

(56) References Cited

OTHER PUBLICATIONS

Sep. 9, 2014 Office Action issued in Japanese Patent Application No. 2010-274585.
May 16, 2014 Office Action issued in Japanese Application No. 2011-075968.
May 20, 2014 Office Action issued in Japanese Patent Application No. 2010-167298.
May 24, 2011 International Search Report issued in International Application No. PCT/JP2011/058042.
Nov. 13, 2012 International Preliminary Report on Patentability issued in International Application No. PCT/JP2011/058042.
Jun. 30, 2015 Office Action issued in Japanese Patent Application No. 2011-156710.
Jul. 27, 2015 Office Action issued in Chinese Patent Application No. 201180014468.0.
Aug. 26, 2015 Office Action issued in Taiwanese Patent Application No. 100111028.
Oct. 23, 2015 Office Action issued in U.S. Appl. No. 14/802,347.
Oct. 16, 2015 Report of Preliminary Reconsideration issued in Japanese Patent Application No. 2010-167298.
Oct. 27, 2015 Report of Preliminary Reconsideration issued in Japanese Patent Application No. 2011-075968.
Apr. 23, 2015 Office Action issued in U.S. Appl. No. 13/578,563.
Nov. 21, 2014 Office Action issued in U.S. Appl. No. 13/578,563.
Aug. 11, 2014 Office Action issued in U.S. Appl. No. 13/578,563.
Dec. 23, 2013 Office Action issued in U.S. Appl. No. 13/578,563.
Oct. 21, 2015 Notice of Allowance issued in U.S. Appl. No. 13/578,563.
Mar. 25, 2016 Trial Decision issued in Japanese Application No. 2011-75968.
Jan. 25, 2017 Office Action Issued in U.S. Appl. No. 14/802,347.
Jan. 4, 2017 Office Action issued in Korean Patent Application No. 10-2012-7025663.
Jan. 30, 2018 Office Action issued in Chinese Patent Application No. 201610709193.7.

\* cited by examiner

| REFLECTION PLATING LAYER | GLOSSINESS (INITIAL) | INITIAL STATE | AFTER 2 HOURS | AFTER 5 HOURS | AFTER 10 HOURS |
|---|---|---|---|---|---|
| EXAMPLE 2-1 | Ag-Sn (Sn20%) | 0.32 | SUBSTRATE | SUBSTRATE | SUBSTRATE | SUBSTRATE |
| EXAMPLE 2-2 | Ag-Sn (Sn35%) | 1.25 ~ 0.47 | SUBSTRATE | SUBSTRATE | SUBSTRATE | SUBSTRATE |
| COMPARATIVE EXAMPLE 2-1 | Ag | 1.28 | SUBSTRATE | SUBSTRATE | SUBSTRATE | SUBSTRATE |

FIG. 29

| | PLATING LAYER | GLOSSINESS (INITIAL) | INITIAL STATE | AFTER 2 HOURS | AFTER 5 HOURS | AFTER 10 HOURS |
|---|---|---|---|---|---|---|
| EXAMPLE 3-1 | Ag/In | 1.33 | SUBSTRATE | SUBSTRATE | SUBSTRATE | SUBSTRATE |
| COMPARATIVE EXAMPLE 3-1 | Ag | 1.28 | SUBSTRATE | SUBSTRATE | SUBSTRATE | SUBSTRATE |

FIG. 44

LED LEADFRAME OR LED SUBSTRATE, SEMICONDUCTOR DEVICE, AND METHOD FOR MANUFACTURING LED LEADFRAME OR LED SUBSTRATE

This is a Continuation of application Ser. No. 13/578,563 filed Aug. 10, 2012, which in turn is a U.S. National Stage of International Application Number PCT/JP2011/058042 filed Mar. 30, 2011, and which claims the benefit of Japanese Application No. 2010-167298 filed Jul. 26, 2010, Japanese Application No. 2010-162086 filed Jul. 16, 2010, and Japanese Application No. 2010-78854 filed Mar. 30, 2010. The disclosures of all of the prior applications are hereby incorporated by reference herein in their entirety.

TECHNICAL FIELD

The present invention relates to an LED leadframe or LED substrate for mounting an LED element, and a method for manufacturing the same. The invention also relates to a semiconductor device having the LED leadframe or LED substrate, and a method for manufacturing the same.

BACKGROUND ART

Conventionally, illumination apparatuses using LED (light emitting diode) elements as a light source are utilized for various home appliances, office automation equipment, vehicle display lamps, general illumination, vehicle-mounted illumination, and displays. Some illumination apparatuses include a semiconductor device having an LED substrate and an LED element.

Examples of the LED element include those that emit light in a visible region typically represented by red, green, and blue and an ultraviolet region. Since a wavelength distribution of the light emitted from these light emitting elements is basically narrow, it can be said that the light can be seen as a single color in appearance. Examples of white LED put to practical use include those synthesizing white color by using an LED element emitting light at a high energy such as an ultraviolet or a blue color and a fluorescent material converting a portion of the light into light of a longer wavelength, or those synthesizing a white color by using elements of plurality of colors.

As the semiconductor device described above, Patent literature 1 describes, for example, those in which a concave portion is formed on one surface of a Cu substrate, an LED element is mounted on the concave portion, Cu interconnect layer for connection is formed over an insulating layer disposed on the side of the concave portion, a terminal portion of the LED and the Cu interconnect layer are connected each other by a wire bonding, and the terminal portion and the Cu interconnected layer are resin-encapsulated. Further, in the Patent literature 1, Ag plating is applied to the surface of the Cu interconnect layer.

PRIOR ART LITERATURE

Patent Literature

Patent literature 1: JP-A-2006-245032

DISCLOSURE OF THE INVENTION

If an LED having high luminance is used among others, a resin encapsulating a semiconductor device for an LED is exposed to intense light. Therefore, weather proofness has been required to the resin in recent years. There is also an increased demand for the use of a silicone resin as such a resin. However, since the gas barrier property tends to be poor if the silicone resin is used, a corrosive gas such as oxygen or hydrogen sulfide gas in atmospheric air penetrates as far as the Ag layer inside the semiconductor device. Since Ag is easily reacted with the hydrogen sulfide gas or the like to form a product such as silver sulfide, this results in a problem that an Ag layer is discolored in the appearance and the reflectance of the Ag layer is remarkably deteriorated for the entire visible region.

The present invention has been made in view of the above, and it is an object of the present invention to provide an LED leadframe or LED substrate that efficiently reflects light from an LED element and can suppress corrosion due to the presence of a gas thereby maintaining the reflection characteristics of light from the LED element, and a method for manufacturing the same, as well as a semiconductor device and a method for manufacturing the same.

The present invention provides an LED leadframe or LED substrate for mounting an LED element, including: a main body portion having a mounting surface for mounting the LED element thereover; and a reflection metal layer disposed on the mounting surface of the main body portion, the reflection metal layer serving as a reflection layer for reflecting light from the LED element. The reflection metal layer comprises an alloy of gold and silver.

The present invention provides the LED leadframe or LED substrate in which the reflection metal layer has a composition containing 5 to 50% by weight of gold and the balance being silver and an inevitable impurity.

The present invention provides a semiconductor device including: an LED leadframe or LED substrate including a main body portion, the main body portion having a mounting surface for mounting an LED element thereover; an LED element mounted over the mounting surface of the main body portion of the leadframe or substrate; an electroconductive portion for electrically connecting the leadframe or substrate and the LED element; and an encapsulating resin portion for encapsulating the LED element and the electroconductive portion. A reflection metal layer is disposed over the mounting surface of the main body portion of the LED leadframe or LED substrate, the reflection metal layer serving as a reflection layer for reflecting light from the LED element. The reflection metal layer comprises an alloy of gold and silver.

The present invention provides the semiconductor device in which the reflection metal layer has a composition containing 5 to 50% by weight of gold and the balance being silver and an inevitable impurity.

The present invention provides the semiconductor device in which the encapsulating resin portion comprises a silicone resin.

The present invention provides the semiconductor device further including an outer resin portion surrounding the LED element and having a concave portion. The encapsulating resin portion is filled in a concave portion of the outer resin portion.

The present invention provides a method for manufacturing an LED leadframe or LED substrate for mounting an LED element, including: a step of preparing a main body portion having a mounting surface for mounting the LED element thereover; and a step of forming a reflection metal layer serving as a reflection layer over the side of the mounting surface of the main body portion. The reflection metal layer comprises an alloy of gold and silver.

The present invention provides a method for manufacturing a semiconductor device, including a step of fabricating a leadframe or substrate by the method for manufacturing the LED leadframe or LED substrate; a step of mounting the LED element over the mounting surface of the main body portion of the leadframe or substrate; a step of connecting the LED element and the leadframe or substrate by an electroconductive portion; and a step of resin-encapsulating the LED element and the electroconductive portion by an encapsulating resin.

The present invention provides an LED leadframe or LED substrate for mounting an LED element, including: a main body portion having a mounting surface for mounting the LED element thereover; and a reflection metal layer disposed on the mounting surface of the main body portion, the reflection metal layer serving as a reflection layer for reflecting light from the LED element. The reflection metal layer comprises an alloy of gold and silver. The main body portion comprises copper or a copper alloy. An intermediate layer is disposed between the reflection metal layer and the main body portion. The intermediate layer has a nickel layer and a gold layer disposed successively from the side of the main body portion.

The present invention provides the LED leadframe or LED substrate in which the reflection metal layer has a composition containing 5 to 50% by weight of gold and the balance being silver and an inevitable impurity.

The present invention provides the LED leadframe or LED substrate in which the intermediate layer further has a copper layer disposed on the nickel layer on the side of the main body portion.

The present invention provides a semiconductor device including: an LED leadframe or LED substrate including a main body portion, the main body portion having a mounting surface for mounting an LED element thereover; an LED element mounted over a mounting surface of the main body portion of the leadframe or substrate; an electroconductive portion for electrically connecting the leadframe or substrate and the LED element; and an encapsulating resin portion for encapsulating the LED element and the electroconductive portion. A reflection metal layer is disposed over the mounting surface of the main body portion of the LED leadframe or LED substrate, the reflection metal layer serving as a reflection layer for reflecting light from the LED element. The reflection metal layer comprises an alloy of gold and silver. The main body portion comprises copper and copper alloy. An intermediate layer is provided between the reflection metal layer and the main body portion. The intermediate layer has a nickel layer and a gold layer disposed successively from the side of the main body portion.

The present invention provides the semiconductor device in which the reflection metal layer has a composition containing 5 to 50% by weight of gold and the balance being silver and an inevitable impurity.

The present invention provides the semiconductor device in which the intermediate layer further has a copper layer disposed on the nickel layer on the side of the main body portion.

The present invention provides the semiconductor device in which the encapsulating resin portion comprises a silicone resin.

The present invention provides the semiconductor device further including an outer resin portion surrounding the LED element and having a concave portion. The encapsulating resin portion is filled in the concave portion of the outer resin portion.

The present invention provides a method for manufacturing the LED leadframe or LED substrate for mounting an LED element, including: a step of preparing a main body portion having a mounting surface for mounting the LED element thereover; a step of forming an intermediate layer to the main body portion; a step of forming a reflection metal layer serving as a reflection layer on the intermediate layer. The reflection metal layer comprises an alloy of gold and silver. The main body portion comprises copper or a copper alloy. The intermediate layer has a nickel layer and a gold layer disposed successively from the side of the main body portion.

The present invention provides a method for manufacturing a semiconductor device, including: a step of preparing a main body portion having a mounting surface for mounting an LED element thereover; a step of forming an intermediate layer on the main body portion; a step of forming a reflection metal layer serving as a reflection layer on the intermediate layer; a step of mounting an LED element over the mounting surface of the main body portion, and connecting the LED element and the main body portion by an electroconductive portion; and a step of encapsulating the LED element and the electroconductive portion by a light permeable encapsulating resin portion. The reflection metal layer comprises an alloy of gold and silver. The main body portion comprises copper or a copper alloy. The intermediate layer has a nickel layer and a gold layer disposed successively from the side of the main body portion.

The present invention provides an LED leadframe or LED substrate for mounting an LED element, including: a main body portion having a die pad for mounting the LED element, and a lead portion disposed in spaced relation to the die pad; a silver plating layer disposed on both of the die pad and the lead portion provided on the main body portion; and an indium plating layer disposed on the silver plating layer, the indium plating layer serving as a reflection layer for reflecting light from the LED element.

The present invention provides the LED leadframe or LED substrate in which an underlying plating layer for enhancing the bondability between the main body portion and the silver plating layer is disposed between the body portion and the silver plating layer.

The present invention provides a semiconductor device including: an LED leadframe or LED substrate including a main body portion having a die pad for mounting the LED element, and a lead portion disposed in spaced relation to the die pad; the LED element mounted over the die pad of the main body portion of the leadframe or substrate; an electroconductive portion electrically connecting the leadframe or substrate and the LED element; and an encapsulating resin portion for encapsulating the LED element and the electroconductive portion. A silver plating layer is disposed on both of the die pad and the lead portion provided on the main body portion of the LED leadframe or LED substrate. An indium plating layer serving as a reflection layer for reflecting light from the LED element is disposed on the silver plating layer.

The present invention provides the semiconductor device in which an underlying plating layer for enhancing the bondability between the main body portion and the silver plating layer is disposed between the main body portion and the silver plating layer.

The present invention provides the semiconductor device in which the encapsulating resin portion comprises a silicone resin.

The present invention provides the semiconductor device further including an outer resin portion surrounding the LED element and having a concave portion. The encapsulating resin portion is filled in the concave portion of the outer resin portion.

The present invention provides a method for manufacturing an LED leadframe or LED substrate for mounting an LED element, including: a step of preparing a main body portion having a die pad for mounting the LED element and a lead portion disposed in spaced relation to the die pad; a step of forming a silver plating layer on both of the die pad and the lead portion provided on the main body portion; and a step of forming an indium plating layer serving as a reflection layer on the silver plating layer.

The present invention provides the method for manufacturing the LED leadframe or LED substrate, further including a step of providing an underlying plating layer for enhancing the bondability between the main body portion and the silver plating layer over the main body portion before the step of forming the silver plating layer.

The present invention provides a method for manufacturing a semiconductor device, including: a step of fabricating a leadframe or substrate by the method for manufacturing the LED leadframe or LED substrate according to claim 25; a step of mounting the LED element over the die pad of the main body portion of the leadframe or substrate; a step of connecting the LED element and the leadframe or substrate by an electroconductive portion; and a step of resin-encapsulating the LED element and the electroconductive portion by an encapsulating resin.

The present invention provides an LED leadframe or LED substrate for mounting an LED element, including: a main body portion having a mounting surface for mounting the LED element thereover; and a reflection plating layer disposed over the mounting surface of the main body portion, the reflection plating layer serving as a reflection layer for reflecting light from the LED element. The reflection plating layer comprises an alloy of tin and silver.

The present invention provides the LED leadframe or LED substrate in which the reflection plating layer contains 10 to 50 wt % of tin and the balance being silver and an inevitable impurity.

The present invention provides a semiconductor device including: an LED leadframe or LED substrate including a main body portion, the main body portion having a mounting surface for mounting an LED element thereover; an LED element mounted over the mounting surface of the main body portion of the leadframe or substrate; an electroconductive portion for electrically connecting the leadframe or substrate and the LED element; and an encapsulating resin portion for encapsulating the LED element and the electroconductive portion. A reflection plating layer serving as a reflection layer for reflecting light from the LED element is disposed on the mounting surface of the main body portion of the LED leadframe or LED substrate. The reflection plating layer comprises an alloy of tin and silver.

The present invention provides the semiconductor device in which the reflection plating layer contains 10 to 50 wt % of tin and the balance being silver and an inevitable impurity.

The present invention provides the semiconductor device in which the encapsulating resin portion comprises a silicone resin.

The present invention provides the semiconductor device further including an outer resin portion surrounding the LED element and having a concave portion. The encapsulating resin portion is filled in the concave portion of the outer resin portion.

The present invention provides a method for manufacturing an LED leadframe or LED substrate for mounting the LED element, including: a step of preparing a main body portion having a mounting surface for mounting the LED element thereover; and a step of forming a reflection plating layer serving as a reflection layer to the mounting surface of the main body portion. The reflection plating layer comprises an alloy of tin and silver.

The present invention provides the LED leadframe or LED substrate in which the reflection plating layer contains 10 to 50 wt % of tin and the balance being silver and an inevitable impurity.

The present invention provides a method for manufacturing a semiconductor device, including: a step of fabricating a leadframe or substrate by the method for manufacturing the LED leadframe or LED substrate; a step of mounting an LED element over the mounting surface of the main body portion of the leadframe or substrate; a step of connecting the LED element and the leadframe or substrate by an electroconductive portion; and a step of resin-encapsulating the LED element and the electroconductive portion by an encapsulating resin.

According to the present invention, light from the LED element can be reflected efficiently at the reflection metal layer (reflection plating layer), as well as the reflection metal layer (reflection plating layer) does not suffer from corrosion by a corrosive gas such as oxygen and hydrogen sulfide gas in an air, and the reflection characteristics thereof in the entire visible light region or entire ultraviolet-visible light region, or at least a portion of the visible light region can be maintained high.

BRIEF DESCRIPTION OF DRAWINGS

FIG. 29 is a diagram showing the change in each of substrates when a corrosion resistant test is carried out in the second embodiment of the present invention;

FIG. 44 is view showing the change in each of substrates when a corrosion resistant test is carried out in the third embodiment of the present invention;

DESCRIPTION OF EMBODIMENTS

First Embodiment

Figure 1:
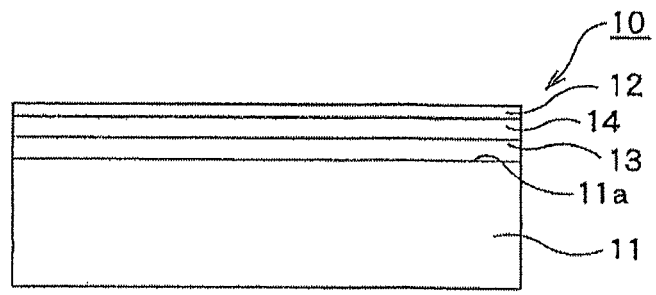
FIG. 1 is a cross sectional view showing a leadframe or substrate according to a first embodiment of the present invention.
Figure 2:
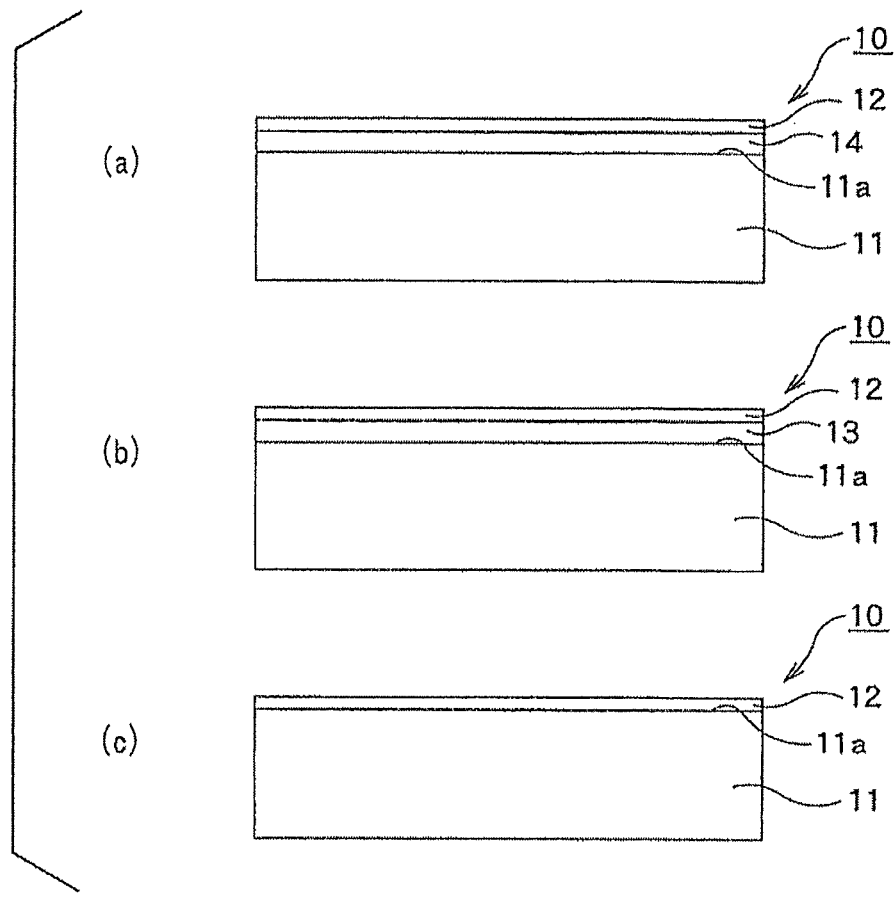
FIG. 2 is a cross sectional view showing a modified example of a leadframe or substrate according to a first embodiment of the present invention.

A first embodiment of the present invention is to be described with reference to FIG. 1 to FIG. 13.
Configuration of LED Leadframe or LED Substrate First, the outline of an LED leadframe or LED substrate is to be described with reference to FIG. 1 and FIG. 2. In FIG. 1 and FIG. 2, for the explanation of the layer configuration of the LED leadframe or LED substrate, a cross section of the LED leadframe or LED substrate is shown as a rectangular shape for the sake of convenience.

As shown in FIG. 1, an LED leadframe or LED substrate 10 according to this embodiment (hereinafter referred to also as a leadframe 10 or substrate 10) is used for mounting an LED element 21 (to be described later). The LED leadframe or LED substrate 10 includes a main body portion 11 having a mounting surface 11a for mounting the LED element 21, and a reflection plating layer 12 disposed over the mounting surface 11a of the main body portion 11.

The main body portion 11 comprises a metal plate. Examples of the material for the metal plate forming the main body portion 11 include copper, copper alloy, 42 alloy (Ni 41% Fe alloy), etc. The thickness of the main body portion 11 is preferably 0.05 mm to 0.5 mm in a case of the leadframe 10 and 0.005 mm to 0.03 mm in a case of the substrate 10 although depending on the configuration of the semiconductor device.

The reflection metal layer 12 serves as a reflection layer for reflecting light from the LED element 21 and is situated at the uppermost surface of the LED leadframe or LED substrate 10. The reflection metal layer 12 comprises an alloy of platinum (Pt) and silver (Ag) or an alloy of gold (Au) and silver (Ag) and has a high reflectance to visible light and has a high corrosion resistance to oxygen and a hydrogen sulfide gas.

When the reflection metal layer 12 comprises the alloy of platinum (Pt) and silver (Ag), the alloy preferably has a composition containing 10 to 40% by weight of platinum and the balance being silver and an inevitable impurity and, more preferably, has a composition particularly containing 20% by weight of platinum and the balance being silver and an inevitable impurity.

On the other hand, when the reflection metal layer 12 comprises the alloy of gold (Au) and silver (Ag), the alloy preferably has a composition containing 5 to 50% by weight of gold and the balance being silver and an inevitable impurity and, more preferably, has a composition particularly containing 20% by weight of gold and the balance being silver and an inevitable impurity.

The thickness of the reflection metal layer 12 is extremely thin and, specifically, it is preferably from 0.005 μm to 0.2 μm.

Further, a copper plating layer 13 and a silver plating layer 14 are stacked successively between the main body portion 11 and the reflection metal layer 12 from the side of the main body portion 11.

The copper plating layer 13 is used as an underlying layer for the silver plating layer 14 and has a function of enhancing the bondability between the silver plating layer 14 and the main body portion 11. The thickness of the copper plating layer 13 is preferably from 0.005 μm to 0.1 μm.

Further, the silver plating layer 14 is used as an underlying layer for the reflection metal layer 12 and has a function of enhancing the bondability between the copper plating layer 13 and the reflection metal layer 12. The thickness of the silver plating layer 14 is preferably larger than that of the reflection metal layer 12 and, for example, 1 μm to 5 μm.

The silver plating layer 14 may comprise either matte silver plating or bright silver plating. As described above, since the reflection metal layer 12 is extremely thin, it can reveal the profile of the silver plating layer 14. For example, when the silver plating layer 14 comprises a matte plating, the surface of the reflection metal layer 12 can also be matt and, when the silver plating layer 14 comprises bright plating, the surface of the reflection metal layer 12 can also be bright.

As shown in FIG. 2(a), it is also possible that the copper plating layer 13 is not provided. In this case, the LED leadframe or LED substrate 10 has the main body portion 11, the silver plating layer 14 disposed on the mounting surface 11a of the main body portion 11 and the reflection metal layer 12 disposed on the silver plating layer 14.

Further, as shown in FIG. 2(b), it is also possible that the silver plating layer 14 is not disposed. In this case, the LED leadframe or LED substrate 10 has a main body portion 11, a copper plating layer 13 disposed on the mounting surface 11a of a main body portion 11, and a reflection metal layer 12 disposed on the copper metal layer 13.

Figure 3:
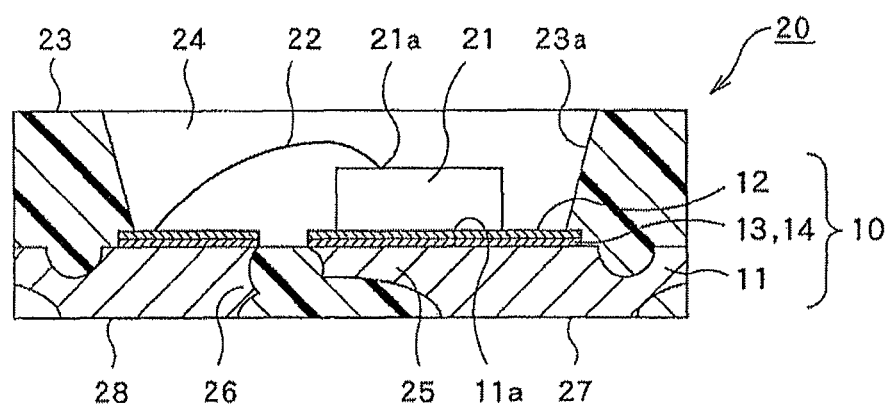
FIG. 3 is a cross sectional view showing a semiconductor device according to the first embodiment of the present invention.

Further, as shown in FIG. 2(c), it is also possible that the copper plating layer 13 and the silver plating layer 14 are not disposed. In this case, the LED leadframe or LED substrate 10 has a main body portion 11, and a reflection metal layer 12 disposed directly on the mounting surface 11a of the main body portion 11.
Configuration of Semiconductor Device Next, the first embodiment of the semiconductor device using the LED leadframe or LED substrate shown in FIG. 1 is to be described with reference to FIG. 3. FIG. 3 is a cross sectional view showing a semiconductor device (SON type) according to the first embodiment of the present invention.

As shown in FIG. 3, a semiconductor device 20 has an LED leadframe 10, an LED element 21 mounted over the mounting surface 11a of a main body portion 11 of the leadframe 10, and a bonding wire (electroconductive portion) 22 electrically connecting the leadframe 10 and the LED element 21.

Further, an outer resin portion 23 having a concave portion 23a is disposed so as to surround the LED element 21. The outer resin portion 23 is integrated with the leadframe 10. Further, the LED element 21 and the bonding wire 22 are encapsulated by a light permeable encapsulating resin portion 24. The encapsulating resin portion 24 is filled in the concave portion 23a of the outer resin portion 23.

Each of the components to form the semiconductor device 20 is to be described below.

The leadframe 10 has the main body portion 11 having the mounting surface 11a, the copper plating layer 13 disposed on the main body portion 11, the silver plating layer 14 disposed on the copper plating layer 13, and the reflection metal layer 12 disposed on the silver plating layer 14 and serving as a reflection layer for reflecting light from the LED element 21. Trenches 19 for enhancing the close bondability between the leadframe 10 and the outer resin portion 23 are formed on the surface (upper surface) of the leadframe 10. Since the layer configuration of the leadframe 10 is identical with that described already with reference to FIG. 1, detailed description therefor is to be omitted. As the layer configuration of the leadframe 10, those shown in FIG. 2(a) to FIG. 2(c) may also be used.

In this embodiment, the main body portion 11 of the leadframe 10 has a first portion 25 (die pad) on the side of the LED element 21 and a second portion 26 (lead portion) spaced from the first portion 25. The outer resin portion 23 is filled between the first portion 25 and the second portion 26. Therefore, the first portion 25 and the second portion 26 are insulated electrically from each other. Further, a first outer lead portion 27 is formed at the bottom of the first portion 25, and a second outer lead portion 28 is formed at the bottom of the second portion 26. The first outer lead portion 27 and the second outer lead portion 28 are exposed to the outside from the outer resin portion 23 respectively.

In the LED element 21, light emission wavelengths that range from ultraviolet light to infrared light can be selected by properly selecting materials comprising single crystal of a compound semiconductor, for example, GaP, GaAs, GaAlAs, GaAsP, AlInGaP, or InGaN for the light emitting layer. As the LED element 21, those used generally so far can be used.

Further, the LED element 21 is fixed over the mounting surface 11a of the main body portion 11 (strictly, on the reflection metal layer 12) in the concave portion 23a of the outer resin portion 23 by a solder or a die bonding paste. When the die bonding paste is used, a die bonding paste comprising a light resistant epoxy resin or a silicone resin can be selected.

The bonding wire 22 comprises a material of good electroconductivity, for example, gold which is connected at one end to a terminal portion 21a of the LED element 21 and at the other end to the surface of the second portion 26 of the main body portion 11 of the leadframe 10.

The outer resin portion 23 is formed on the leadframe 10, for example, by injection molding or transfer molding of a thermoplastic resin or a thermosetting resin. The shape of the outer resin portion 23 can be varied depending on the design of a die used for the injection molding or transfer molding. For example, the entire shape of the outer resin portion 23 can be in a rectangular parallelepiped, cylindrical, conical, or like other shape. The bottom of the concaved portion 23a can be in a circular, elliptic, or polygonal shape. The cross sectional shape of the side wall of the concave portion 23a may be formed of a straight line as shown in FIG. 3 or may be formed of a curved line.

The thermoplastic resins or the thermosetting resin used for the outer resin portion 23 is preferably selected particularly from those excellent in heat resistance, weather resistance, and mechanical strength. For thermoplastic resin, polyamide, polyphthalamide, polyphenylene sulfide, liquid crystal polymer, polyether sulfone, polybutylene terephthalate, polyether imide, etc. can be used. For thermosetting resin, silicone resin, epoxy resin, polyurethane, etc. can be used. Further, when one of titanium dioxide, zirconium dioxide, potassium titanate, aluminum nitride, and boron nitride is added as a light reflecting agent in the resin, the reflectance of light from the LED element 21 can be increased at the bottom (between the first portion 25 and the second portion 26) and the lateral side of the concave portion 23a to increase the entire light take-out efficiency of the semiconductor device 20.

As the encapsulating resin portion 24, materials having a high light transmittance and a high refractive index at the light emission wavelength of the semiconductor device 20 are preferably selected for improving the light take-out efficiency. Accordingly, an epoxy resin or silicone resin can be selected as the resin satisfying characteristics of high heat resistance, weather resistance, and mechanical strength. In particular, when a high luminance LED is used as the LED element 21, since the sealing resin portion 24 is exposed to an intense light, the encapsulating resin portion 24 preferably comprises a silicone resin having high weather resistance.

Method for Manufacturing LED Leadframe

Then, a method for manufacturing the LED leadframe 10 used in the semiconductor device 20 shown in FIG. 3 is to be described with reference to FIG. 4(a) to FIG. 4(g).

First, as shown in FIG. 4(a), a main body portion 11 comprising a metal substrate is prepared. For the main body portion 11, a metal substrate comprising copper, copper alloy, 42 alloy (Ni41% Fe alloy) or the like can be used as described above. As the main body portion 11, those applied with a cleaning process such as degreasing to both surfaces thereof are used preferably.

Then, a light sensitive resist is coated on the surface and the rear face of the main body portion 11, then dried, and exposed by way of a desired photomask. Thereafter, it was developed to form resist layers 32, 33 for etching (FIG. 4(b)). For the light sensitive resist, those known so far can be used.

Then, etching is applied by an etching solution to the main body portion 11 using the resist layers 32, 33 for etching as an etching resistant film (FIG. 4(c)). The etching solution can be selected properly in accordance with the material of the main body portion 11 to be used. When copper is used for the main body portion 11 for example, etching can be performed usually by spray etching from both surfaces of the main body portion 11 using an aqueous solution of ferric chloride.

Then, the resist layers 32, 33 for etching are peeled and removed. As described above, the main body portion 11 having the first portion 25 and the second portion 26 spaced from the first portion 25 can be obtained (FIG. 4(d)). In this step, trenches 19 are formed in the surface (upper surface) of the main body portion 11 by half etching.

Then, resist layers 30, 31 for plating having a desired pattern are disposed on the surface and the rear face of the main body portion 11 (FIG. 4(e)). Among them, in the resist layer 30 for surface plating, an opening 30a is formed at a position corresponding to the portion of forming the reflection metal layer 12, and the mounting surface 11a of the main body portion 11 is exposed from the opening portion 30a. On the other hand, the resist layer 31 for rear face plating covers the entire rear face of the main body portion 11.

Then, electrolytic plating is applied to the main body portion 11 on the side of the surface covered with the resist layers 30, 31 for plating. Thus, metal (copper) is deposited on the main body portion 11 to form a copper plating layer 13 on the main body portion 11. In this step, a copper plating solution comprising copper cyanide and potassium cyanide as main ingredients can be used as the plating solution for electrolytic plating that forms the copper plating layer 13.

Successively, metal (silver) is deposited over the copper plating layer 13 by electrolytic plating to form a silver plating layer 14 in the same manner. In this step, as the plating solution for electrolytic plating forming the silver plating layer 14, a silver plating solution comprising silver cyanide and potassium cyanide as main ingredients can be used.

Figure 4:
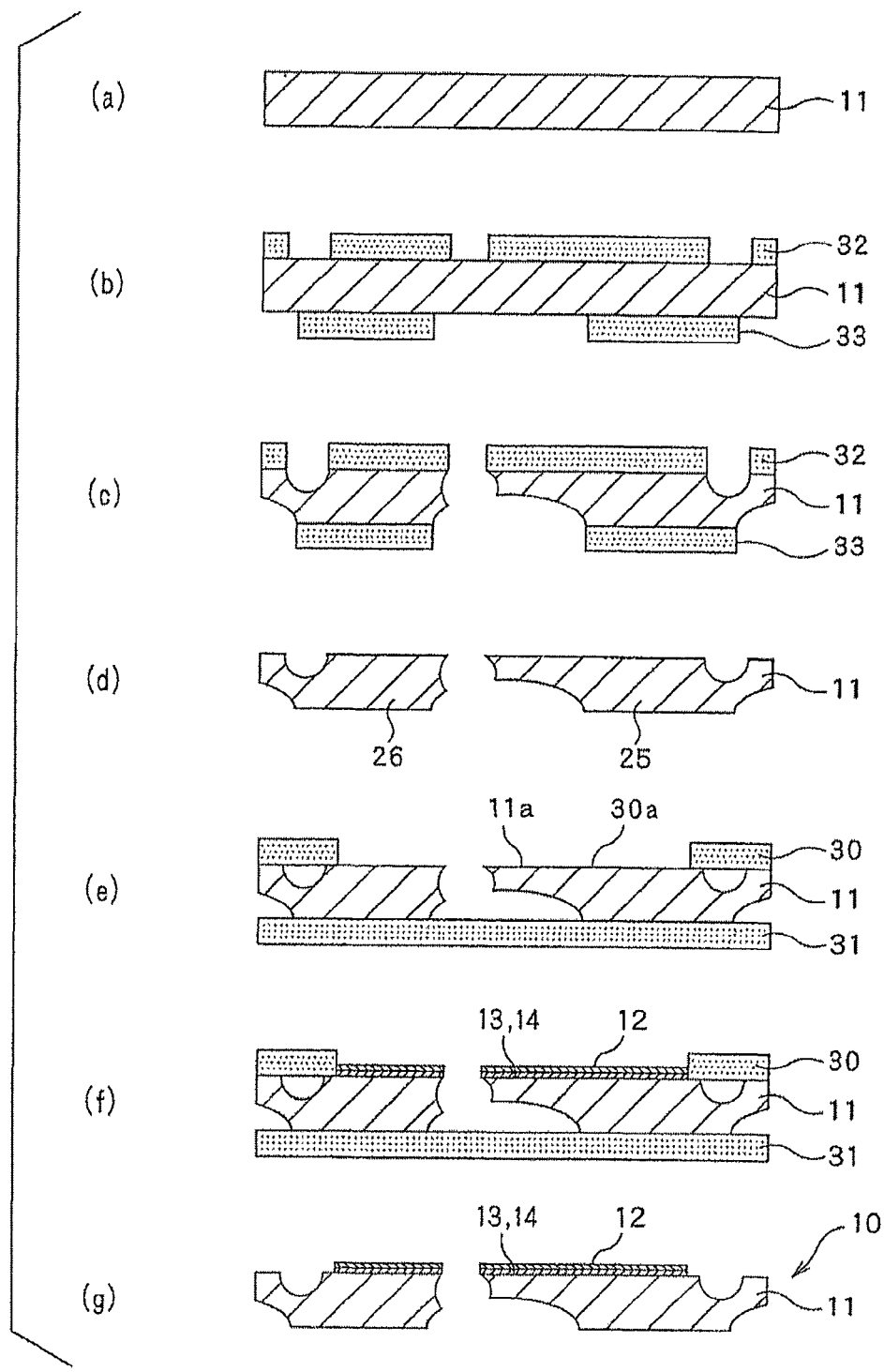
FIG. 4 is a diagram showing a method for manufacturing a leadframe according to the first embodiment of the present invention.

Further, a metal is deposited on the silver plating layer 14 to form a reflection metal layer 12 (FIG. 4(*f*)).

As described above, the reflection metal layer 12 comprises the alloy of platinum (Pt) and silver (Ag) or the alloy of gold (Au) and silver (Ag). When the reflection metal layer 12 comprises the alloy of platinum and silver, the reflection metal layer 12 can be formed by sputtering, ion plating, or vapor deposition of the alloy. On the other hand, when the reflection metal layer 12 comprises the alloy of gold and silver, the reflection metal layer 12 can be formed by electrolytic plating. In this case, as the solution for the electrolytic plating, a silver plating solution comprising silver cyanide, gold cyanide, and potassium cyanide as main ingredients can be used.

Then, by peeling the resist layers 30, 31 for plating, the leadframe 10 shown in FIG. 3 used for the semiconductor device 20 can be obtained (FIG. 4(*g*)).

In FIG. 4(*a*) to FIG. 4(*g*), the main body portion 11 is fabricated into a predetermined shape by applying etching (FIGS. 4(*a*) to (*d*)), and then the copper plating layer 13, the silver plating layer 14, and the reflection metal layer 12 are formed over the main body portion 11 (FIGS. 4(*e*) to (*g*)). However, this is not restrictive but the copper plating layer 13, the silver plating layer 14, and the reflection metal layer 12 may be formed first over the main body portion 11 and subsequently the main body portion 11 may be fabricated into the predetermined shape by etching.

Method for Manufacturing Semiconductor Device

Next, a method for manufacturing the semiconductor device 20 shown in FIG. 3 will be described with reference to FIGS. 5(*a*) to (*e*).

Figure 5:
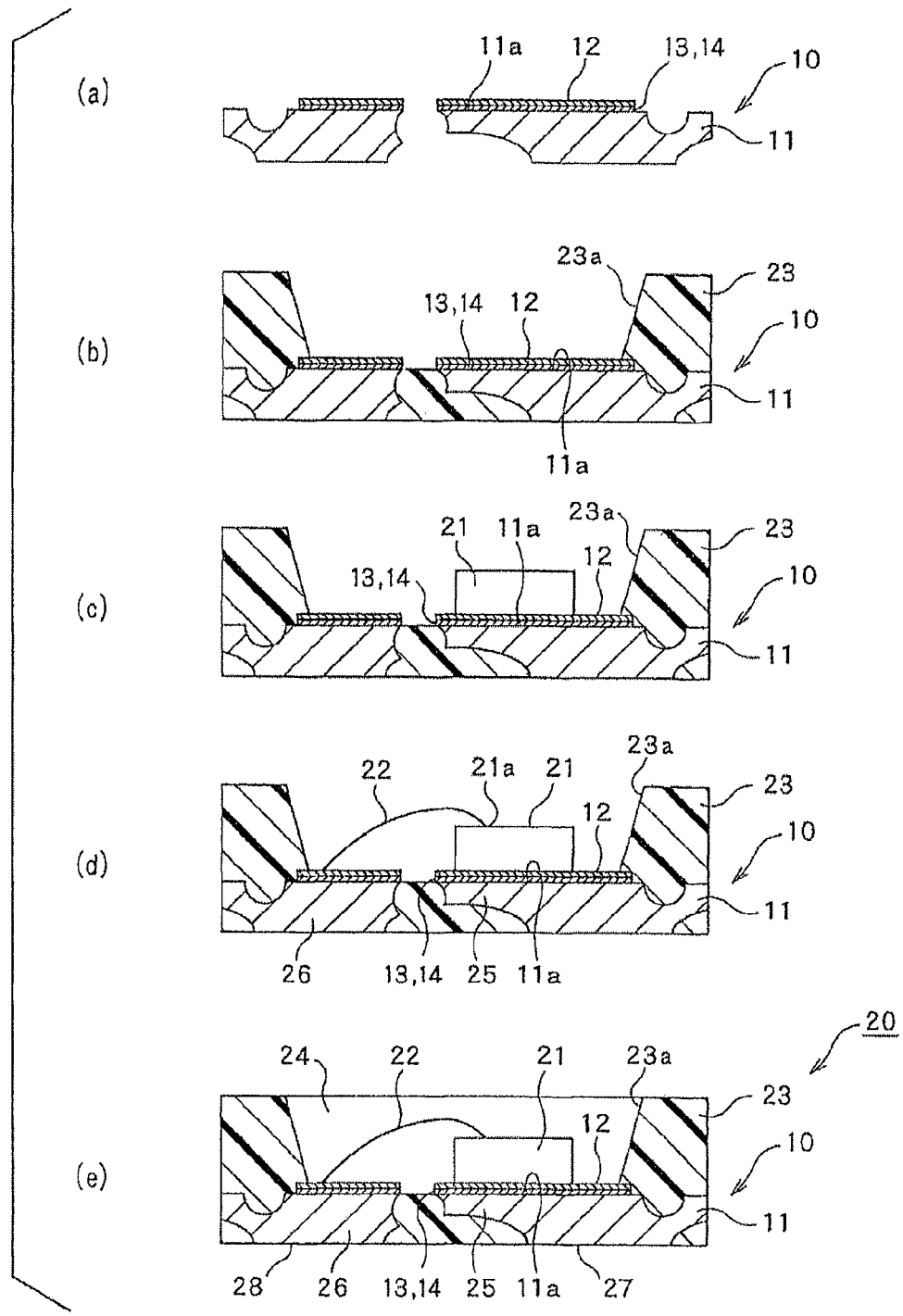
FIG. 5 is a diagram showing a method for manufacturing a semiconductor device according to the first embodiment of the present invention.

First, the leadframe 10 including the main body portion 11 having the mounting surface 11*a* and the reflection metal layer 12 serving as a reflection layer for reflecting light from an LED element 21 is prepared by the steps described above (FIGS. 4(*a*) to (*g*)) (FIG. 5(*a*)).

Then, an outer resin portion 23 is formed by injection molding or transfer molding of a thermoplastic resin or a thermosetting resin to the leadframe 10 (FIG. 5(*b*)). Thus, the outer resin portion 23 and the leadframe 10 are formed integrally. Further in this step, a concave portion 23*a* is formed in the outer resin portion 23 and the reflection metal layer 12 is exposed to the outside at the bottom of the concave portion 23*a* by properly designing a die used for the injection molding or transfer molding.

Then, the LED element 21 is mounted over the mounting surface 11*a* of the main body portion 11 of the leadframe 10. In this step, the LED element 21 is placed and fixed over the mounting surface 11*a* (on the reflection metal layer 12) of the main body portion 11 using a solder or a die bonding paste (die attaching step) (FIG. 5(*c*)).

Then, the terminal portion 21*a* of the LED element 21 and the surface of the second portion 26 of the main body portion 11 are electrically connected to each other by a bonding wire 22 (wire bonding step) (FIG. 5(*d*)).

Thereafter, the encapsulating resin portion 24 is filled in the concave portion 23*a* of the outer resin portion 23 and the LED element 21 and the bonding wire 22 are encapsulated by the encapsulating resin portion 24. Thus, the semiconductor device 20 shown in FIG. 3 can be obtained (FIG. 5(*e*)).

In this case, a plurality of LED elements 21 may be mounted previously over the leadframe 10 and the outer resin portion 23 between each of the LED elements 21 may be subjected to dicing respectively to prepare each of the semiconductor devices 20 (refer to a second embodiment, a third embodiment or a fourth embodiment to be described later).

Function and Effect of this Embodiment

Then, the function and the effect of this embodiment are to be described. In the semiconductor device 20 of this embodiment, the reflection metal layer 12 serving as a reflection layer is disposed over the mounting surface 11*a* of the main body portion 11 as described above. The reflection metal layer 12 comprises the alloy of platinum and silver or the alloy of gold and silver. This can provide the following function and effect.

That is, after lapse of a predetermined time from the manufacture of the semiconductor device 20, a corrosive gas such as oxygen or a hydrogen sulfide gas in the air penetrates into the semiconductor device 20, for example, at a portion between the outer resin portion 23 and the encapsulating resin portion 24. According to this embodiment, the reflection metal layer 12 that serves as the reflection layer is disposed over the mounting surface 11*a* of the main body portion 11 and the reflection metal layer 12 comprises the alloy of platinum and silver or the alloy of gold and silver. Thus, even when the corrosive gas penetrates into the semiconductor device 20, the reflection layer (reflection metal layer 12) is less discolored or corroded and the reflectance thereof is not lowered. On the other hand, when the reflection layer is comprised only of the silver plating layer as a comparative embodiment, the reflection layer may possibly undergo discoloration or corrosion when the corrosive gas penetrates into the semiconductor device 20.

Further, according to this embodiment, since the reflection layer comprises the reflection metal layer 12 and has high reflection characteristics, light from the LED element 21 can be reflected efficiently.

Further, according to this embodiment, the reflection metal layer 12 comprises an extremely thin film (0.005 μm to 0.2 μm) as described above. Accordingly, the reflection metal layer 12 is fractured partially by the energy applied during die attachment or wire bonding. Accordingly, a pull strength substantially identical with that when die attaching or wire bonding is directly performed on the silver plating can be obtained.

Further, according to this embodiment, since the thickness of the reflection metal layer 12 is extremely thin, the cost less increases even when relatively expensive platinum or gold is used. Further, since the reflection metal layer 12 comprises the alloy of platinum and silver or the alloy of gold and silver, the manufacturing cost can be suppressed compared with the use of only platinum or gold for the material as the reflection metal layer 12.

Modified Embodiment

Each of modified embodiments of the semiconductor device according to this embodiment is to be described with reference to FIG. 6 to FIG. 11. In FIG. 6 to FIG. 11, portions identical with those of the embodiment shown in FIG. 3 carry the same reference numerals and detailed description therefor is to be omitted.

In each of the modified embodiments in FIG. 6 to FIG. 11, the reflection metal layer 12 comprises an alloy of platinum and silver or an alloy of gold and silver in the same manner as the embodiment shown in FIG. 3.

Figure 6:
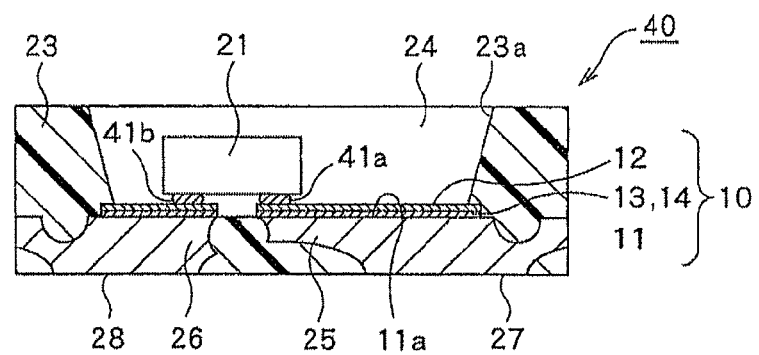
FIG. 6 is a cross sectional view showing a modified example of the semiconductor device according to the first embodiment of the present invention.

FIG. 6 is a cross sectional view showing a modified embodiment (SON type) of a semiconductor device according to this semiconductor device. The embodiment shown in FIG. 6 is different in that solder balls 41*a*, 41*b* are used as the electroconductive portion and other configurations are substantially identical with those of the embodiment shown in FIG. 3 described above.

In a semiconductor device 40 shown in FIG. 6, an LED element 21 is mounted over a mounting surface 11a of a main body portion 11 of a leadframe 10. In this case, a LED element 21 is mounted across a first portion 25 (die pad) and a second portion 26 (lead portion) of the main body portion 11.

Further, the LED element 21 is connected to a reflection metal layer 12 of the leadframe 10 by the solder balls (electroconductive portion) 41a, 41b instead of the bonding wire 22 (flip-chip system). As shown in FIG. 6, of the solder balls 41a, 41b, one solder ball 41a is connected to the first portion 25 and the other solder ball 41b is connected to the second portion 26.

Instead of the solder balls 41a, 41b, an electroconductive portion comprising gold bumps may also be used.

Figure 7:
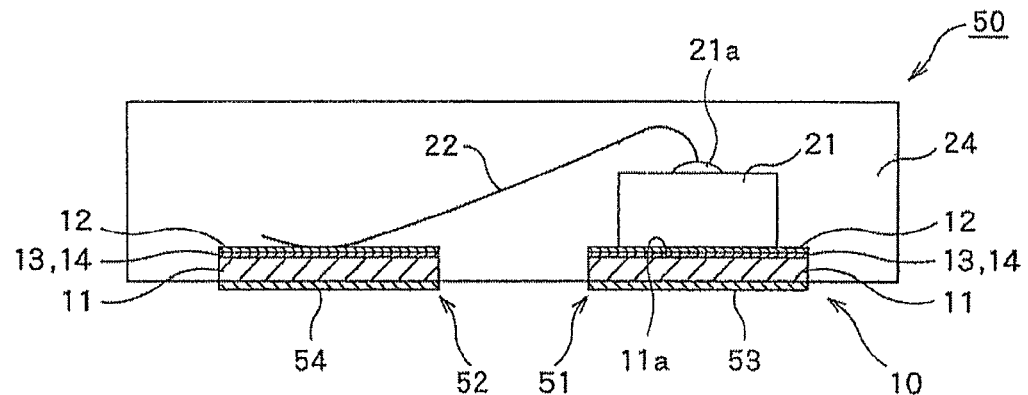
FIG. 7 is a cross sectional view showing a modified example of the semiconductor device according to the first embodiment of the present invention.

FIG. 7 is a cross sectional view showing a modified embodiment (LGA type) of a semiconductor device according to this embodiment. The embodiment shown in FIG. 7 is different from the embodiment shown in FIG. 3 in view of the configuration of the substrate 10, etc.

In a semiconductor device 50 shown in FIG. 7, a substrate 10 has a main body portion 11 having a mounting surface 11a for mounting an LED element 21, and a reflection metal layer 12 mounted on the mounting surface 11a of the main body portion 11 and serving as a reflection layer for reflecting light from the LED element 21.

Among them, the main body portion 11 has a first portion (die pad) 51 over which the LED element 21 is mounted, and a second portion (terminal portion) 52 spaced from the first portion 51. An encapsulating resin portion 24 is filled between the first portion 51 and the second portion 52, and the first portion 51 and the second portion 52 are electrically insulated from each other. Further, a first external terminal 53 is formed on the bottom of the first portion 51, and a second external terminal 54 is formed on the bottom of the second portion 52. The first external terminal 53 and the second external terminal 54 are exposed respectively outward from the encapsulating resin portion 24.

In FIG. 7, the main body portion 11 may comprise a single plating layer or a plurality of stacked plating layers.

In this state, the LED element 21 is mounted over the mounting surface 11a of the main body portion 11 in the first portion 51. Further, the second portion 52 of the semiconductor device 10 and the LED element 21 are electrically connected by a bonding wire (electroconductive portion) 22. That is, the bonding wire 22 is connected at one end to the terminal portion 21a of the LED element 21, and the bonding wire 22 is connected at the other end to the surface of the second portion 52.

On the other hand, the light permeable encapsulating resin portion 24 encapsulates the upper portion of the substrate 10, the LED element 21, and the bonding wire 22.

While the outer resin portion 23 is not disposed in FIG. 7, this is not restrictive, but the outer resin portion 23 may also be disposed so as to surround the LED element 21 in the same manner as in FIG. 3.

Figure 8:
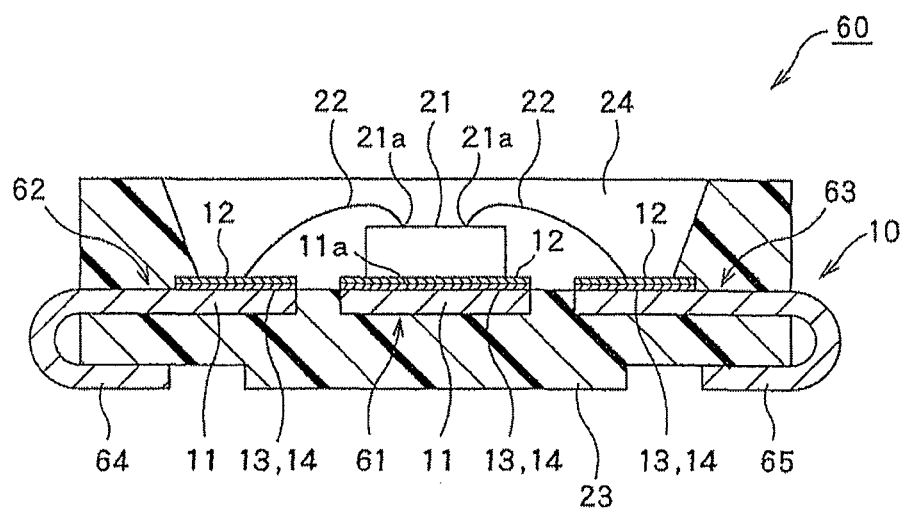
FIG. 8 is a cross sectional view showing a modified example of the semiconductor device according to the first embodiment of the present invention.

FIG. 8 is a cross sectional view showing a modified embodiment (PLCC type) of a semiconductor device according to this embodiment. The embodiment shown in FIG. 8 is different in view of the configuration of a leadframe 10 from the embodiment shown in FIG. 3.

In a semiconductor device 60 shown in FIG. 8, a leadframe 10 includes a main body portion 11 having a mounting surface 11a for mounting an LED element 21, and a reflection metal layer 12 disposed over the mounting surface 11a of the main body portion 11 for reflecting light from the LED element 21.

Among them, the main body portion 11 has a first portion (die pad) 61 over which the LED element 21 is mounted and a second portion (terminal portion) 62 and a third portion (terminal portion) 63 spaced from the first portion 61. An outer resin portion 23 is filled between the first portion 61 and the second portion 62 and between the first portion 61 and the third portion 63 respectively. Thus, the first portion 61 and the second portion 62 are electrically insulated from each other, and the first portion 61 and the third portion 63 are electrically insulated from each other.

Further, each of the second portion 62 and the third portion 63 is curved in a substantially J-shaped cross sectional shape. Further, a first outer lead portion 64 is formed on the end of the second portion 62 and a second outer lead portion 65 is formed on the end of the third portion 63. The first outer lead portion 64 and the second outer lead portion 65 are exposed respectively outward from the outer resin portion 23.

In this state, the LED element 21 is mounted over the mounting surface 11a of the main body portion 11 in the first portion 61. Further, the LED element 21 is electrically connected respectively to the second portion 62 and the third portion 63 of the main body portion 11 of the leadframe 10 by way of bonding wires (electroconductive portion) 22.

Figure 9:
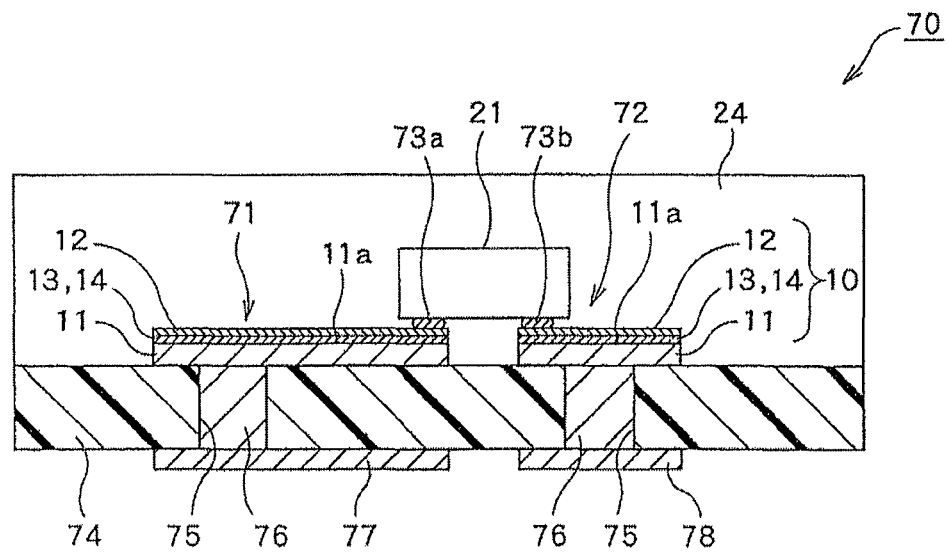
FIG. 9 is a cross sectional view showing a modified example of the semiconductor device according to the first embodiment of the present invention.

FIG. 9 is a cross sectional view showing a modified embodiment (substrate type) of the semiconductor device according to this embodiment. The embodiment shown in FIG. 9 is different from the embodiment shown in FIG. 3 for example in that a substrate 10 is disposed over a non-electroconductive substrate 74.

In a semiconductor device 70 shown in FIG. 9, a substrate 10 includes a main body portion 11 having a mounting surface 11a for mounting an LED element 21, and a reflection metal layer 12 disposed over the mounting surface 11a of the main body portion 11 and serving as a reflection layer for reflecting light from the LED element 21.

Among them, the main body portion 11 has a first portion 71 and a second portion 72 spaced from the first portion 71. An encapsulating resin portion 24 is filled between the first portion 71 and the second portion 72, and the first portion 71 and the second portion 72 are electrically insulated from each other. In this state, the LED element 21 is mounted overriding the first portion 71 and the second portion 72.

Further, the LED element 21 is connected to the reflection metal layer 12 of the leadframe 10 by solder balls (electroconductive portion) 73a, 73b instead of the bonding wire 22 (flip-chip system). As shown in FIG. 9, of the solder balls 73a, 73b, the solder ball 73a is connected to the first portion 71 and the solder ball 73b is connected to the second portion 72.

Instead of the solder balls 73a, 73b, an electroconductive portion comprising gold bumps may also be used.

In FIG. 9, the substrate 10 is disposed over a non-electroconductive substrate 74. The non-electroconductive substrate 74 may be an organic substrate or an inorganic substrate. Examples of the organic substrate include organic substrates each comprising, for example, polyether sulfone (PES), polyethylene naphthalate (PEN), polyamide, polybutylene terephthalate, polyethylene terephthalate, polyphenylene sulfide, polyether ether ketone, liquid crystal polymer, fluoro resin, polycarbonate, polynorbornene-based resin, polysulfone, polyallylate, polyamideimide, polyetherimide, or thermoplastic polyimide, etc., or composite substrates thereof. Further, examples of the inorganic substrate include glass substrate, silicon substrate, and ceramic substrate.

A plurality of through holes 75 are formed in the non-electroconductive substrate 74. An electroconductive material 76 is filled in each of the through holes 75. Then, the first portion 71 and the second portion 72 of the main body portion 11 are electrically connected to the first external terminal 77 and the second first external terminal 78 respectively by way of the electroconductive material 76 in the through holes 75. Examples of the electroconductive material 76 include electroconductive metals such as copper formed by plating in the through hole 75, or an electroconductive paste containing electroconductive particles such as copper particles and silver particles.

While the outer resin portion 23 is not provided in FIG. 9, this is not restrictive but the outer resin portion 23 may also be disposed so as to surround the LED element 21 in the same manner as in the embodiment shown in FIG. 3.

Figure 10:
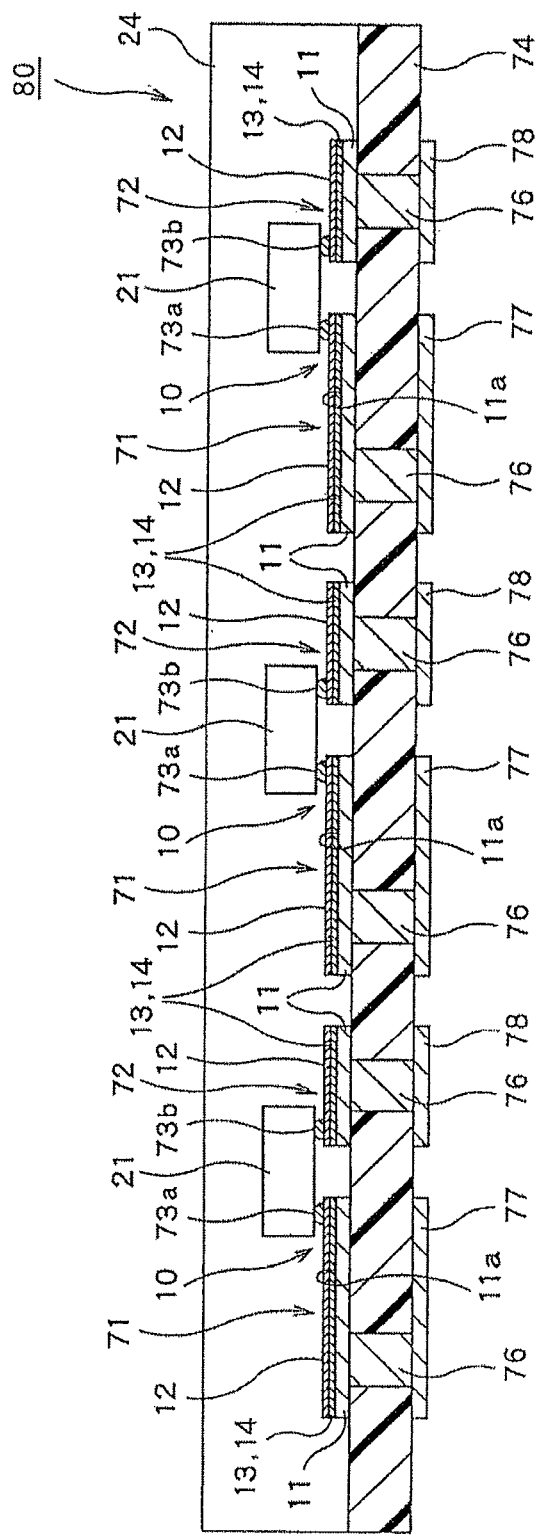
FIG. 10 is a cross sectional view showing a modified example of the semiconductor device according to the first embodiment of the present invention.

FIG. 10 is a cross sectional view showing a modified embodiment of the semiconductor device according to this embodiment (module type). The embodiment shown in FIG. 10 is different in that a plurality of substrates 10 are disposed over one non-electroconductive substrate 74. Other configurations are substantially identical with the embodiment shown in FIG. 9 described above.

In the semiconductor device 80 shown in FIG. 10, a plurality of substrates 10 are disposed over one non-electroconductive substrate 74. Each of the substrates 10 includes a main body portion 11 having a mounting surface 11a for mounting an LED element 21, and a reflection metal layer 12 disposed over a mounting surface 11a of the main body portion 11 and serving as a reflection layer for reflecting light from the LED element 21.

In addition, portions shown in FIG. 10 identical with those of the embodiment shown in FIG. 9 carry the same reference numerals and detailed description therefor is to be omitted.

Figure 11:
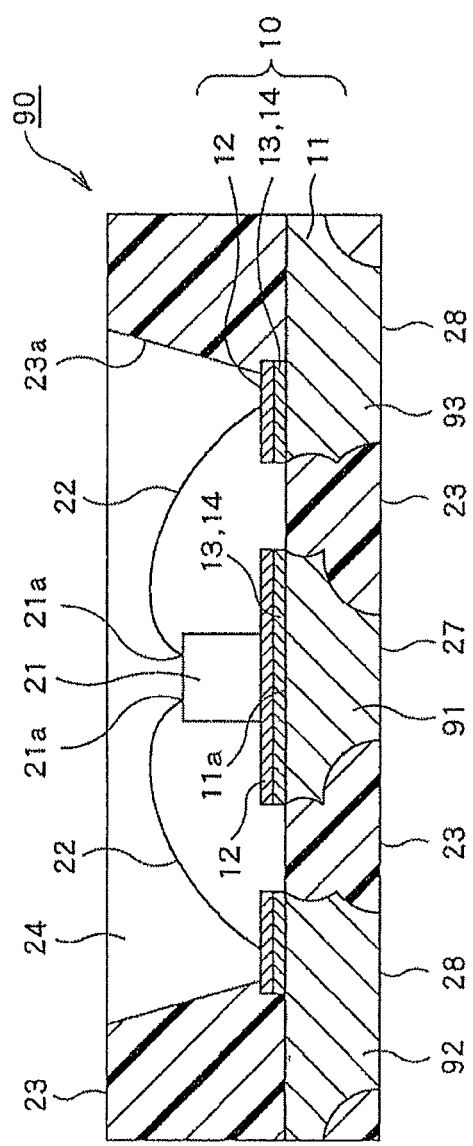
FIG. 11 is a cross sectional view showing a modified example of the semiconductor device according to the first embodiment of the present invention.

FIG. 11 is a cross sectional view showing a modified embodiment of the semiconductor device according to this embodiment (SON type). The embodiment shown in FIG. 11 is different in that two lead portions (a second portion 92 and a third portion 93) are disposed at the periphery of a first portion (die pad) 91 of a main body portion 11 and other configurations are substantially identical with those of the embodiment shown in FIG. 3 described previously.

That is, in the semiconductor device 90 shown in FIG. 11, the main body portion 11 has the first portion (die pad) 91 for mounting an LED element 21, and a pair of lead portions (the second portion 92 and the third portion 93) disposed at the periphery of the first portion (die pad) 91 and at a position where the second portion 92 and the third portion 93 are opposed to each other with the first portion 91 put between them.

In FIG. 11, the LED element 21 has a pair of terminal portions 21a, and the pair of terminal portions 21a are connected to the second portion 92 and the third portion 93 respectively by way of bonding wires 22.

The semiconductor devices 40, 50, 60, 70, 80, and 90 according to each of the modified embodiments of this embodiment described above (FIG. 6 to FIG. 11) can also provide substantially identical function and effect as those of the semiconductor device 20 shown in FIG. 3.

EXAMPLE

Then, specific examples of the LED leadframe or LED substrate according to this embodiment are to be described.

Three types of substrates (Example 1-A, Example 1-B, Comparative example 1-A) shown below were manufactured.

Example 1-A

A copper plating layer 13 (0.05 μm thickness) was formed on a main body portion 11 comprising a copper plate, and a silver plating layer 14 (3 μm thickness) was applied on the copper plating layer 13. Then, a reflection metal layer 12 comprising an alloy of gold (Au) and silver (Ag) (0.1 μm thickness) was formed by plating on the silver plating layer 14, thereby manufacturing a substrate 10 (Example 1-A). In this case, the reflection metal layer 12 has a composition comprising 50% by weight of gold and the balance being silver and an inevitable impurity.

Example 1-B

A substrate 10 (Example 1-B) was manufactured in the same manner as in Example 1-A except that the reflection metal layer 12 had a composition containing 30% by weight of gold and the balance being silver and an inevitable impurity.

Comparative Example 1-A

A substrate (Comparative example 1-A) was manufactured by forming a copper plating layer (0.05 μm thickness) on a main body portion comprising a copper plate and forming a silver plating layer on the copper plating layer.
<Initial Reflectance>

The reflectance (initial reflectance) at the surfaces of the three types of the substrates (Example 1-A, Example 1-B, and Comparative example 1-A) was measured. For the measurement of the reflectance, spectral photometer MPC-2200, UV-2550 manufactured by Shimadzu Corporation was used.
<Reflectance after Solution Test>

For investigating the sulfurization resistance of the three types of the substrates (Example 1-A, Example 1-B, and Comparative example 1-A), a solution test was carried out for each of the substrates. Specifically, each of the substrates was dipped in a 0.25% aqueous solution of ammonium sulfide (R. T) for 5 min. Then, the reflectance was measured by the same method as in the case of the initial reflectance described above (reflectance after solution test).
<Reflectance after Gas Test>

For investigating the sulfurization resistance of the three types of the substrates (Example 1-A, Example 1-B, and Comparative example 1-A), a gas test was carried out for each of the substrates. Specifically, each of the substrates was exposed in a gas containing 3 ppm of $H_2S$, at a temperature of 40° C. and at a humidity of 80% Rh for one hour. Then, the reflectance (reflectance after gas test) was measured by the same method as in the case of the initial reflectance described above.

Figure 12:
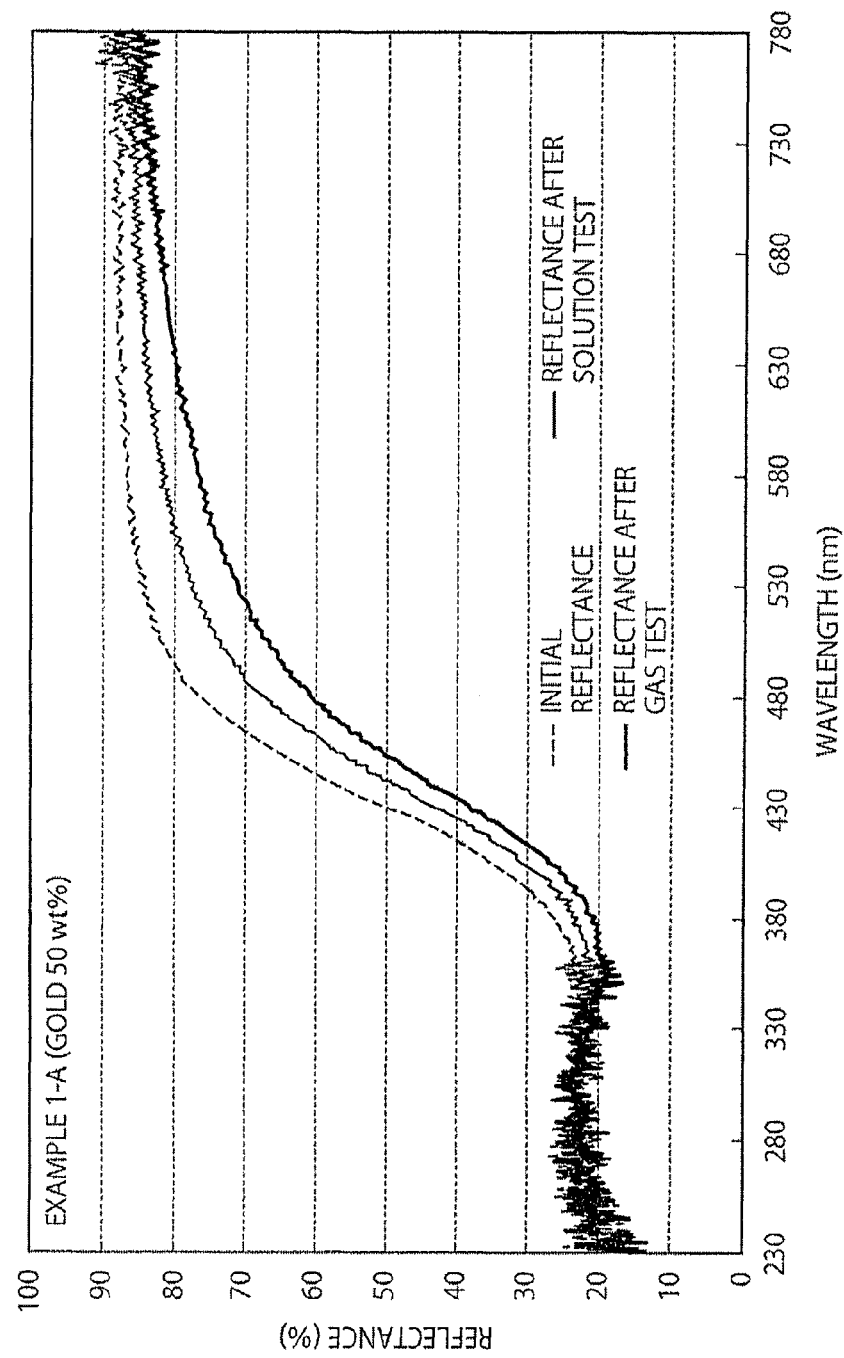
FIG. 12 is a graph showing the change of reflectance in Example 1-A.
Figure 13:
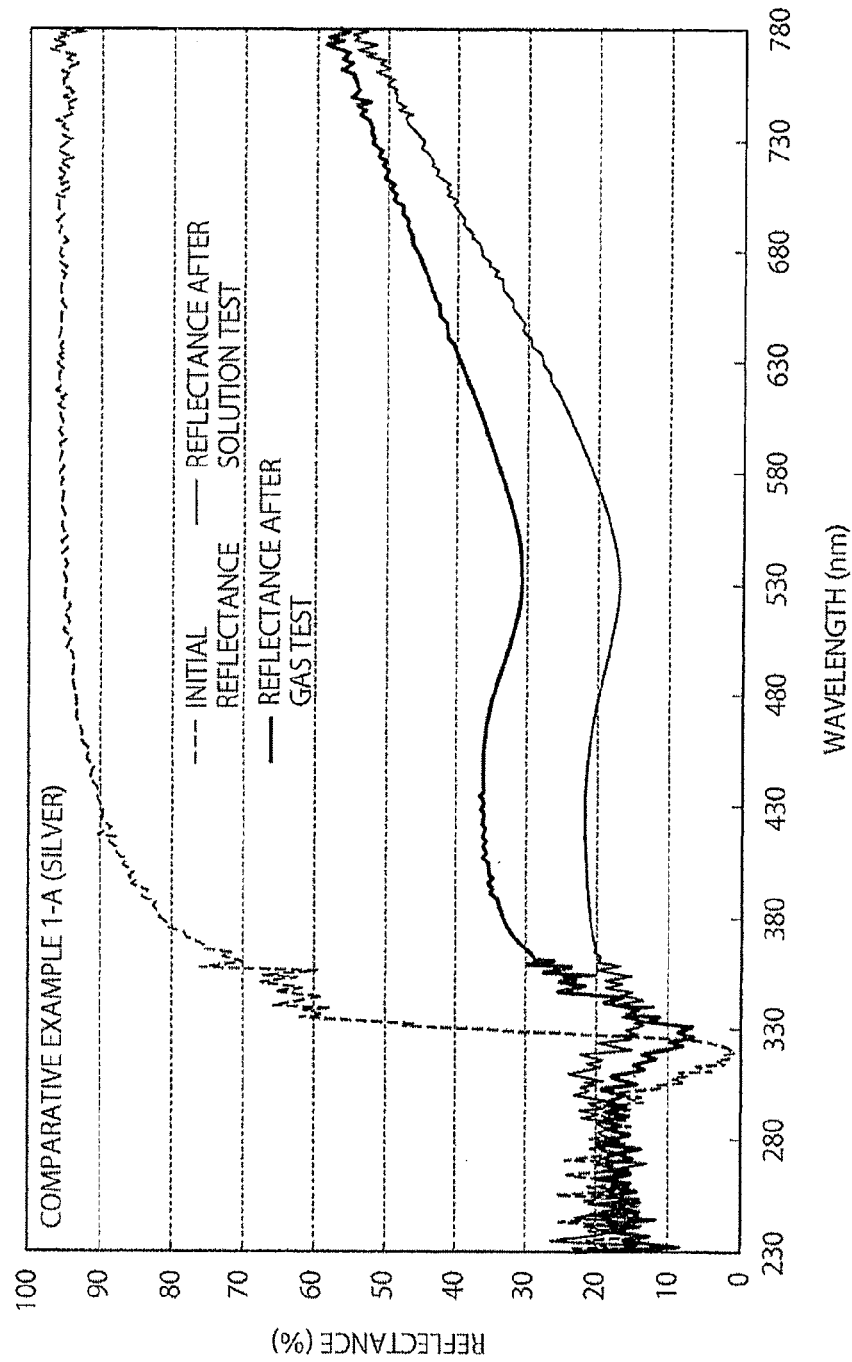
FIG. 13 is a graph showing the change of reflectance in Comparative Example 1-A (Comparative Example 3-A)

The results are shown in FIG. 12 and FIG. 13. FIG. 12 and FIG. 13 are graphs showing the initial reflectance, the reflectance after the solution test, and the reflectance after the gas test for Example 1-A (gold 50 wt %) and Comparative example 1-A (silver) respectively.

As a result, it was found that the substrate of Example 1-A (gold 50 wt %) showed less lowering of the reflectance after the solution test and the reflectance after the gas test from the initial reflectance for the entire ultraviolet and visible regions, and the reflection metal layer 12 is less likely to be corroded due to a corrosive gas such as a hydrogen sulfide gas.

The substrate of Example 1-B (gold 30 wt %) has a high initial reflectance equivalent with that of silver (Comparative example 1-A) for the entire visible region. Although the reflectance was lowered somewhat from the initial reflectance in both of the reflectance after the solution test and the reflectance after the gas test, lowering in a long wavelength region was slight and the value of the reflectance in the blue region (for example, at a wavelength of 460 nm) was kept at a level identical with that of Example 1-A (gold 50 wt %).

The substrate of Comparative example 1-A (silver) showed significant lowering from the initial reflectance both in the reflectance after the solution test and the reflectance after the gas test for the entire visible region. In particular, also the value of the reflectance in the blue region (for example, at a wavelength of 460 nm) was lower than those of Example 1-A (gold 50 wt %) and Example 1-B (gold 30 wt %). Accordingly, the silver plating layer is likely to be corroded due to the corrosive gas such as a hydrogen sulfide gas.

<Continuity of Wire Bonding (W/B)>

It was investigated whether continuous wire bonding can be applied or not on the surfaces of the three types of the substrates (Example 1-A, Example 1-B, and Comparative example 1-A) described above. Specifically, wire bonding was performed continuously for 20 times to the substrates by using a wire bonding testing apparatus (HW27U-HF, manufactured by Panasonic Factory Solutions Co., Ltd.), and it was investigated whether the bonding wire was disconnected or not during the process.

<Wire Bonding (W/B) Strength>

It was investigated that the wire pull strength when wire bonding was applied on the surfaces of the three types of the substrates (Example 1-A, Example 1-B, and Comparative example 1-A) described above. Specifically, a load which disconnects the bonding wire was measured when the bonding wire was pulled by 0.2 mm/sec by using a pull tester (Bond tester 4000, manufactured by DAGE Co., Ltd.).

<Solder Wettability>

Solder wettability was investigated on the three types of the substrates (Example 1-A, Example 1-B, and Comparative example 1-A) described above. Specifically, solder wettability on the substrate was measured by a meniscograph method using a solder checker (SAT-5200, manufactured by Rhesca Corporation). The conditions were set to solder temperature of 240° C., dipping time of 10 sec, dipping depth of 2 mm, and speed of 2 mm/sec. The meniscograph method evaluates solder wettability by dipping a test specimen (substrate) into a molten solder, and measuring the time when the repelling force of the solder without wetting the test specimen changed to a force of pulling the test specimen after wetting. In this case, "zero cross time", that is a time till the change of the vector of the wetting force of wetting the test specimen, was measured.

As a result, all of the three types of the substrates (Example 1-A, Example 1-B, and Comparative example 1-A) were satisfactory for all of the wire bonding (W/B) continuity, the wire bonding (W/B) strength, and the solder wettability. The results are collectively shown in Table 1.

TABLE 1

| Composition of corrosion resistant plating | Initial reflectance (wavelength at 400 to 460 nm) | Evaluation of sulfurization resistance (wavelength at 460 nm) | | W/B evaluation | | Solder wettability |
|---|---|---|---|---|---|---|
| | | Reflectance after solution test (U-5) | Reflectance after gas test (1H) | Continuity | Strength | Zero cross |
| Example 1-A (gold 50 wt %) | 33 to 68% | 59% | 52% | ⊚ (Excellent) | 8.4 g | 1.2 sec |
| Example 1-B (gold 30 wt %) | 78 to 88% | 57% | 50% | ⊚ (Excellent) | 7.7 g | 1.1 sec |
| Comparative example 1-A (silver) | 85 to 92% | 22% | 36% | ⊚ (Excellent) | 7.0 g | 0.9 sec |

Second Embodiment

Then, a second embodiment of the present invention is to be described with reference to FIG. 14 to FIG. 29. The second embodiment shown in FIG. 14 to FIG. 29 are different in the configurations of each for layers disposed over a mounting surface 11*a* of a main body portion 11 and other configurations are substantially identical with those of the first embodiment described above. In FIG. 14 to FIG. 29, portions identical with those of the first embodiment carry the same reference numerals and detailed description therefor is to be omitted.

Configuration of LED Leadframe or LED Substrate

Figure 14:
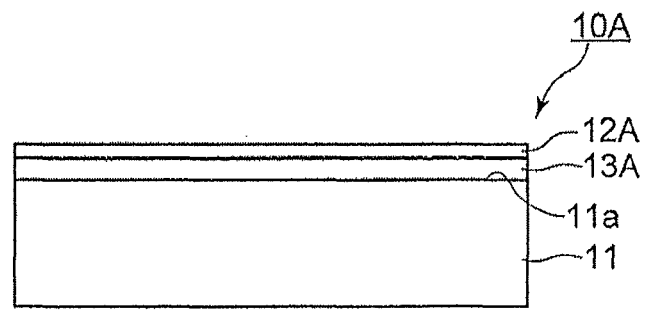
FIG. 14 is a cross sectional view showing a leadframe or substrate according to a second embodiment of the present invention.
Figure 15:
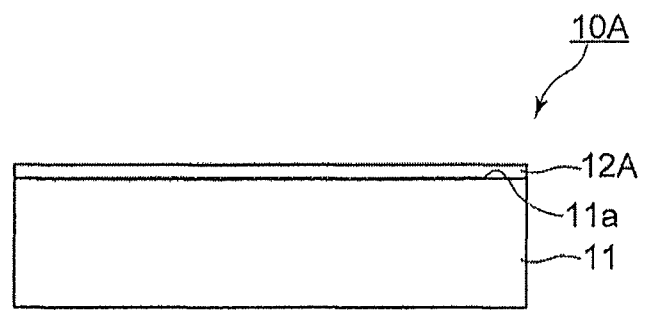
FIG. 15 is a cross sectional view showing a modified example of a leadframe or substrate according to the second embodiment of the present invention.

First, the outline of an LED leadframe or LED substrate is to be described with reference to FIG. 14 to FIG. 16. In FIG. 14 and FIG. 15, for the explanation of the layer configuration of the LED leadframe or LED substrate, a cross section of the LED leadframe or LED substrate is shown as a rectangular shape for the sake of convenience.

As shown in FIG. 14, an LED leadframe or LED substrate 10A according to this embodiment (hereinafter referred to also as a leadframe 10A or substrate 10A) has a main body portion 11 having a mounting surface 11*a* for mounting the LED element 21, and a reflection plating layer 12A disposed over the mounting surface 11*a* of the main body portion 11.

Among them, the main body portion 11 comprises a metal plate. Examples of the material for the metal plate forming the main body portion 11 include copper, copper alloy, 42 alloy (Ni 41% Fe alloy), etc. The thickness of the main body portion 11 is preferably 0.05 mm to 0.5 mm in a case of the leadframe 10A and 0.005 mm to 0.03 mm in a case of the substrate 10A although depending on the configuration of the semiconductor device.

The reflection plating layer 12A serves as a reflection layer for reflecting light from the LED element 21 and is situated at the uppermost surface of the LED leadframe or LED substrate 10A. In this case, the reflection plating layer 12A comprises an alloy of tin (Sn) and silver (Ag), has high reflectance to visible light, and has high corrosion resistance to oxygen and a hydrogen sulfide gas.

The reflection plating layer 12A preferably has a composition containing 10 to 50% by weight of tin and the balance being an inevitable impurity and, more preferably, has a composition particularly containing 10 to 25% by weight of tin and the balance being silver and an inevitable impurity.

Figure 16:
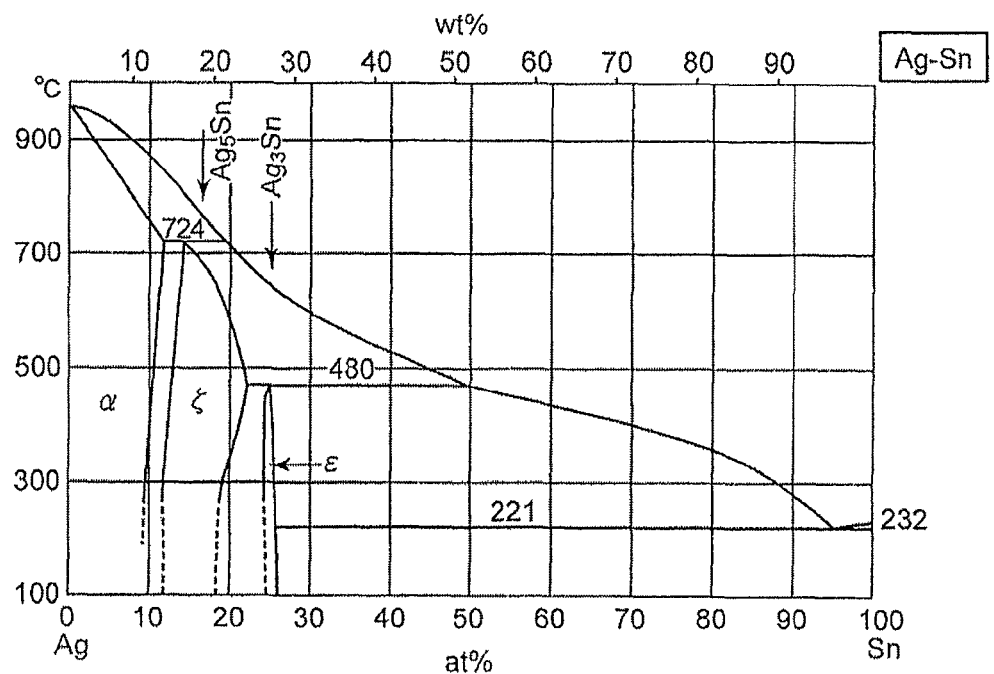
FIG. 16 is a phase diagram of an Ag—Sn alloy.

FIG. 16 shows a phase diagram of an Ag—Sn alloy (source: "Binary alloy phase diagram" edited by Seizo Nagasaki and Makoto Hirabayashi, published from AGNE Gijutsu Center Inc."). Generally, in a bonding step or a die attaching step upon manufacturing the semiconductor device, the LED leadframe or LED substrate 10A is sometimes heated, for example, to about 400° C. Therefore, when the ratio of tin constituting the reflection plating layer 12A exceeds 25% by weight, since the reflection plating layer 12A is recrystallized when the LED leadframe or LED substrate 10A is heated, the performance tends to be changed. Further, when the ratio of tin is lowered to less than 10% by weight, since the tin ratio is decreased, the reflection plating layer 12A is liable to suffer from corrosion by a corrosive gas such as oxygen or a hydrogen sulfide gas in the air.

Further, since the melting point of the reflection plating layer 12A is lowered (refer to FIG. 16) when the ratio for tin constituting the reflection plating layer 12A exceeds 70% by weight, the reflection plating layer 12A may possibly be melted when the LED leadframe or LED substrate 10A is heated, for example, to about 400° C. Further, when the ratio of tin constituting the reflection plating layer 12A exceeds 50% by weight, the reflection characteristics or the bonding performance of the reflection plating layer 12A may possibly be degraded.

Depending on the method for manufacturing the semiconductor device, the LED leadframe or LED substrate 10A is not always heated to a high temperature (for example, to about 400° C.). In such a case, there is no possibility that the reflection plating layer 12A is recrystallized or melted due to the effect of the heat. Accordingly, the ratio of tin constituting the reflection plating layer 12A is not restricted to the range described above.

Further, the thickness of the reflection plating layer 12A is extremely thin and, specifically, it is preferably 0.005 μm to 0.2 μm.

On the other hand, an underlying plating layer 13A is interposed between the main body portion 11 and the reflection plating 12A. Examples of the metal plating constituting the underlying plating layer 13A include copper plating or nickel plating.

The underlying plating layer 13A is used as an underlayer for the reflection plating layer 12A, and has a function of enhancing the bondability between the reflection plating layer 12A and the main body portion 11. The thickness of the underlying plating layer 13A is preferably from 0.005 μm to 0.1 μm.

As shown in FIG. 15, it is also possible that the underlying plating layer 13A is not provided between the main body portion 11 and the reflection plating 12A. In this case, the LED leadframe or LED substrate 10A has the main body portion 11, the reflection plating layer 12A disposed directly on the mounting surface 11a of the main body portion 11.

Configuration of Semiconductor Device

Figure 17:
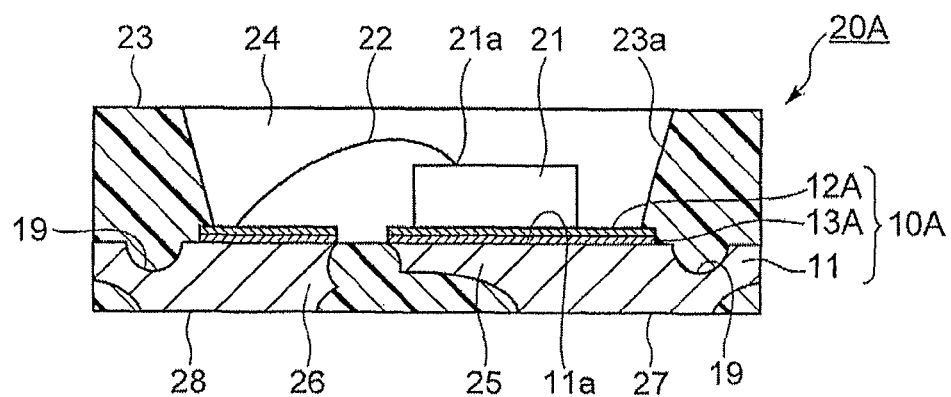
FIG. 17 is a cross sectional view (cross sectional view along line A-A in FIG. 18) showing a semiconductor device according to the second embodiment of the present invention.
Figure 18:
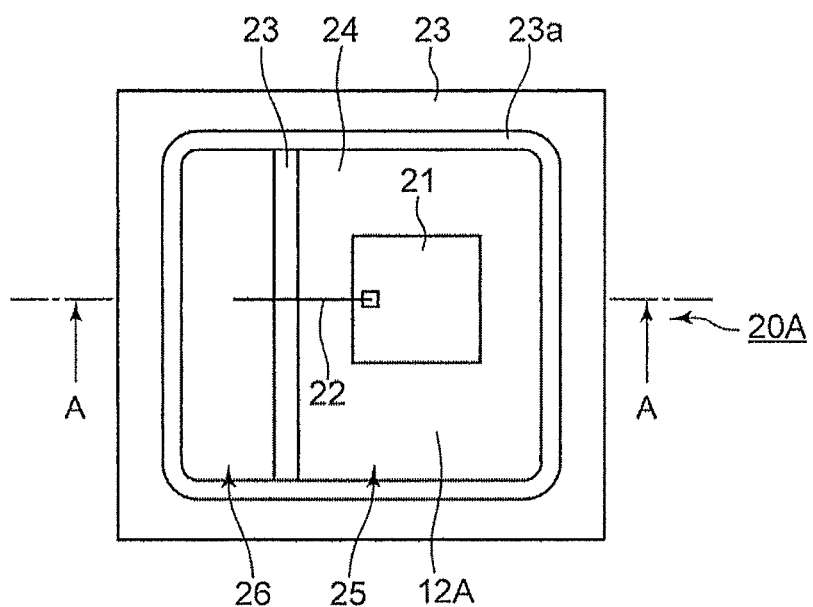
FIG. 18 is a plan view showing the semiconductor device according to the second embodiment of the present invention.
Figure 19:
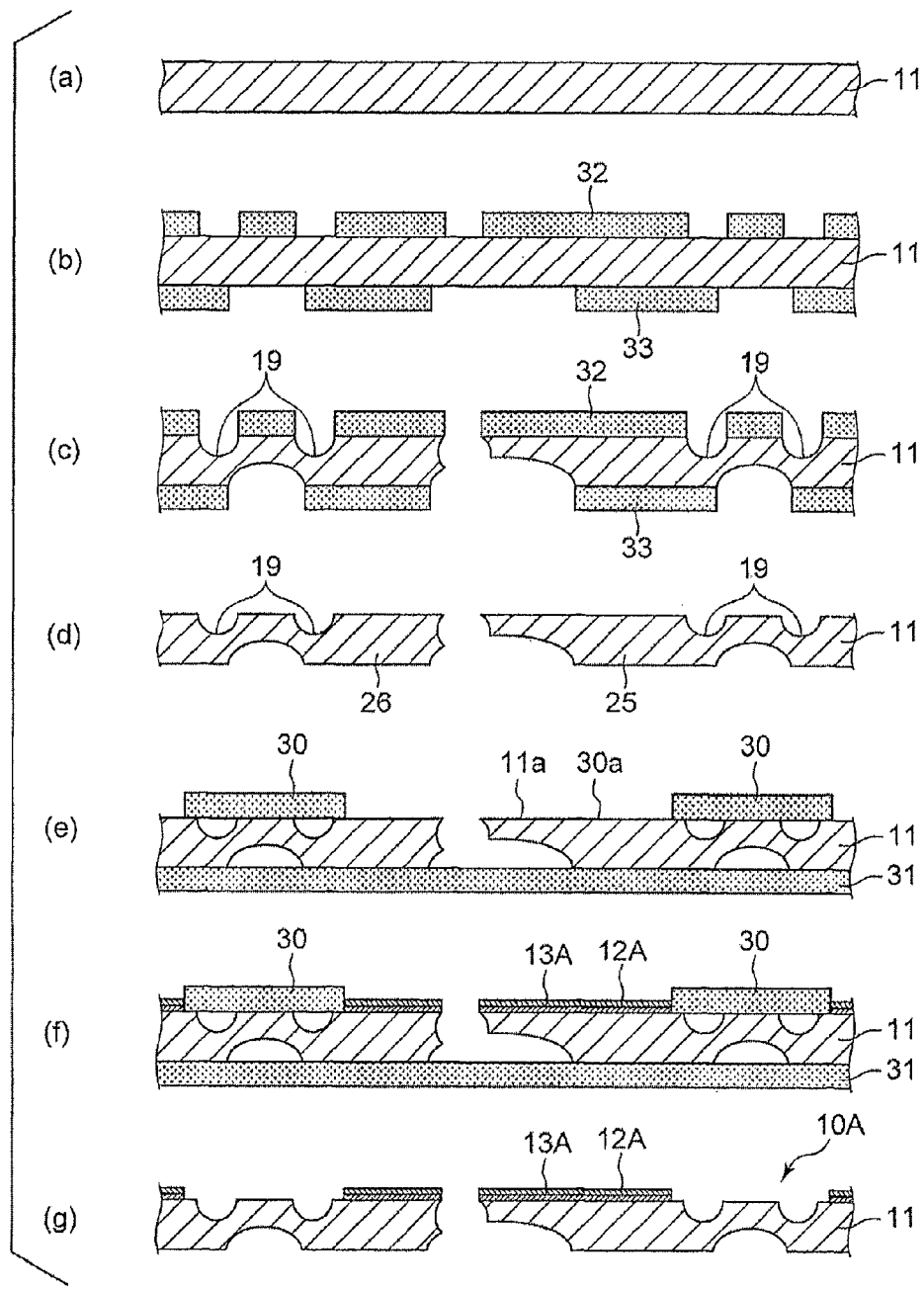
FIG. 19 is a diagram showing a method for manufacturing a leadframe according to the second embodiment of the present invention.
Figure 20:
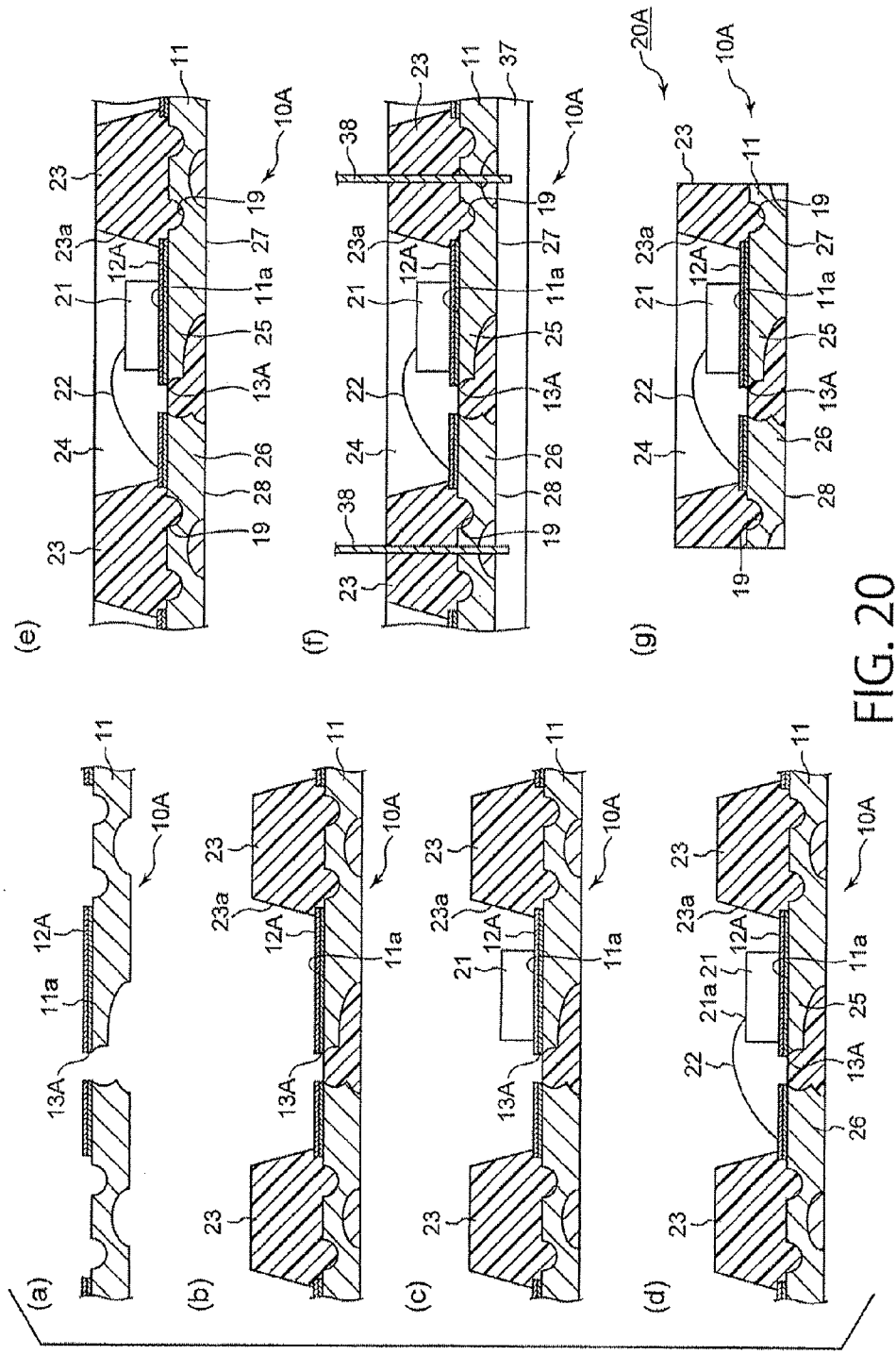
FIG. 20 is a diagram showing a method for manufacturing a semiconductor device according to the second embodiment of the present invention.

Then, a second embodiment of the semiconductor device using the LED leadframe or LED substrate shown in FIG. 14 is to be described with reference to FIG. 17 and FIG. 18. FIG. 17 and FIG. 18 are cross sectional views showing a semiconductor device (SON type) according to the first embodiment of the present invention.

As shown in FIG. 17 and FIG. 18, a semiconductor device 20A according to the second embodiment has an LED leadframe 10A, an LED element 21 mounted over a mounting surface 11a of a main body portion 11 of the leadframe 10A, and a bonding wire (electroconductive portion) 22 electrically connecting the leadframe 10A and the LED element 21.

Further, an outer resin portion 23 having a concave portion 23a is disposed so as to surround the LED element 21. The outer resin portion 23 is integrated with the leadframe 10A. Further, the LED element 21 and the bonding wire 22 are encapsulated by a light permeable encapsulating resin portion 24. The encapsulating resin portion 24 is filled in the concave portion 23a of the outer resin portion 23.

The leadframe 10A has the main body portion 11 having the mounting surface 11a, the copper plating layer 13A disposed on the main body portion 11, and the reflection plating layer 12A disposed on the underlying plating layer 13A and serving as a reflection layer for reflecting light from the LED element 21. Trenches 19 for enhancing the close bondability between the leadframe 10A and the outer resin portion 23 are formed in the surface (upper surface) of the leadframe 10A. Since the layer configuration of the leadframe 10A is identical with that described already with reference to FIG. 14, detailed description therefor is to be omitted. As the layer configuration of the leadframe 10A, that shown in FIG. 15 may also be used.

In addition, since the configuration for each of components to form the semiconductor device 20A is identical with that of the first embodiment described above, portions identical with those of the first embodiment described above carry the same reference numerals and detailed description therefor is to be omitted.

Method for Manufacturing LED Leadframe

Then, a method for manufacturing the LED leadframe 10A used in the semiconductor device 20A shown in FIG. 17 and FIG. 18 is to be described with reference to FIGS. 19(a) to (g). In the followings, description of the portions in common with those of the first embodiment described above is partially omitted.

First, in the same manner as in the first embodiment (FIGS. 4(a) to (d)), the main body portion 11 having a first portion 25 and a second portion 26 spaced from the first portion 25 is manufactured (FIGS. 19(a) to (d)).

Then, resist layers 30, 31 for plating each having a desired pattern are disposed on the surface and the rear face of the main body portion 11 (FIG. 19(e)), and electrolytic plating is applied to the main body portion 11 on the side of the surface covered with the plating resist layers 30, 31. Thus, a metal (copper) is deposited on the main body portion 11 to form an underlying plating layer 13A on the main body portion 11. When the underlying plating layer 13A comprises copper plating, a copper plating solution comprising copper cyanide and potassium cyanide as main ingredients can be used as the plating solution for electrolytic plating.

Successively, metal is deposited on the underlying plating layer 13A by electrolytic plating to form a reflection plating layer 12A (FIG. 19(f)).

As described above, the reflection plating layer 12A comprises the alloy of tin (Sn) and silver (Ag). As the plating solution for electrolytic plating for forming the reflection plating layer 12A, non-cyanic plating solution containing salts of silver and tin can be used.

Then, by peeling the resist layers 30, 31 for plating, a leadframe 10A used for the semiconductor device 20A can be obtained (FIG. 19(g)).

In FIG. 19(a) to FIG. 19(g), the main body portion 11 is fabricated into a predetermined shape by etching (FIGS. 19(a) to (d)) and then the underlying plating layer 13A and the reflection plating layer 12A are formed over the main body portion 11 (FIGS. 19(e) to (g)). However, this is not restrictive but the underlying plating layer 13A and the reflection plating layer 12A may be formed first over the main body portion 11 and then the main body portion 11 may be fabricated into the predetermined shape.

Method for Manufacturing Semiconductor Device

Then, a method for manufacturing the semiconductor device 20A shown in FIG. 17 and FIG. 18 is to be described with reference to FIGS. 20(a) to (g). In FIGS. 20(a) to (g), portions identical with those of the first embodiment described above carry the same reference numerals.

First, by the step shown in FIGS. 19(a) to (g), a lead frame 10A is manufactured (FIG. 20(a)), and a thermoplastic resin or a thermosetting resin is injection molded or transfer molded to the leadframe 10A, to form an outer resin portion 23 (FIG. 20(b)).

Then, an LED element 21 is mounted over the mounting surface 11a of a main body portion 11 of the leadframe 10A. In this step, the LED element 21 is placed and fixed over the mounting surface 11a (on the reflection plating layer 12A) of the main body portion 11 using a solder or a die bonding paste (die attaching step) (FIG. 20(c)).

Then, a terminal portion 21a of the LED element 21 and the surface of a second portion 26 of the main body portion 11 are electrically connected to each other by a bonding wire 22 (wire bonding step) (FIG. 20(d)).

Then, an encapsulating resin portion 24 is filled in a concave portion 23a in the outer resin portion 23 and the LED element 21 and the bonding wire 22 are encapsulated by the encapsulating resin portion 24 (FIG. 20(e)).

Then, the leadframe 10A is separated on every LED element 21 by dicing the outer resin portion 23 between each of the LED elements 21 (FIG. 20(f)). In this step, the leadframe 10A is mounted and fixed on a dicing tape 37 and then the outer resin portion 23 between each of the LED elements 21 is cut in a vertical direction by a blade 38 comprising, for example, a diamond grinding stone.

As described above, the semiconductor device 20A shown in FIG. 17 and FIG. 18 can be obtained (FIG. 20(g)).

Function and Effect of this Embodiment

Then, the function and the effect of this embodiment are to be described. In the semiconductor device 20A of this embodiment, the reflection plating layer 12A serving as a reflection layer is disposed over the mounting surface 11a of the main body portion 11 as described above. The reflection plating layer 12A comprises an alloy of tin and silver. Then, as in the case of the first embodiment described above, even when a corrosive gas penetrates into the semiconductor device 20A after lapse of a predetermined time from the manufacture of the semiconductor device 20A, the reflection layer (reflection plating layer 12A) is less discolored or corroded, whereby the reflectance is not lowered.

Further, according to this embodiment, since the reflection plating layer 12A comprises the alloy of tin and silver and has high reflection characteristics, light from the LED element 21 can be reflected efficiently.

Further, according to this embodiment, the reflection plating layer 12A comprises an extremely thin film (0.005 µm to 0.2 µm) as described above. Accordingly, the reflection plating layer 12A is fractured partially by the energy applied upon die attachment or wire bonding. Accordingly, there can be obtained a pull strength substantially identical with that when die attaching or wire bonding is performed directly on the silver plating.

Modified Embodiment

Each of modified embodiments of the semiconductor device according to this embodiment is to be described with reference to FIG. 21 to FIG. 28. In FIG. 21 to FIG. 28, portions identical with those of the embodiment shown in FIG. 6 to FIG. 11 carry the same reference numerals and detailed description therefor is to be omitted.

In each of the modified embodiments shown in FIG. 21 to FIG. 28, the reflection plating layer 12A comprises an alloy of tin and silver in the same manner as in the embodiment shown in FIG. 17 and FIG. 18.

Figure 21:
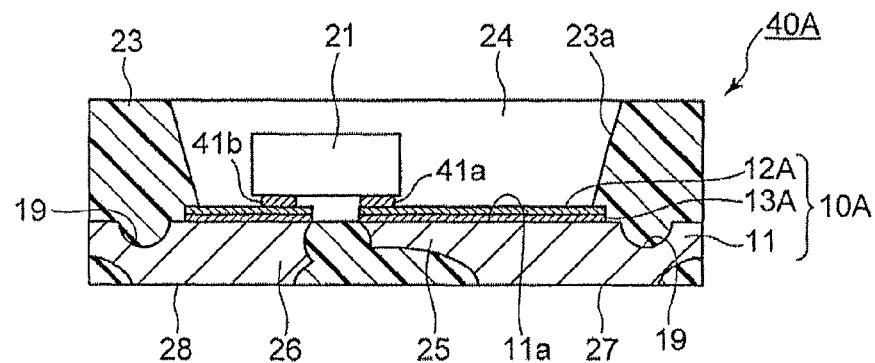
FIG. 21 is a cross sectional view showing a modified example of the semiconductor device according to the second embodiment of the present invention.

FIG. 21 is a cross sectional view showing a modified embodiment (SON type) of a semiconductor device according to this embodiment. The semiconductor device 40A shown in FIG. 21 is different in the configurations for each of the layers disposed over the mounting surface 11a of the main body portion 11, and other configurations are substantially identical with the configurations of the semiconductor device 40 shown in FIG. 6 described above.

Figure 22:
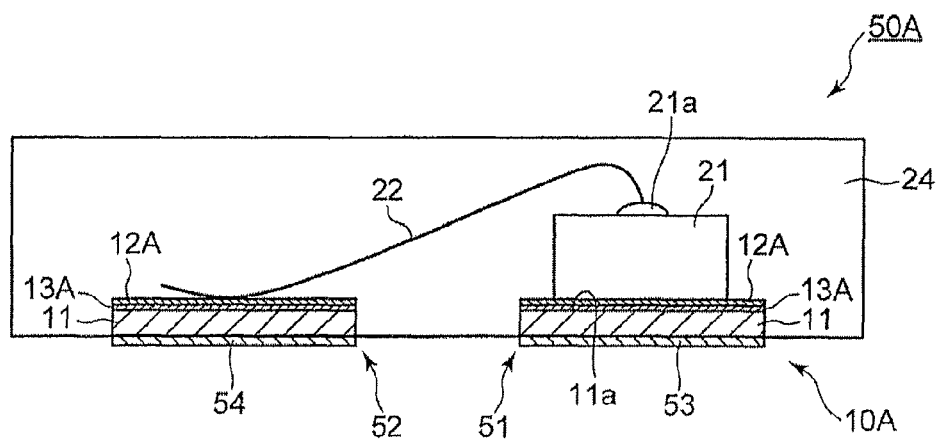
FIG. 22 is a cross sectional view showing a modified example of the semiconductor device according to the second embodiment of the present invention.

FIG. 22 is a cross sectional view forming a modified embodiment (LGA type) of a semiconductor device according to this embodiment. The semiconductor device 50A shown in FIG. 22 is different in the configurations for each of the layers disposed over the mounting surface 11a of the main body portion 11, and other configurations are substantially identical with those of the semiconductor device 50 shown in FIG. 7 described above.

Figure 23:
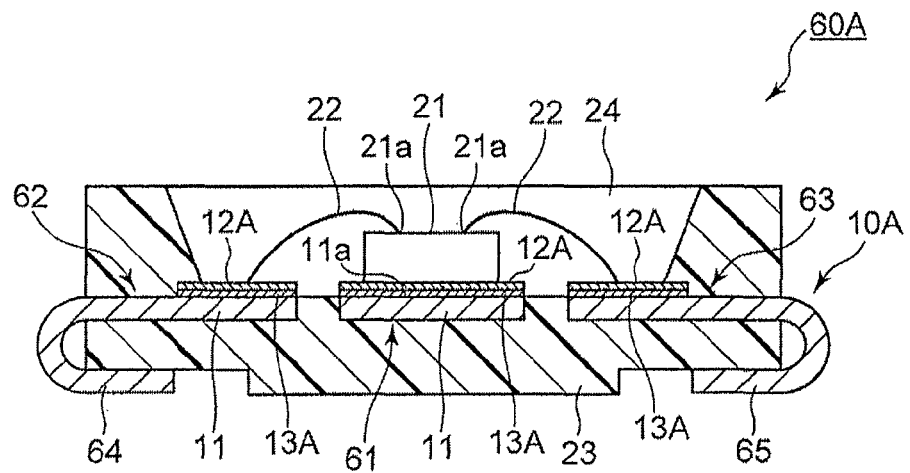
FIG. 23 is a cross sectional view showing a modified example of the semiconductor device according to the second embodiment of the present invention.

FIG. 23 is a cross sectional view showing a modified embodiment (PLCC type) of a semiconductor device according to this embodiment. The semiconductor device 60A shown in FIG. 23 is different in the configurations for each of the layers disposed over the mounting surface 11a of the main body portion 11, and other configurations are substantially identical with those of the semiconductor device 60 shown in FIG. 8 described above.

Figure 24:
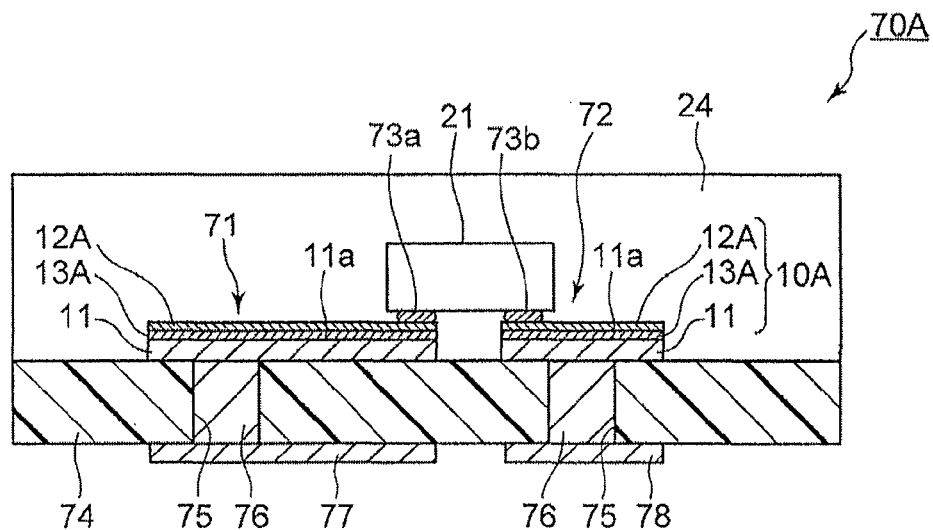
FIG. 24 is a cross sectional view showing a modified example of the semiconductor device according to the second embodiment of the present invention.

FIG. 24 is a cross sectional view showing a modified embodiment (substrate type) of a semiconductor device according to this embodiment. The semiconductor device 70A shown in FIG. 24 is different in the configurations for each of the layers disposed over the mounting surface 11a of the main body portion 11, and other configurations are substantially identical with those of the semiconductor device 70 shown in FIG. 9 described above.

Figure 25:
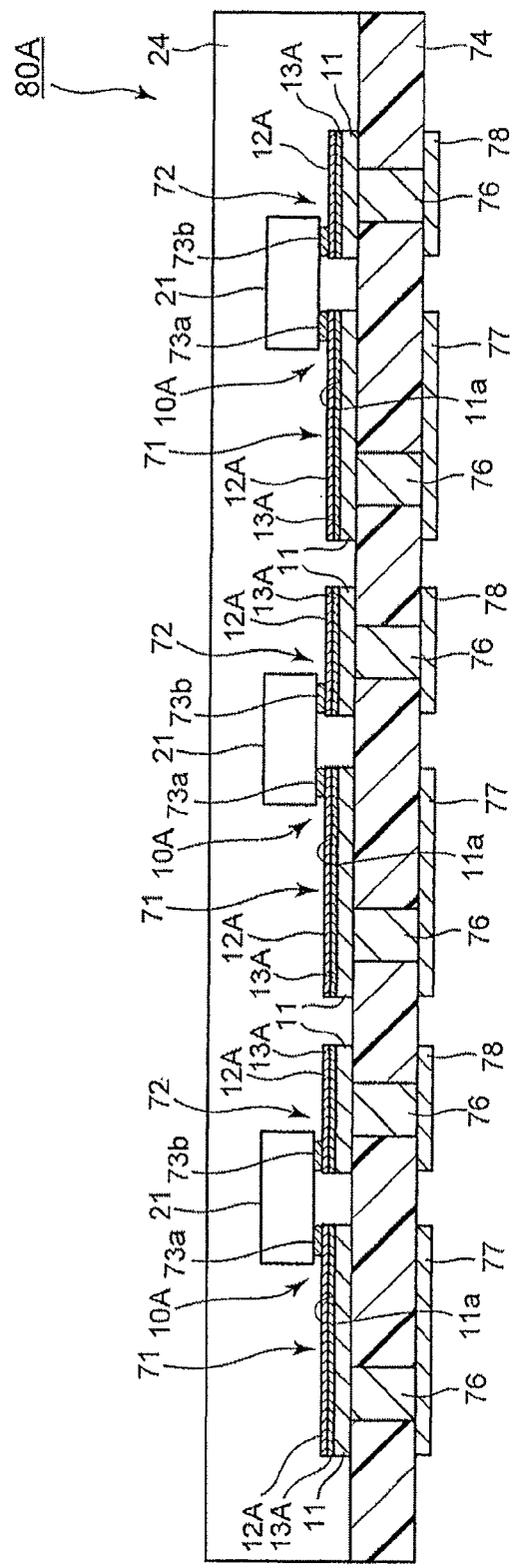
FIG. 25 is a cross sectional view showing a modified example of the semiconductor device according to the second embodiment of the present invention.

FIG. 25 is a cross sectional view showing a modified embodiment (module type) of a semiconductor device according to this embodiment. The semiconductor device 80A shown in FIG. 25 is different in the configurations for each of the layers disposed over the mounting surface 11a of the main body portion 11, and other configurations are substantially identical with those of the semiconductor device 80 shown in FIG. 10 described above.

Figure 26:
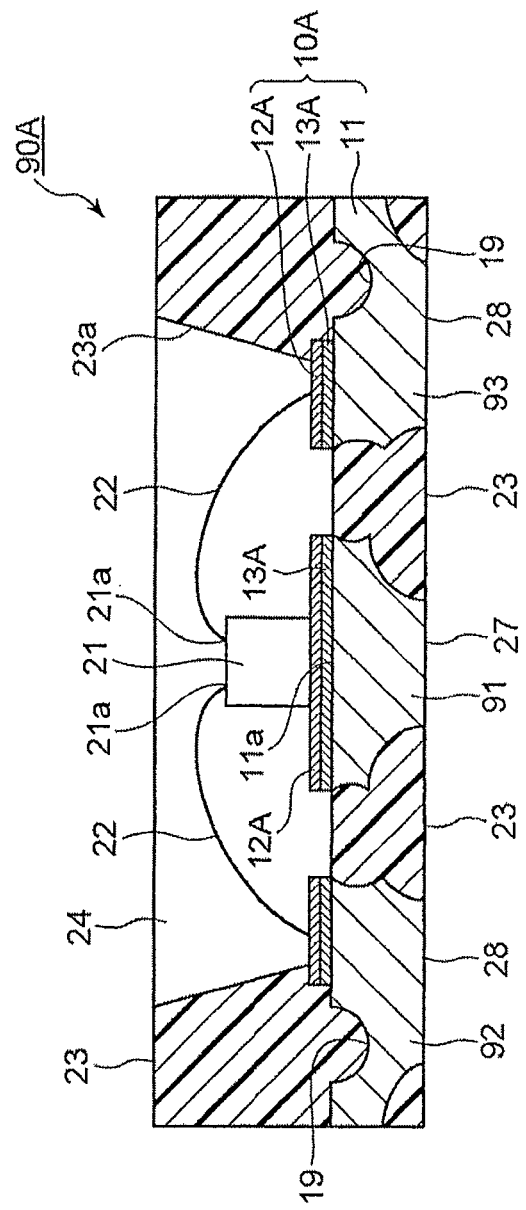
FIG. 26 is a cross sectional view showing a modified example of the semiconductor device according to the second embodiment of the present invention.

FIG. 26 is a cross sectional view showing a modified embodiment (SON type) of a semiconductor device according to this embodiment. The semiconductor device 90A shown in FIG. 26 is different in the configurations for each of the layers disposed over the mounting surface 11a of the main body portion 11, and other configurations are substantially identical with those of the semiconductor device 90 shown in FIG. 11 described above.

Figure 27:
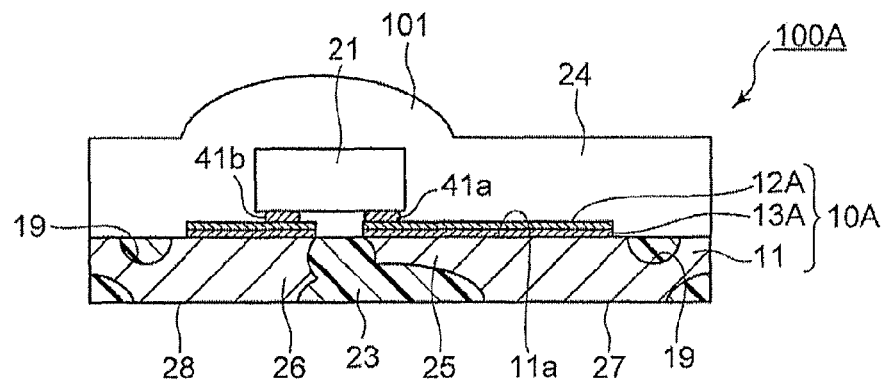
FIG. 27 is a cross sectional view showing a modified example of the semiconductor device according to the second embodiment of the present invention.

FIG. 27 is a cross sectional view showing a modified embodiment (collectively molded type with lens) of a semiconductor device according to this embodiment. The embodiment shown in FIG. 27 is different in that the outer resin portion 23 is not disposed at the periphery of an LED element 21 and a lens 101 is disposed on an encapsulation resin portion 24, and other configurations are substantially identical with those of the embodiment shown in FIG. 21 described above.

That is, in the semiconductor device 100A shown in FIG. 27, an outer resin portion 23 is filled between a first portion 25 and a second portion 26 of the main body portion 11. On the other hand, different from the embodiment shown in FIG. 21, the outer resin portion 23 is not disposed above the leadframe 10A.

Further, in FIG. 27, a dome-shaped lens 101 is formed on the surface (upper surface) of an encapsulation portion 24 for controlling the irradiation direction of light from the LED element 21.

Figure 28:
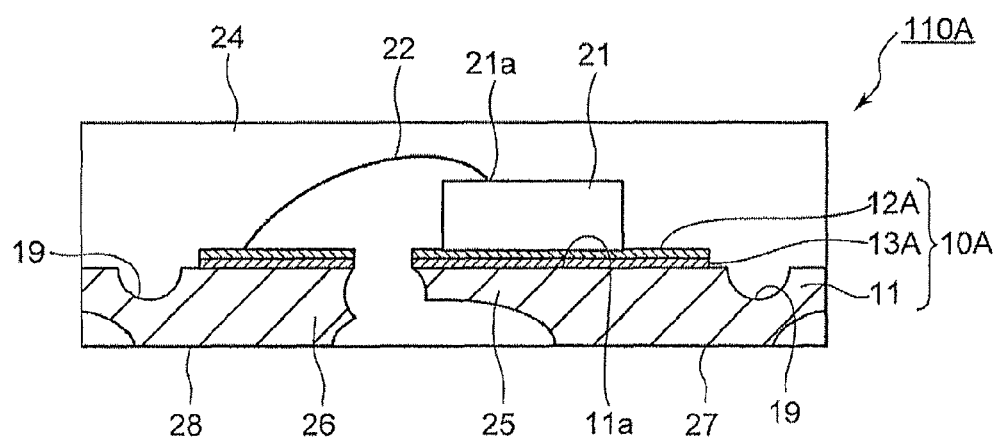
FIG. 28 is a cross sectional view showing a modified example of the semiconductor device according to the second embodiment of the present invention.

FIG. 28 is a cross sectional view showing a modified embodiment (collectively molded type) of a semiconductor device. The embodiment shown in FIG. 28 is different in that the LED element 21 and the bonding wire 22 are encapsulated only by the encapsulating resin portion 24, and other configurations are substantially identical with those of the embodiment shown in FIG. 17 and FIG. 18 described above.

That is, in the semiconductor device 110A shown in FIG. 28, an LED element 21 and a bonding wire 22 are collectively encapsulated only by the encapsulating resin portion 24 without using the outer resin portion 23. The encapsulating resin portion 24 is filled between the first portion 25 and the second portion 26 of the main body portion 11.

Also in the semiconductor devices 40A, 50A, 60A, 70A, 80A, 90A, 100A, and 110A (FIG. 21 to FIG. 28) according to each of the modified embodiments of this preferred embodiment described above, substantially identical function and effect with those of the semiconductor device 20A shown in FIG. 17 and FIG. 18 can be obtained.

Example

Next, specific examples of the LED leadframe or LED substrate according to this embodiment are to be described with reference to FIG. 29.

Three types of substrates (Example 2-1, Example 2-2, Comparative Example 2-1) shown below were manufactured.

Example 2-1

Nickel plating was applied as an underlying plating layer 13A on a main body portion 11 comprising a rectangular copper plate. Then, a reflection plating layer 12A comprising an alloy of tin (Sn) and silver (Ag) was formed on the underlying plating layer 13A to manufacture a substrate 10A (Example 2-1). In this case, the reflection plating layer 12A had a composition containing 20% by weight of tin and the balance being silver and an inevitable impurity.

Example 2-2

A substrate 10A (Example 2-2) was manufactured in the same manner as in Example 2-1 except that the reflection plating layer 12A had a composition containing 35% by weight of tin and the balance being silver and an inevitable impurity.

Comparative Example 2-1

A substrate (Comparative Example 2-1) was manufactured in the same manner as in Example 2-1 except that the reflection plating layer comprises a silver plating layer.

Then, glossiness at the surface of the three types of the substrates (Example 2-1, Example 2-2, Comparative Example 2-1) was measured. For the measurement of the glossiness, a microsurface photospectrometer VSR 300 (manufactured by NIPPON DENSHOKU INDUSTRIES CO. LTD.) was used. As a result, the substrate 10A of Example 2-1 showed a glossiness of 0.32 and exhibited half bright appearance (opaque white color). Further, the substrate 10A of Example 2-2 showed a glossiness of 1.25 to 0.47 and the glossiness was higher compared with that of the substrate 10A of Example 2-1. On the other hand, the glossiness of the substrate of Comparative Example 2-1 was 1.28. As a result, the values of the glossiness of three types of the substrates (Example 2-1, Example 2-2, and Comparative Example 2-1) were sufficient for use as the reflection layer for reflecting light from the LED element.

Successively, a corrosion resistant test was carried out on the three types of the substrates (Example 2-1, Example 2-2, and Comparative Example 2-1) described above. Specifically, the three types of the substrates were directly left in a gas mixture containing $SO_2$ (10 ppm) and $H_2S$ (3 ppm) respectively. During leaving, the temperature was kept at 40° C. and the humidity was kept at 75% Rh at the periphery of the substrate. Then, the surface state of the substrate after 2 hours, 5 hours, and 10 hours from the start of leaving was visually observed and the superiority or the inferiority thereof was investigated in comparison (FIG. 29).

As a result, the substrate of Comparative Example 2-1 already started discoloration after 2 hours and was discolored completely after 10 hours. On the contrary, the substrates of Example 2-1 and Example 2-2 showed no substantial discoloration even after lapse of 10 hours.

Third Embodiment

Then, a third embodiment of the present invention is to be described with reference to FIG. 30 to FIG. 46. The third embodiment shown in FIG. 30 to FIG. 46 is different in the configurations for each of layers disposed over the mounting surface 11a of a main body portion 11, and other configurations are substantially identical with those of the first embodiment and the second embodiment described above. In FIG. 30 to FIG. 46, portions identical with those of the first embodiment and the second embodiment carry the same reference numerals and detailed description therefor is to be omitted.

Configuration of LED Leadframe or LED Substrate

Figure 30:
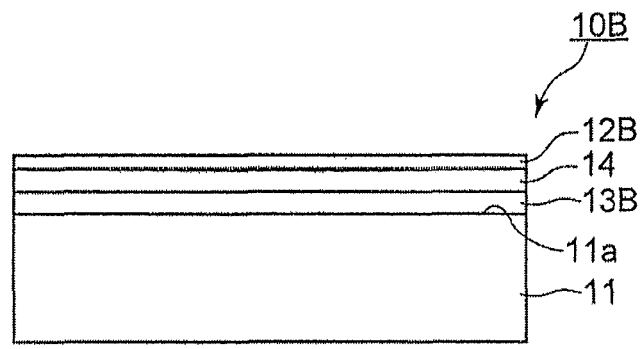
FIG. 30 is a cross sectional view showing a leadframe or substrate according to a third embodiment of the present invention.
Figure 31:
FIG. 31 is a cross sectional view showing a modified example of the leadframe or substrate according to the third embodiment of the present invention.

First, the outline of an LED leadframe or LED substrate is to be described with reference to FIG. 30 and FIG. 31. In FIG. 30 and FIG. 31, for the explanation of the layer configuration of the LED leadframe or LED substrate, a cross section of the LED leadframe or LED substrate is shown as a rectangular shape for the sake of convenience.

As shown in FIG. 30, an LED leadframe or LED substrate 10B (hereinafter referred to also as a leadframe 10B or substrate 10B) is used for mounting an LED element 21 (to be described later). The LED leadframe or LED substrate 10B has a main body portion 11 having a mounting surface 11a for mounting the LED element 21, and an indium plating layer 12B disposed over the side of the mounting surface 11a of the main body portion 11.

Among them, the main body portion 11 comprises a metal plate. Examples of the material for the metal plate forming the main body portion 11 include copper, copper alloy, 42 alloy (Ni 41% Fe alloy), etc. The thickness of the main body portion 11 is preferably 0.05 mm to 0.5 mm in a case of a leadframe 10B and 0.005 mm to 0.03 mm in a case of a substrate 10B although depending on the configuration of the semiconductor device.

The indium plating layer 12B serves as a reflection layer for reflecting light from the LED element 21, and is situated at the uppermost surface of the LED leadframe or LED substrate 10B. The indium plating layer 12B comprises an indium (In) plating layer, has a high reflectance to a visible light, and has a high corrosion resistance to oxygen and a hydrogen sulfide gas. Further, the thickness of the indium plating layer 12B is extremely thin and, specifically, it is preferably 0.005 μm to 0.2 μm.

On the other hand, an underlying plating layer 13B and a silver plating layer 14 are interposed between the main body portion 11 and the indium plating layer 12B successively from the side of the main body portion 11.

Among them, the underlying plating layer 13B is used as an underlying layer for the silver plating layer 14, and has a function of enhancing the bondability between the silver plating layer 14 and the main body portion 11. Examples of the metal plating forming the underlying plating layer 13B include copper plating or nickel plating. The thickness of the underlying plating layer 13B is preferably 0.005 μm to 0.1 μm.

The silver plating layer 14 is used as an underlying layer for the indium plating layer 12B, and has a function of enhancing the bondability between the underlying plating layer 13B and the indium plating layer 12B. The thickness of the silver plating layer 14 is larger than that of the indium plating layer 12B, and is preferably 1 μm to 5 μm.

The silver plating layer 14 may comprise either matte silver plating or bright silver plating. As described above, since the indium plating layer 12B is extremely thin, it can reveal the profile of the silver plating layer 14. For example, when the silver plating layer 14 comprises matte plating, the surface of the indium plating layer 12B can also be matt and, when the silver plating layer 14 comprises bright plating, the surface of the indium plating layer 12B can also be bright.

As shown in FIG. 31, it is also possible that an underlying plating layer 13B is not provided. In this case, the LED leadframe or LED substrate 10B has the main body portion 11, the silver plating layer 14 disposed on the mounting surface 11a of the main body portion 11 and the indium plating layer 12B disposed on the silver plating layer 14.

Configuration of Semiconductor Device

Figure 32:
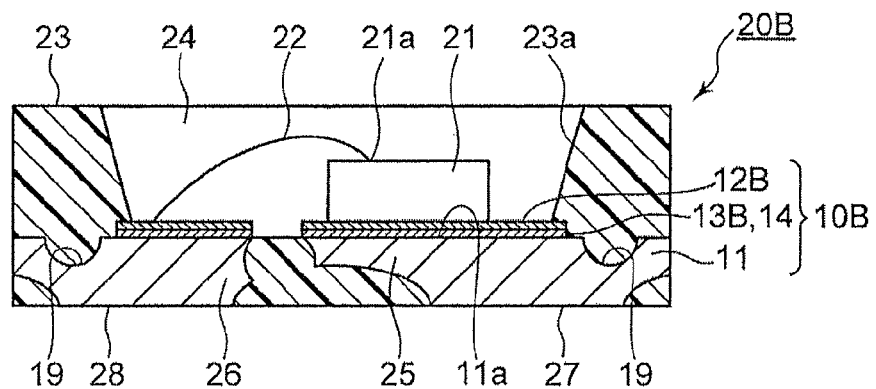
FIG. 32 is a cross sectional view (cross sectional view along line B-B in FIG. 33) showing the semiconductor device according to the third embodiment of the present invention.
Figure 33:
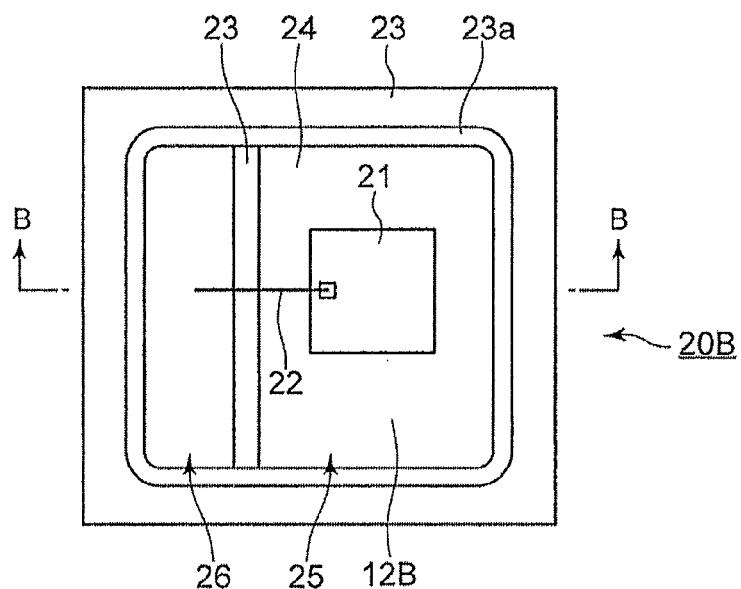
FIG. 33 is a plan view showing the semiconductor device according to the third embodiment of the present invention.
Figure 34:
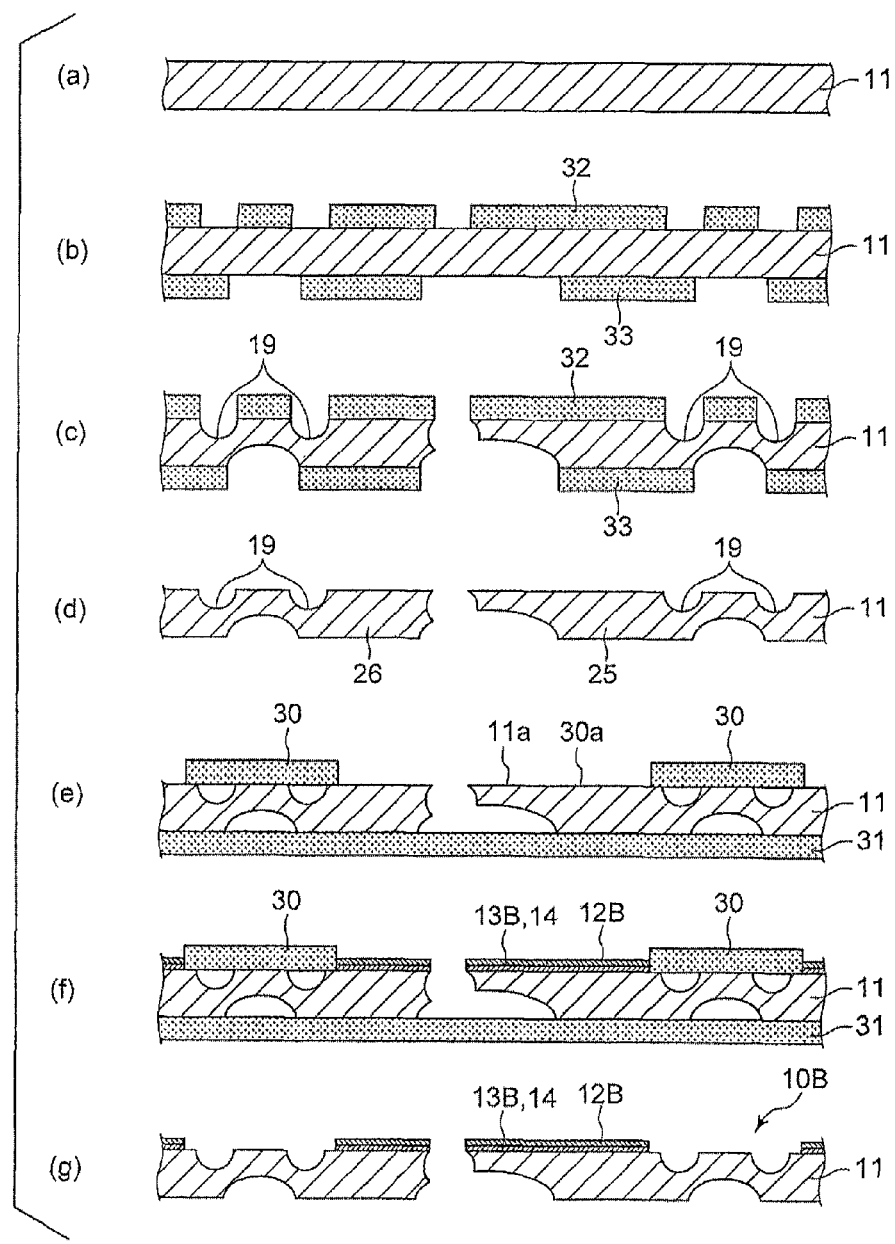
FIG. 34 is a diagram showing a method for manufacturing a leadframe according to the third embodiment of the present invention.
Figure 35:
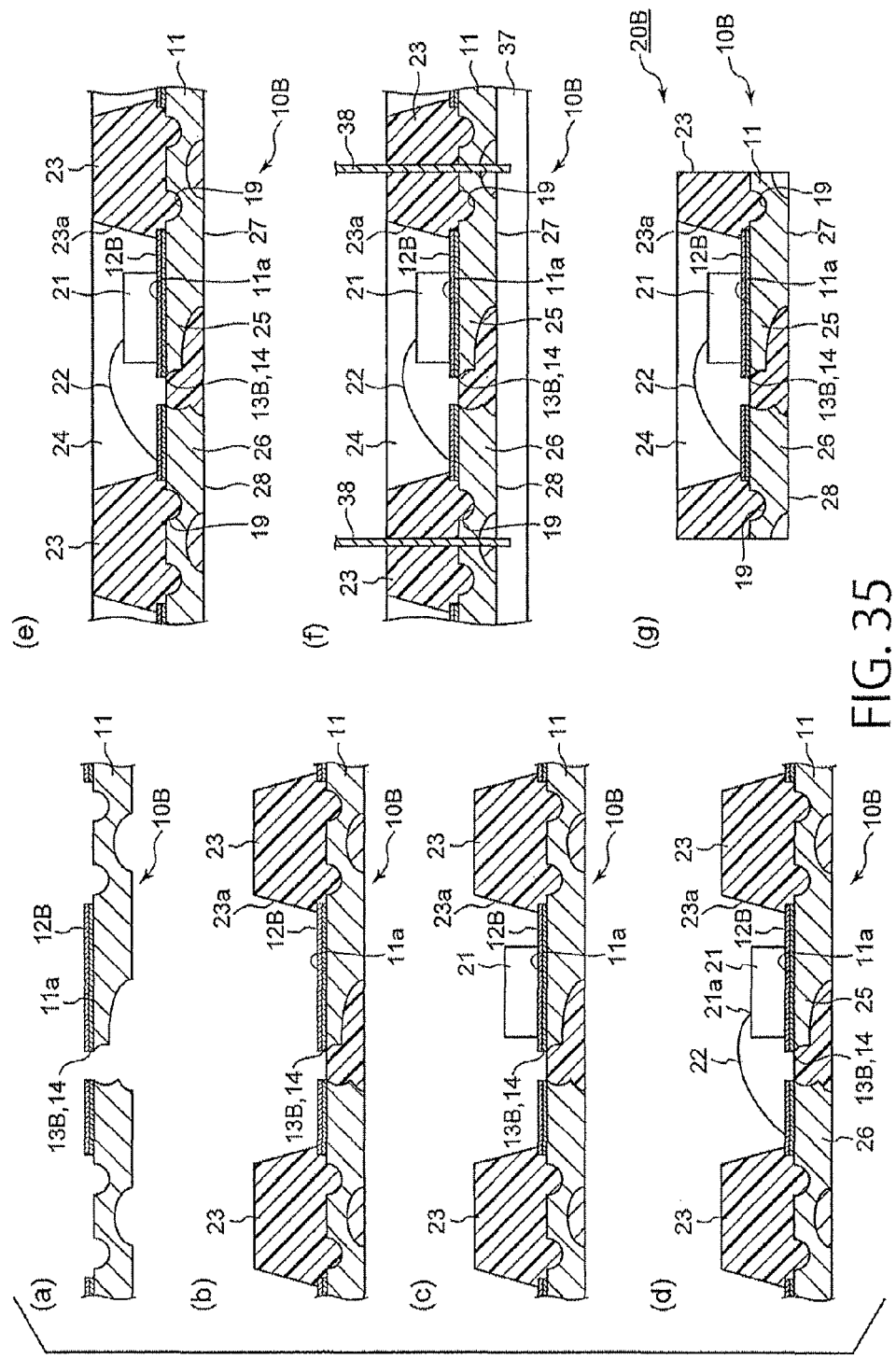
FIG. 35 is a diagram showing a method for manufacturing a semiconductor device according to the third embodiment of the present invention.

Then, a third embodiment of the semiconductor device using the LED leadframe or LED substrate shown in FIG. 30 is to be described with reference to FIG. 32 and FIG. 33. FIG. 32 and FIG. 33 are diagrams showing a semiconductor device (SON type) according to the third embodiment of the present invention.

As shown in FIG. 32 and FIG. 33, a semiconductor device 20B according to this embodiment has an LED leadframe 10B, an LED element 21 mounted over the mounting surface 11a of a main body portion 11 of a leadframe 10B, and a bonding wire (electroconductive portion) 22 electrically connecting the leadframe 10B and the LED element 21.

Further, an outer resin portion 23 having a concave portion 23a is disposed so as to surround the LED element 21. The outer resin portion 23 is integrated with the leadframe 10B. Further, the LED element 21 and the bonding wire 22 are encapsulated by a light permeable encapsulating resin portion 24. The encapsulating resin portion 24 is filled in a concave portion 23a of the outer resin portion 23.

The leadframe 10B has the main body portion 11 having a mounting surface 11a, an underlying plating layer 13B disposed on the main body portion 11, a silver plating layer 14 disposed on the underlying plating layer 13B, and an indium plating layer 12B disposed on the silver plating layer 14 and serving as a reflection layer for reflecting light from the LED element 21. Trenches 19 for enhancing the close bondability between the leadframe 10B and the outer resin portion 23 are formed in the surface (upper surface) of the leadframe 10B. Since the layer configuration of the leadframe 10B is identical with that described already with reference to FIG. 30, detailed description therefor is to be omitted. As the layer configuration of the leadframe 10B, one shown in FIG. 31 may also be used.

In addition, since the configuration for each of components to form the semiconductor device 20B is identical with those of the first embodiment and the second embodiment described above, portions identical with those of the first embodiment and the second embodiment described above carry the same reference numerals and detailed description therefor is to be omitted.

Method for Manufacturing LED Leadframe

Then, a method for manufacturing the LED leadframe 10B used in the semiconductor device 20B shown in FIG. 32 and FIG. 33 is to be described with reference to FIGS. 34(a) to (g). In the followings, description of the portions in common with those of the first embodiment and the second embodiment described above is partially omitted.

First, in the same manner as in the first embodiment and the second embodiment (FIGS. 4(a) to (d)) and FIGS. 19(a) to (d)), a main body portion 11 having a first portion 25 and a second portion 26 spaced from the first portion 25 is manufactured (FIGS. 34(a) to (d)).

Then, resist layers 30, 31 for plating each having a desired pattern are disposed on the surface and the rear face of the main body portion 11 (FIG. 34(e)), and electrolytic plating is applied to the main body portion 11 on the side of the surface covered with the resist layers 30, 31 for plating. Thus, a metal is deposited on the main body portion 11 to form an underlying plating layer 13B on the main body portion 11. When the underlying plating layer 13B comprises copper, a copper plating solution comprising copper cyanide and potassium cyanide as main ingredients can be used as the plating solution for electrolytic plating for forming the underlying plating layer 13B.

Successively, metal (silver) is deposited on the underlying plating layer 13B by electrolytic plating to form a silver plating layer 14 in the same manner. In this case, as the plating solution for electrolytic plating for forming the silver plating layer 14, a silver plating solution comprising silver cyanide and potassium cyanide as main ingredients can be used.

Further, metal (indium) is deposited on the silver plating layer 14 by electrolytic plating to form an indium plating layer 12B (FIG. 34(f)) in the same manner. As the plating solution for electrolytic plating for forming the indium plating layer 12B, a flash plating solution comprising an indium salt of an organic acid as a main ingredient can be used.

Then, by peeling the resist layers 30, 31 for plating, a leadframe 10B used for the semiconductor device 20B can be obtained (FIG. 34(g)).

In FIGS. 34(a) to (g), the main body portion 11 is fabricated into a predetermined shape by etching (FIGS. 34(a) to (d)), and then the underlying plating layer 13B, the silver plating layer 14, and the indium plating layer 12B are formed over the main body portion 11 (FIGS. 34(e) to (g)). However, this is not restrictive but the underlying plating layer 13B, the silver plating layer 14, and the indium plating layer 12B may be formed successively first over the main body portion 11 and then the main body portion 11 may be fabricated into the predetermined shape by etching.

Method for Manufacturing Semiconductor Device

Then, a method for manufacturing the semiconductor device 20B shown in FIG. 32 and FIG. 33 is to be described with reference to FIGS. 35(a) to (g). In FIGS. 35(a) to (g), portions identical with those of the first embodiment and the second embodiment described above carry the same reference numerals.

First, by the steps shown in FIGS. 34(a) to (g), a lead frame 10B is manufactured (FIG. 35(a)), and a thermoplastic resin or a thermosetting resin is injection molded or transfer molded to the leadframe 10B, to form an outer resin portion 23 (FIG. 35(b)).

Then, an LED element 21 is mounted over the mounting surface 11a of the main body portion 11 of the leadframe 10B. In this step, the LED element 21 is placed and fixed over the mounting surface 11a (on the indium plating layer 12B) of the main body portion 11 using a solder or a die bonding paste (die attaching step) (FIG. 35(c)).

Then, a terminal portion 21a of the LED element 21 and the surface of a second portion 26 of the main body portion 11 are electrically connected to each other by a bonding wire 22 (wire bonding step) (FIG. 35(d)).

Then, an encapsulating resin portion 24 is filled in the concave portion 23a in the outer resin portion 23 and the LED element 21 and the bonding wire 22 are encapsulated by the encapsulating resin portion 24 (FIG. 35(e)).

Then, the leadframe 10B is separated on every LED element 21 by dicing the outer resin portion 23 between each of LED elements 21 (FIG. 35(f)).

As described above, the semiconductor device 20B shown in FIG. 32 and FIG. 33 can be obtained (FIG. 35(g)).

Function and Effect of this Embodiment

Next, the function and the effect according this embodiment are to be described. In the semiconductor device 20B according to this embodiment, the indium plating layer 12B serving as a reflection layer is disposed over the side of the mounting surface 11a of the main body portion 11. Thus, even when a corrosive gas penetrates into the semiconductor device 20B after lapse of a predetermined time from the manufacture of the semiconductor device 20B, the reflection layer (indium plating layer 12B) is less discolored or corroded, and the reflectance is not lowered in the same manner as in the first embodiment and the second embodiment described above.

Further, according to this embodiment, since the indium plating layer 12B has high reflection characteristics, light from the LED element 21 can be reflected at a high efficiency.

Further, according to this embodiment, the indium plating layer 12B comprises an extremely thin film (0.005 μm to 0.2 μm) as described above. Accordingly, the indium plating layer 12B is fractured partially by the energy applied during die attachment or wire bonding. Accordingly, there can be obtained a pull strength substantially identical with that when die attaching or wire bonding is performed directly on the silver plating.

Modified Embodiment

Each of modified embodiments of the semiconductor device according to this embodiment is to be described with reference to FIG. 36 to FIG. 43. In FIG. 36 to FIG. 43, portions identical with those of the embodiments shown in FIG. 6 to FIG. 11 and FIG. 21 to FIG. 28 carry the same reference numerals and detailed description therefor is to be omitted.

In each of the modified embodiments shown in FIG. 36 to FIG. 43, a silver plating layer 14 is disposed over the side of a mounting surface 11a of a main body portion 11, and an indium plating layer 12B serving as a reflection layer for reflecting light from an LED element 21 is disposed over the silver plating layer 14 in the same manner as in the embodiment shown in FIG. 32 and FIG. 33.

Figure 36:
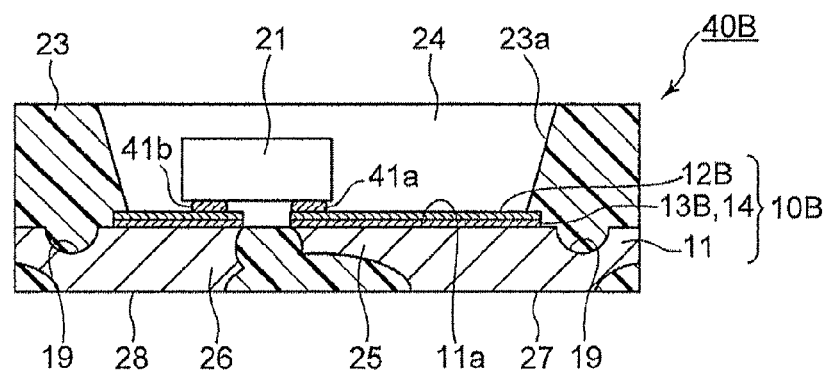
FIG. 36 is a cross sectional view showing a modified example of the semiconductor device according to the third embodiment of the present invention.

FIG. 36 is a cross sectional view showing a modified embodiment (SON type) of a semiconductor device according to this embodiment. A semiconductor device 40B shown in FIG. 36 is different in the configurations for each of the layers disposed over the mounting surface 11a of the main body portion 11, and other configurations are substantially identical with the configurations of the semiconductor device 40 shown in FIG. 6 and the semiconductor device 40A shown in FIG. 21 described above.

Figure 37:
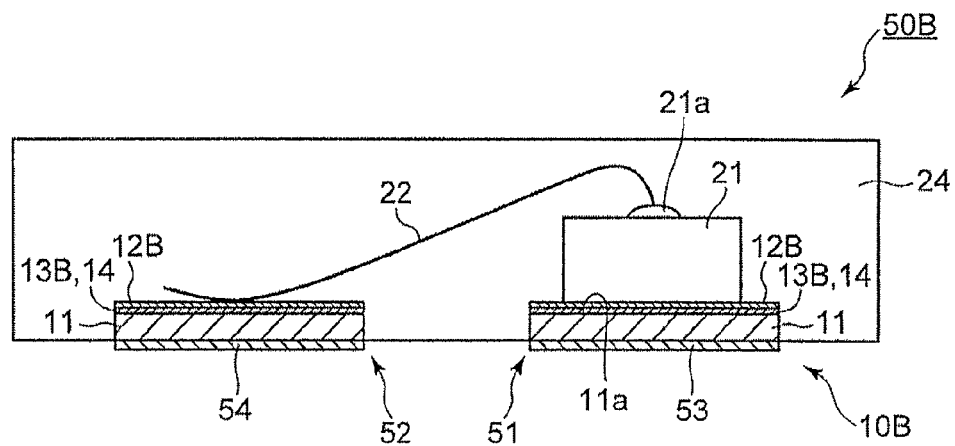
FIG. 37 is a cross sectional view showing a modified example of the semiconductor device according to the third embodiment of the present invention.

FIG. 37 is a cross sectional view showing a modified embodiment (LGA type) of a semiconductor device according to this embodiment. A semiconductor device 50B shown in FIG. 37 is different in the configurations for each of the layers disposed over the mounting surface 11a of the main body portion 11, and other configurations are substantially identical with the configurations of the semiconductor device 50 shown in FIG. 7 and the semiconductor device 50A shown in FIG. 22 described above.

Figure 38:
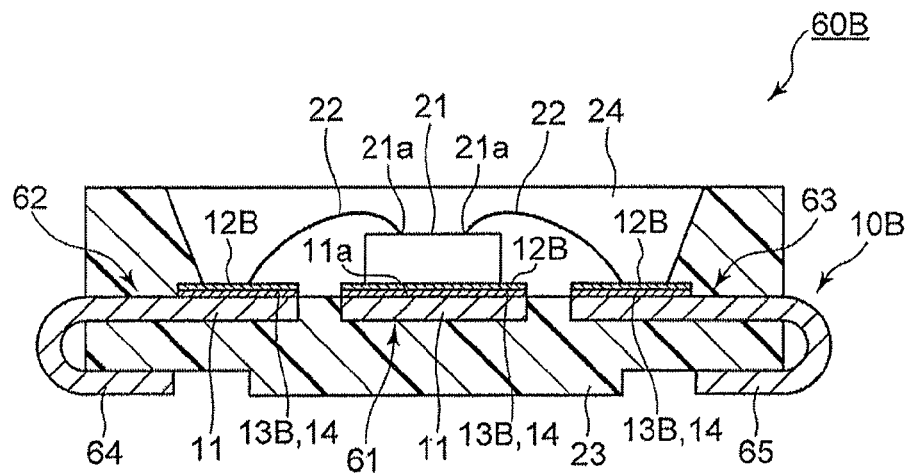
FIG. 38 is a cross sectional view showing a modified example of the semiconductor device according to the third embodiment of the present invention.

FIG. 38 is a cross sectional view showing a modified embodiment (PLCC type) of a semiconductor device according to this embodiment. A semiconductor device 60B shown in FIG. 38 is different in the configurations for each of the layers disposed over the mounting surface 11a of the main body portion 11 and other configurations are substantially identical with the configurations of the semiconductor device 60 shown in FIG. 8 and the semiconductor device 60A shown in FIG. 23 described above.

Figure 39:
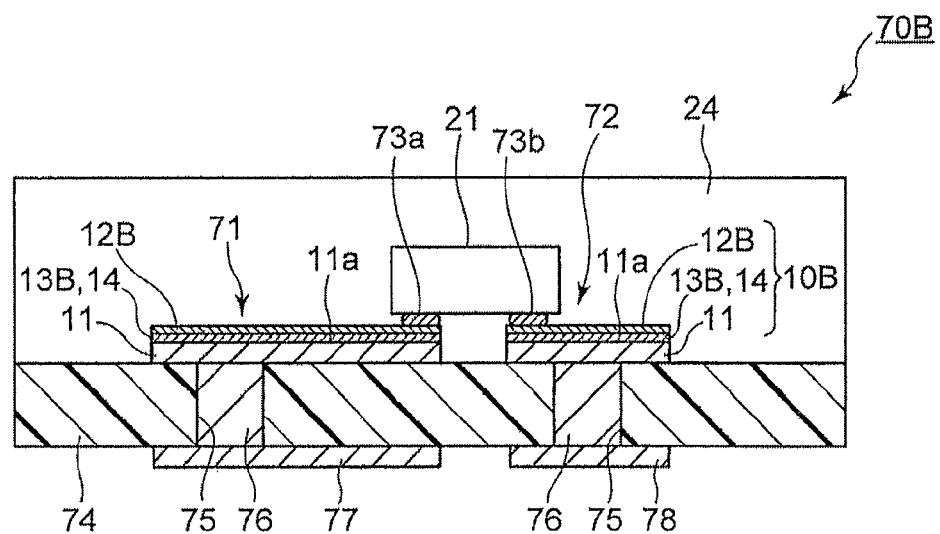
FIG. 39 is a cross sectional view showing a modified example of the semiconductor device according to the third embodiment of the present invention.

FIG. 39 is a cross sectional view showing a modified embodiment (substrate type) of a semiconductor device according to this embodiment. A semiconductor device 70B shown in FIG. 39 is different in the configurations for each of the layers disposed over the mounting surface 11a of the main body portion 11 and other configurations are substantially identical with the configurations of the semiconductor device 70 shown in FIG. 9 and the semiconductor device 70A shown in FIG. 24 described above.

Figure 40:
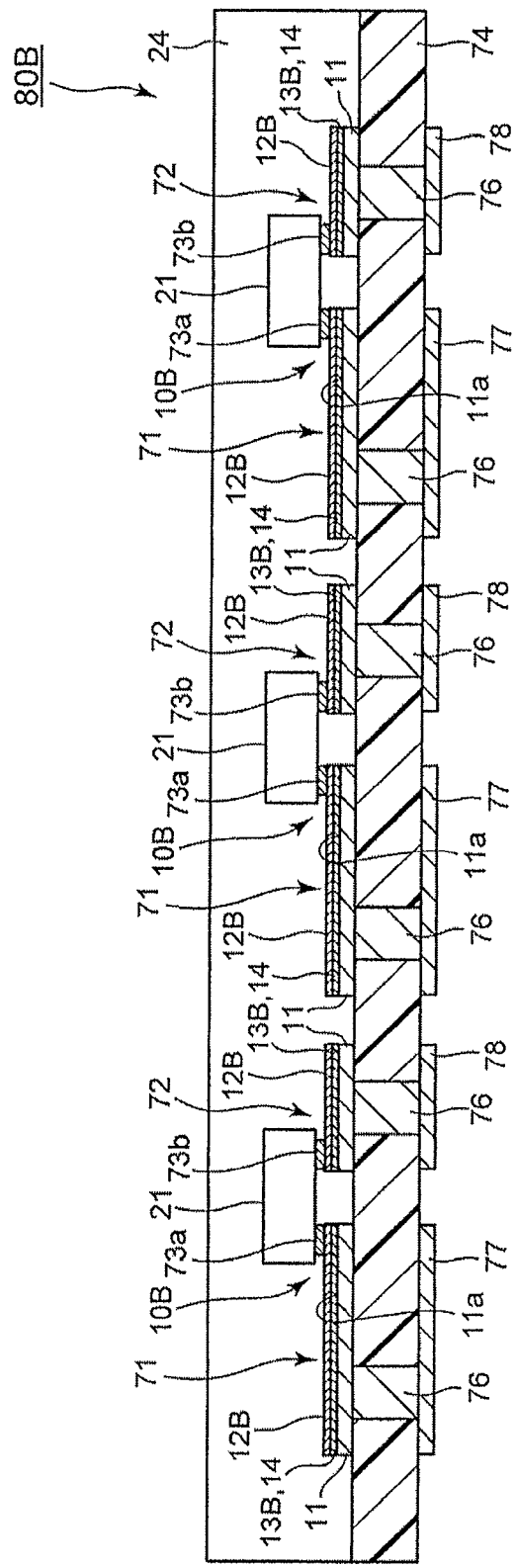
FIG. 40 is a cross sectional view showing a modified example of the semiconductor device according to the third embodiment of the present invention.

FIG. 40 is a cross sectional view showing a modified embodiment (module type) of a semiconductor device according to this embodiment. A semiconductor device 80B shown in FIG. 40 is different in the configurations for each of the layers disposed over the mounting surface 11a of the main body portion 11, and other configurations are substantially identical with the configurations of the semiconductor device 80 shown in FIG. 10 and the semiconductor 80A shown in FIG. 25 described above.

Figure 41:
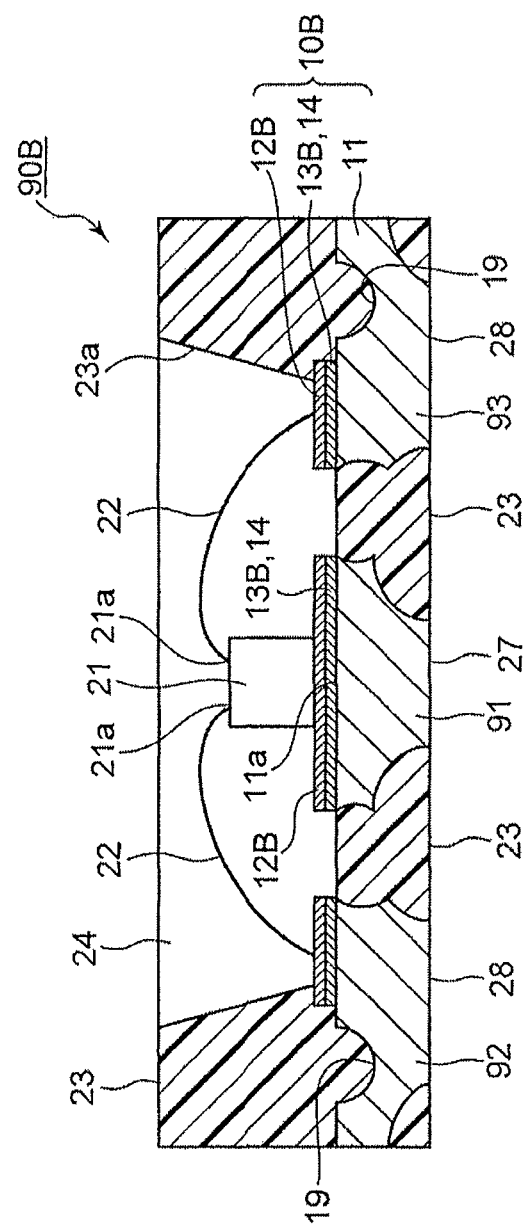
FIG. 41 is a cross sectional view showing a modified example of the semiconductor device according to the third embodiment of the present invention.

FIG. 41 is a cross sectional view showing a modified embodiment (SON type) of a semiconductor device according to this embodiment. A semiconductor device 90B shown in FIG. 41 is different in the configurations for each of the layers disposed over the mounting surface 11a of the main body portion 11 and other configurations are substantially identical with the configurations of the semiconductor device 90 shown in FIG. 11 and the semiconductor device 90A shown in FIG. 26 described above.

Figure 42:
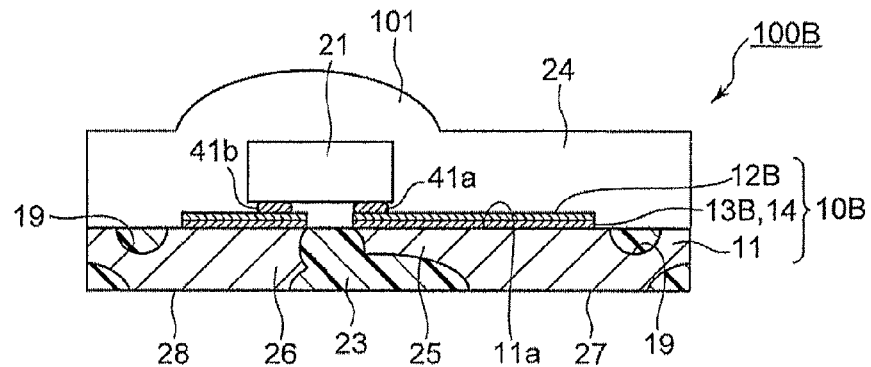
FIG. 42 is a cross sectional view showing a modified example of the semiconductor device according to the third embodiment of the present invention.

FIG. 42 is a cross sectional view showing a modified embodiment (collectively molded type with lens) of a semiconductor device according to this embodiment. A semiconductor device 100B shown in FIG. 42 is different in the configurations for each of the layers disposed over the mounting surface 11a of the main body portion 11, and other configurations are substantially identical with those of the semiconductor device 100A shown in FIG. 27 described above.

Figure 43:
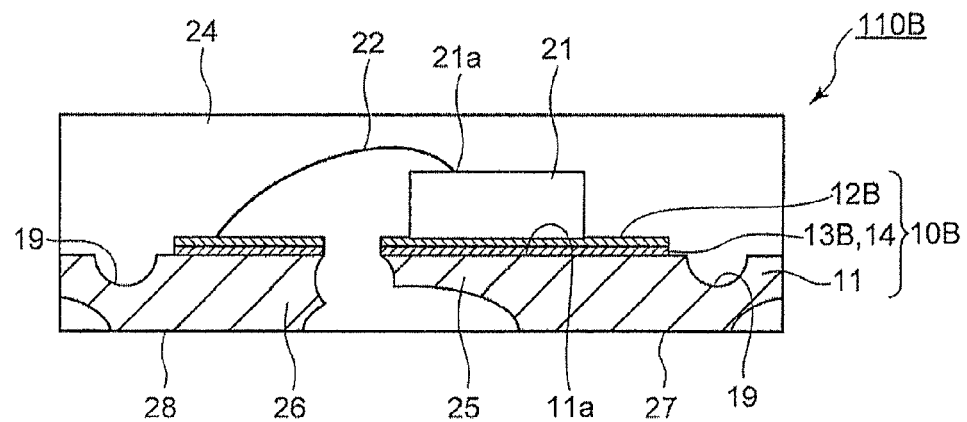
FIG. 43 is a cross sectional view showing a modified example of the semiconductor device according to the third embodiment of the present invention.

FIG. 43 is a cross sectional view showing a modified embodiment (collectively molded type) of a semiconductor device according to this embodiment. A semiconductor device 110B shown in FIG. 43 is different in the configurations for each of the layers disposed over the mounting surface 11a of the main body portion 11, and other configurations are substantially identical with those of the semiconductor device 110A shown in FIG. 28 described above.

Also in the semiconductor devices 40B, 50B, 60B, 70B, 80B, 90B, 100B, and 110B (FIG. 36 to FIG. 43) according to each of the modified embodiments of this preferred embodiment described above, substantially identical function and effect with those of the semiconductor device 20B shown in FIG. 32 and FIG. 33 can be obtained.

Example

Then, specific examples of the LED leadframe or LED substrate according to this embodiment are to be described with reference to FIG. 44 to FIG. 46.

Example 3-1

First, nickel plating was applied as an underlying plating layer 13B on a main body portion 11 comprising a rectangular copper plate. Then, a bright silver plating layer 14 was formed on the underlying plating layer 13B by electrolytic plating. Then, an indium plating layer 12B was formed on the silver plating layer 14 by electrolytic plating (flash plating) to manufacture a substrate 10B (Example 3-1).

Comparative Example 3-1

Nickel plating was applied as an underlying plating layer on a rectangular copper plate and then a silver plating layer was formed on the underlying plating layer to manufacture a substrate (Comparative Example 3-1). In this case, the silver plating layer serves as a reflection layer for reflecting light from the LED element.

Then, glossiness at the surface of the two substrates (Example 3-1 and Comparative Example 3-1) was measured. For the measurement of the glossiness, a microsurface photospectrometer (VSR 300, manufactured by NIPPON DENSHOKU INDUSTRIES CO. LTD.) was used. As a result, the glossiness was 1.33 for the substrate 10B according to Example 3-1. On the other hand, the glossiness of the substrate according to Comparative Example 3-1 was 1.28. As a result, the values of the glossiness of the two substrates (Example 3-1 and Comparative Example 3-1) were sufficient to be used for the reflection layer for reflecting light from the LED element.

Successively, a corrosion resistant test was carried out on the two types of the substrates (Example 3-1 and Comparative Example 3-1) described above. Specifically, the substrates were directly left in a gas mixture containing $SO_2$ (10 ppm) and $H_2S$ (3 ppm) respectively. Meanwhile, the temperature was kept at 40° C. and the humidity was kept at 75% Rh at the periphery of the substrate. Then, the surface state of the substrates after 2 hours, 5 hours, and 10 hours from the start of leaving was visually observed and the superiority or the inferiority thereof was investigated in comparison (FIG. 44).

As a result, the substrate of Comparative Example 3-1 already started discoloration after 2 hours and was discolored completely after 10 hours. On the contrary, the substrates 10B of Example 3-1 showed no substantial discoloration even after lapse of 10 hours. In view of the above, it was found that the indium plating layer 12B disposed on the silver plating 14 of the substrate 10B had a high corrosion resistance.

Then, three types of substrates (Example 3-A, Example 3-B, and Comparative Example 3-A) shown below were manufactured.

Example 3-A

An underlying plating layer 13B comprising nickel plating (0.1 μm thickness) was formed on a main body portion 11 comprising a copper plate, and a silver plating layer 14 (3 μm thickness) was applied on the underlying plating layer 13B. Then, a indium plating layer 12B (about 50 nm thickness) was formed on the silver plating layer 14 by electrolytic plating (flash plating) to manufacture a substrate 10B (Example 3-A).

Example 3-B

A substrate 10B was prepared in the same manner as in Example 3-A except that the thickness of the indium plating layer 12B was about 10 nm (Example 3-B).

Comparative 3-A

A copper plating layer (0.1 μm thickness) was formed on a main body portion 11 comprising a copper plate, and a silver plating layer (3 μm thickness) was formed on the copper plating layer to manufacture a substrate (Comparative Example 3-A). The substrate (Comparative Example 3-A) is identical with the substrate according to Comparative Example 1-A described above.

<Initial Reflectance>

The reflectance (initial reflectance) at the surface of the three types of the substrates (Example 3-A, Example 3-B, and Comparative Example 3-A) was measured.

<Reflectance after Solution Test>

Further, for investigating the sulfurization resistance of the three types of the substrates (Example 3-A, Example 3-B, and Comparative Example 3-A), a solution test was carried out on each of the substrates and the reflectance after the solution test was measured.

<Reflectance after Gas Test>

Further, for investigating the sulfurization resistance of the three types of the substrates (Example 3-A, Example 3-B, and Comparative Example 3-A), a gas test was carried out for each of the substrates and the reflectance after the solution test was measured.

Measuring methods for the initial reflectance, the reflectance after the solution test, and the reflectance after the gas test were identical with those in the case of the first embodiment described above (Example 1-A, Example 1-B, and Comparative example 1-A).

Figure 45:
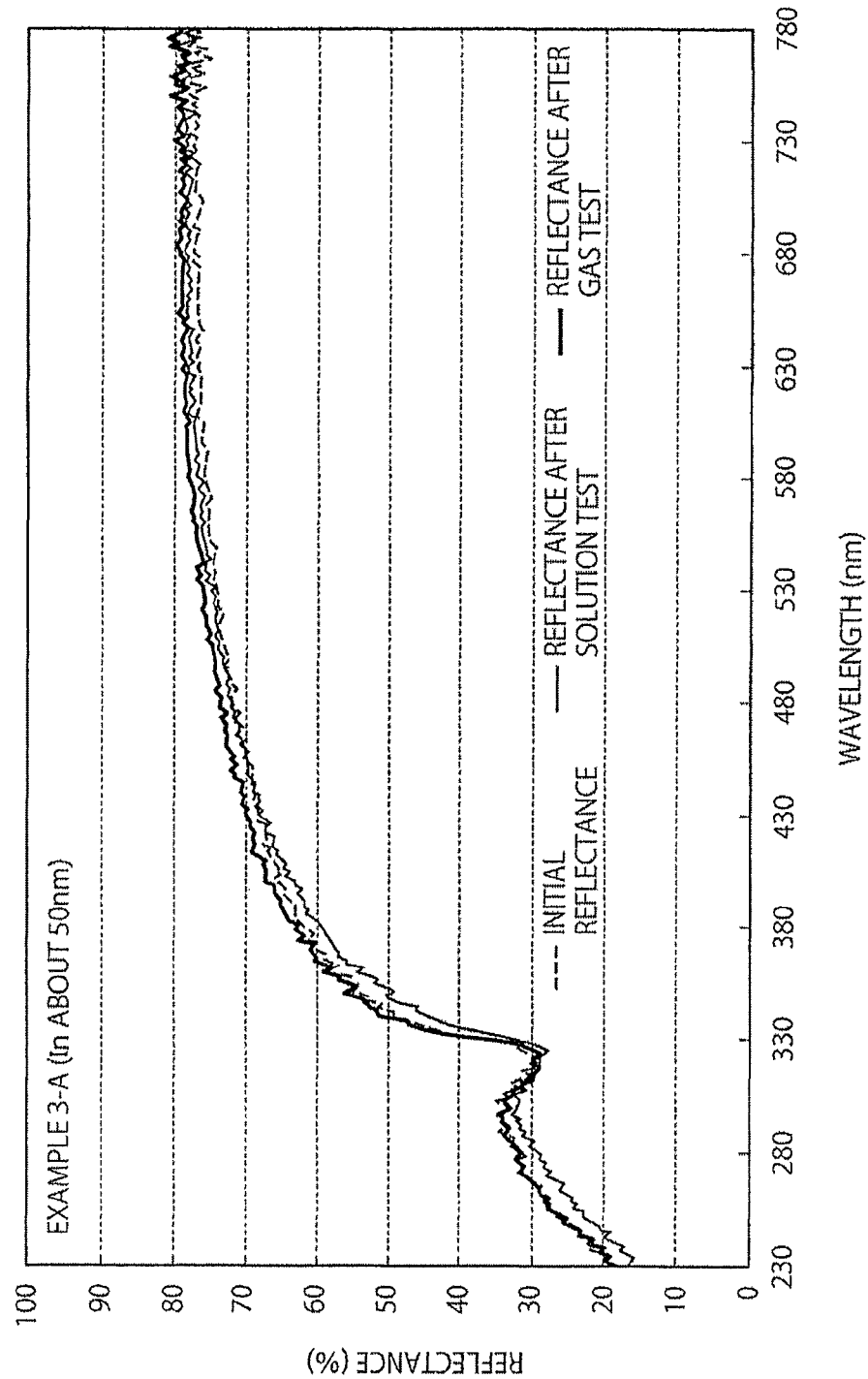
FIG. 45 is a graph showing the change of reflectance in Example 3-A.
Figure 46:
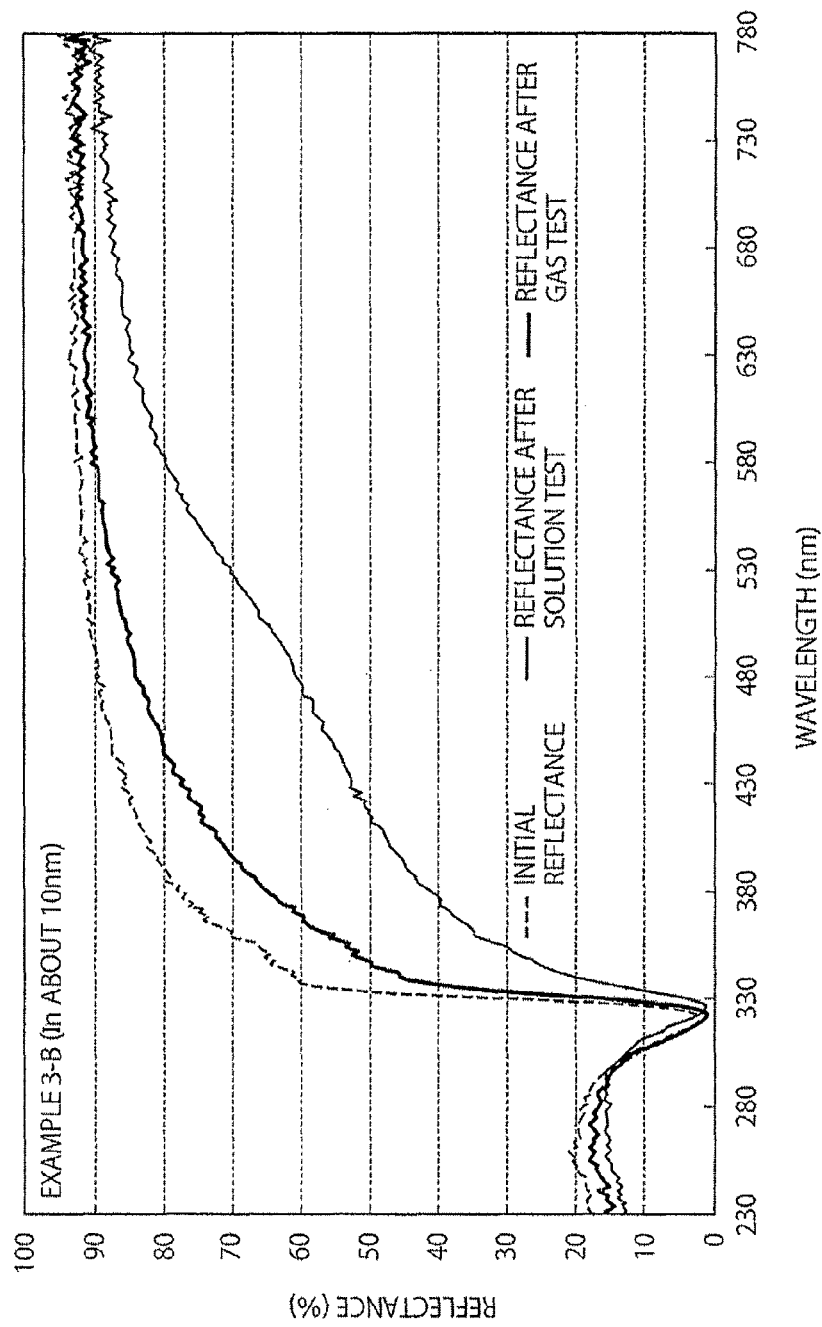
FIG. 46 is a graph showing the change of reflectance in Example 3-B.

The results are shown in FIG. 45, FIG. 46, and FIG. 13. FIG. 45, FIG. 46, and FIG. 13 are graphs showing the initial reflectance, the reflectance after the solution test, and the reflectance after the gas test on Example 3-A, Example 3-B, and Comparative Example 3-A respectively (Comparative Example 3-A shown in FIG. 13 was identical with the case of Comparative Example 1-A).

As a result, it was found that, for the substrate of Example 3-A (In at about 50 nm), the initial reflectance is high and satisfactory for the reflectance in a ultraviolet region compared with Comparative Example 1-A (silver), that both of the reflectance after the solution test and the reflectance after the gas test were changed scarcely from the initial reflectance over the entire ultraviolet and visible regions, and that the indium plating layer 12B had less possibility of undergoing corrosion by a corrosive gas such as a hydrogen sulfide gas.

In the substrate of Example 3-B (In at about 10 nm), the initial reflectance was equivalent to that of Comparative Example 1-A (silver), and was satisfactory in the entire visible region. In addition, the reflectance after the gas test showed less lowering from the initial reflectance in the entire ultraviolet and visible regions. On the other hand, for the reflectance after the solution test, the reflectance lowered only slightly in a long wavelength region. In addition, although it showed some lowering from the initial reflectance in the blue region, values were also with no problem.

The substrate of Comparative Example 3-A (silver) (Comparative Example 1-A (silver)) showed significant lowering from the initial reflectance both in the reflectance after the solution test and the reflectance after the gas test and it can be said that the silver plating layer may possibly suffer from corrosion by a corrosive gas such as a hydrogen sulfide gas.

<Continuity of Wire Bonding (W/B)>

It was investigated whether wire bonding can be performed continuously or not on the surface of the three types of the substrates (Example 3-A, Example 3-B, and Comparative Example 3-A) described above.

<Wire Bonding (W/B) Strength>

Wire pull strength was investigated when wire bonding was performed on the surface of the three types of the substrates (Example 3-A, Example 3-B, and Comparative Example 3-A) described above.

<Solder Wettability>

Solder wettability of the three types of the substrates (Example 3-A, Example 3-B, and Comparative Example 3-A) was investigated.

Measuring methods for the continuity of wire bonding (W/B), the strength of wire bonding (W/B), and the solder wettability are identical with those in the case of the first embodiment described above (Example 1-A, Example 1-B, and Comparative Example 1-A).

As a result, the substrates according to Example 3-B and Comparative Example 3-A among the three type of the substrates (Example 3-A, Example 3-B, and Comparative Example 3-A) were satisfactory in all of the continuity of wire bonding (W/B), the wire bonding (W/B) strength, and the solder wettability. While the continuity of the wire bonding (W/B), the wire bonding (W/B) strength, and the solder wettability were lowered in the substrate according to Example 3-A compared with the substrate according to Example 3-B, they were at the levels with no problem depending on the portion to be used. The results are collectively shown in Table 2.

TABLE 2

| Composition of corrosion resistant plating | Initial reflectance (wavelength 400 to 460 nm) | Evaluation for sulfurization resistance (wavelength 460 nm) | | W/B evaluation | | Solder wettability Zero cross |
|---|---|---|---|---|---|---|
| | | Reflectance after solution test (U-5) | Reflectance after gas test (1H) | Continuity | Strength | |
| Example 3-A (In: about 50 nm) | 65 to 70% | 70% | 72% | Δ (Fair) | 3.2 g | 4.9 sec |
| Example 3-B (In: about 10 nm) | 82 to 88% | 57% | 81% | ◉ (Excellent) | 6.7 g | 1.0 sec |
| Comparative Example 3-A (silver) | 85 to 92% | 22% | 36% | ◉ (Excellent) | 7.0 g | 0.9 sec |

Fourth Embodiment

Then, a fourth embodiment of the present invention is to be described with reference to FIG. 47 to FIG. 60.

Configuration of LED Leadframe or LED Substrate

Figure 47:
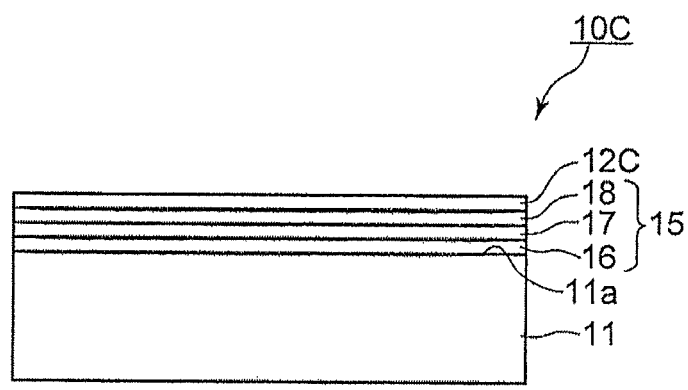
FIG. 47 is a cross sectional view showing a leadframe or substrate according to a fourth embodiment of the present invention.
Figure 48:
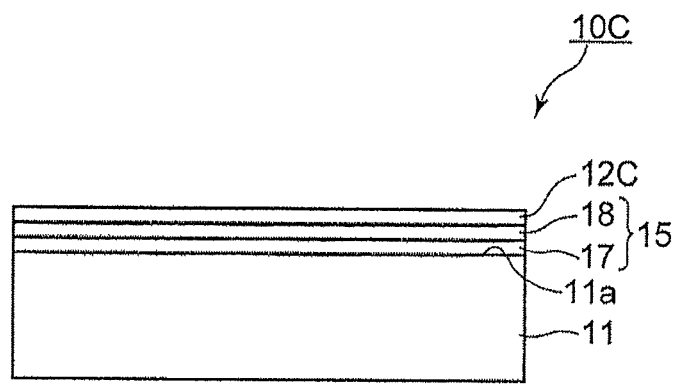
FIG. 48 is a cross sectional view showing a modified example of a leadframe or substrate according to the fourth embodiment of the present invention.

First, the outline of an LED leadframe or LED substrate is to be described with reference to FIG. 47 and FIG. 48. In FIG. 47 and FIG. 48, for the explanation of the layer configuration of the LED leadframe or LED substrate, a cross section of the LED leadframe or LED substrate is shown as a rectangular shape for the sake of convenience.

As shown in FIG. 47, an LED leadframe or LED substrate 10C (hereinafter also referred to as a leadframe 10C or a substrate 10C) is used for mounting an LED element 21 (to be described later). The LED leadframe or LED substrate 10C has a main body portion 11 having a mounting surface 11a for mounting the LED element 21, and a reflection metal layer 12C disposed over the main body portion 11 on the side of the mounting surface 11a.

Among them, the main body portion 11 comprises a metal plate. Examples of the material for the metal plate forming the main body portion 11 include copper, copper alloy, 42 alloy (Ni 41% Fe alloy), etc. The thickness of the main body portion 11 is preferably 0.05 mm to 0.5 mm in a case of a leadframe 10C and 0.005 mm to 0.03 mm in a case of a substrate 10C although depending on the configuration of the semiconductor device.

The reflection metal layer 12C serves as a reflection layer for reflecting light from the LED element 21 and is situated at the uppermost surface of the LED leadframe or LED substrate 10C. The reflection metal layer 12C comprises an alloy of platinum (Pt) and silver (Ag) or an alloy of gold (Au) and silver (Ag), has a high reflectance to a visible light, and has a high corrosion resistance to oxygen and a hydrogen sulfide gas.

When the reflection metal layer 12C comprises the alloy of platinum (Pt) and silver (Ag), the alloy preferably has a composition containing 10 to 40% by weight of platinum and the balance being silver (Ag) and an inevitable impurity and, more preferably, has a composition particularly containing 20% by weight of platinum and the balance being silver and an inevitable impurity.

On the other hand, when the reflection metal layer 12C comprises the alloy of gold (Au) and silver (Ag), the alloy preferably has a composition containing 5 to 50% by weight of gold and the balance being silver and an inevitable impurity and, more preferably, has a composition particularly containing 20% by weight of gold and the balance being silver and an inevitable impurity.

The thickness of the reflection metal layer 12C is extremely thin and, specifically, it is preferably from 0.005 µm to 0.2 µm.

Further, an intermediate layer 15 is disposed between the main body portion 11 and the reflection metal layer 12C. The intermediate layer 15 has a copper layer 16 (Cu), a nickel layer 17 (Ni), and a gold layer 18 (Au) disposed successively from the side of the main body portion 11.

Among them, the copper layer 16 is used as an underlying layer for the nickel layer 17 and has a function of enhancing the bondability between the nickel layer 17 and the main body portion 11. The copper layer 16 can be formed, for example, by electrolytic plating. The thickness of the copper layer 16 is preferably 0.005 µm to 0.8 µm.

Further, the nickel layer 17 is formed on the copper layer 16 by using, for example, an electrolytic plating method, and has a thickness, for example, of 0.5 µm to 1 µm.

Further, the gold layer 18 is formed on the nickel layer 17 by using, for example, an electrolytic plating method, comprises an extremely thin layer, and has a thickness, for example, of 0.002 µm to 1 µm.

Further, as shown in FIG. 48, it is also possible that the copper layer 16 is not provided. In this case, the intermediate layer 15 has a nickel layer 17 disposed on the main body portion 11 and a gold layer 18 disposed on the nickel layer 17.

Configuration of Semiconductor Device

Figure 49:
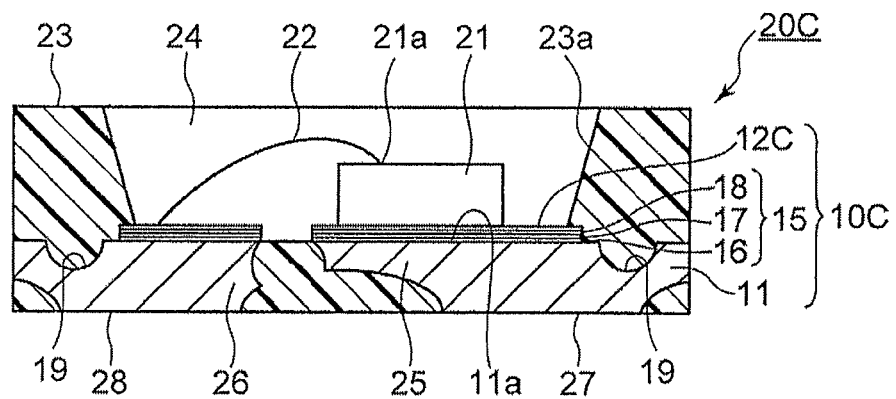
FIG. 49 is a cross sectional view (cross sectional view along line C-C in FIG. 50) showing the semiconductor device according to the fourth embodiment of the present invention.
Figure 50:
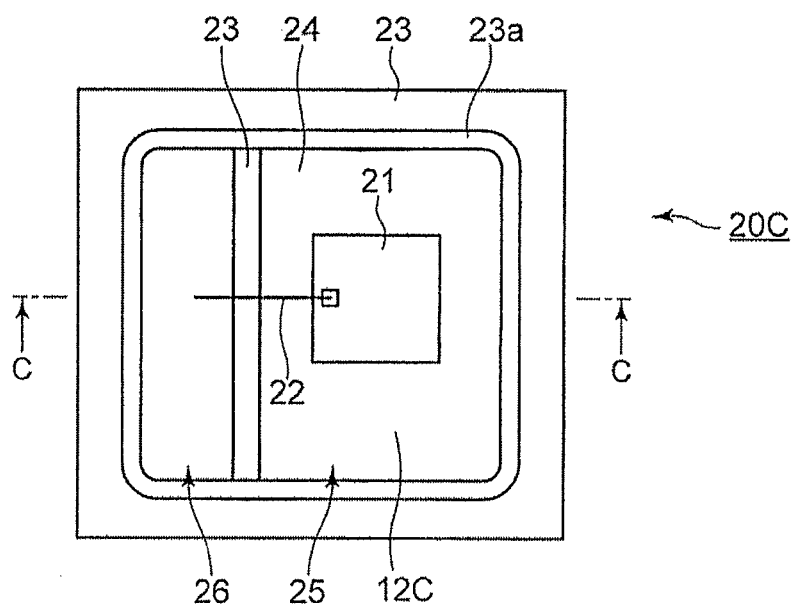
FIG. 50 is a plan view showing the semiconductor device according to the fourth embodiment of the present invention.
Figure 51:
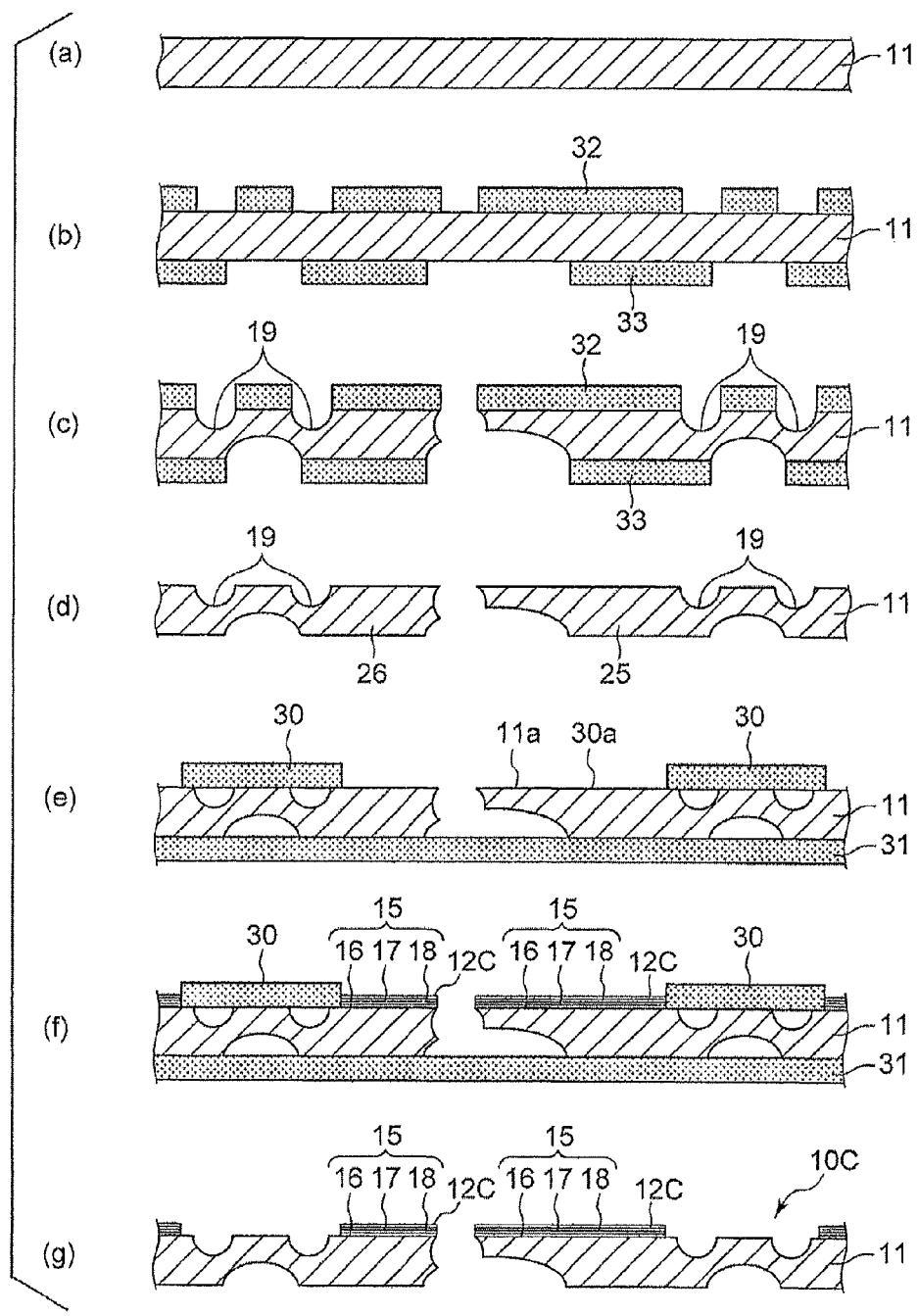
FIG. 51 is a diagram showing a method for manufacturing a leadframe according to the fourth embodiment of the present invention.
Figure 52:
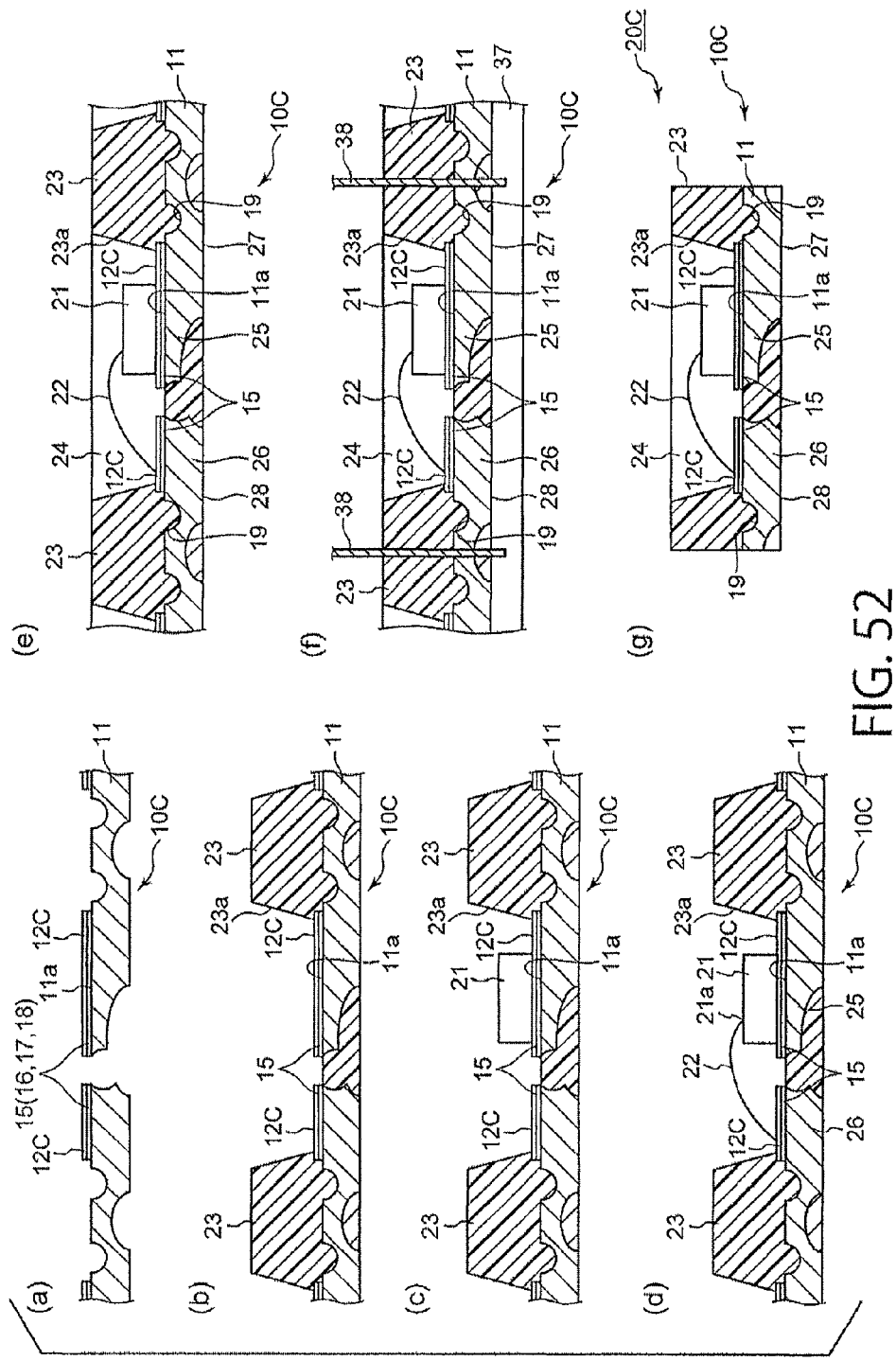
FIG. 52 is a diagram showing a method for manufacturing a semiconductor device according to the fourth embodiment of the present invention.

Then, a fourth embodiment of the semiconductor device using the LED leadframe or LED substrate shown in FIG. 49 and FIG. 50 is to be described. FIG. 49 is a sectional view showing a semiconductor device (SON type) according to the fourth embodiment of the present invention, and FIG. 50 is a plan view showing a semiconductor device according to the fourth embodiment of the present invention.

As shown in FIG. 49 and FIG. 50, a semiconductor device 20C has an LED leadframe 10C, an LED element 21 mounted over the mounting surface 11a of a main body portion 11 of a leadframe 10C, and a bonding wire (electroconductive portion) 22 electrically connecting the leadframe 10C and the LED element 21.

Further, an outer resin portion 23 having a concave portion 23a is disposed so as to surround the LED element 21. The outer resin portion 23 is integrated with the leadframe 10C. Further, the LED element 21 and the bonding wire 22 are encapsulated by a light permeable encapsulating resin portion 24. The encapsulating resin portion 24 is filled in a concave portion 23a of the outer resin portion 23.

The leadframe 10 has a main body portion 11 having a mounting surface 11a, an intermediate layer 15 disposed on the main body portion 11, and a reflection metal layer 12C disposed on the intermediate layer 15 and serving as a reflection layer for reflecting light from the LED element 21. The intermediate layer 15 includes the copper layer 16, the nickel layer 17, and the gold layer 18 in order from the side of the main body portion 11. Trenches 19 for enhancing the close bondability between the leadframe 10C and the outer resin portion 23 are formed in the surface (upper surface) of the leadframe 10C. Since the layer configuration of the leadframe 10C is identical with the configuration described already with reference to FIG. 47, detailed description therefor is to be omitted. As the layer configuration of the leadframe 10C, that shown in FIG. 48 may also be used.

In addition, since the configurations for each of components to form the semiconductor device 20C are identical with those of the first embodiment to the third embodiment described above, portions identical with those of the first embodiment to the third embodiment described above carry the same reference numerals and a detailed description therefor is to be omitted.

Method for Manufacturing LED Leadframe

Then, a method for manufacturing the LED leadframe 10C used in the semiconductor device 20C shown in FIG. 49 and FIG. 50 is to be described with reference to FIGS. 51(a) to (g). In the followings, description for the portions in common with those of the first embodiment to the third embodiment described above is partially omitted.

First, in the same manner as in the first embodiment to the third embodiment (FIGS. 4(a) to (d), FIGS. 19(a) to (d) and FIGS. 34(a) to (d)), a main body portion 11 having a first portion 25 and a second portion 26 spaced from the first portion 25 is prepared (FIGS. 51(a) to (d)).

Then, resist layers 30, 31 for plating each having a desired pattern are disposed on the surface and the rear face of the main body portion 11 (FIG. 51(e)). Among them, the resist layer 30 for plating on the side of the surface is formed with an opening portion 30a at a position corresponding to a portion for forming the reflection metal layer 12C, and the mounting surface 11a of the main body portion 11 is exposed through the opening portion 30a. On the other hand, the resist layer 31 for plating on the rear face covers the entire rear face of the main body portion 11.

Then, an intermediate layer 15 and a reflection metal layer 12C are formed on the surface side of the main body portion 11 (FIG. 51(f)).

In this step, electrolytic plating is first applied on the surface side of the main body portion 11 covered with the resist layers 30, 31 for plating. Thus, a metal (copper) is deposited on the main body portion 11 to form a copper layer 16 on the main body portion 11. As the plating solution for electrolytic plating forming the copper layer 16, a copper plating solution comprising copper cyanide and potassium cyanide as main ingredients can be used.

Successively, a metal (nickel) is deposited on the copper layer 16 by electrolytic plating to form a nickel layer 17 in the same manner. As the plating solution for electrolytic plating for forming the nickel layer 17, a plating solution of nickel sulfamate at a high nickel concentration can be used.

Then, a metal (gold) is deposited on the nickel layer 17 by electrolytic plating to form a gold layer 18. As a plating solution for electrolytic plating for forming the gold layer 18, a gold plating solution comprising gold cyanide and potassium cyanide as main ingredients can be used.

The intermediate layer 15 is formed of the copper layer 16, the nickel layer 17, and the cold layer 18.

Further, a metal is deposited on the gold layer 18 of the intermediate layer 15 to form a reflection metal layer 12C (FIG. 51(f)).

As described above, the reflection metal layer 12C comprises the alloy of platinum (Pt) and silver (Ag) or the alloy of gold (Au) and silver (Ag). When the reflection metal layer 12C comprises the alloy of platinum and silver, the reflection metal layer 12C can be formed by sputtering, ion plating, or vapor deposition of the alloy.

On the other hand, when the reflection metal layer 12C comprises the alloy of gold and silver, the reflection metal layer 12C can be formed by electrolytic plating in addition to sputtering, ion plating, and vapor deposition of the alloy. In this case, as the plating solution for electrolytic plating, a silver plating solution comprising silver cyanide, gold cyanide, and potassium cyanide as main ingredients can be used.

Then, by peeling the resist layers 30, 31 for plating, the leadframe 10C used for the semiconductor device 20C shown in FIG. 49 and FIG. 50 can be obtained (FIG. 51(g)).

In FIGS. 51(a) to (g), after the main body portion 11 is fabricated into a predetermined shape by etching (FIGS. 51(a) to (d)), the copper layer 16, the nickel layer 17, the gold layer 18, and the reflection metal layer 12C are formed over the main body portion 11 (FIGS. 51(a) to (g)). However, this is not restrictive but the copper layer 16, the nickel layer 17, the gold layer 18, and the reflection plating layer 12C may be formed first over the main body portion 11 and then the main body portion 11 may be fabricated into the predetermined shape.

Alternatively, after the main body portion 11 is fabricated into a predetermined shape by etching in the steps of FIGS. 51(a) to (d), each of the layers of the copper layer 16, the nickel layer 17, the gold layer 18, and the reflection metal layer 12C may be formed successively over the entire surface of the main body portion by plating instead of the partial plating step in FIGS. 51(e) to (g).

Method for Manufacturing Semiconductor Device

Then, a method for manufacturing the semiconductor device 20C shown in FIG. 49 and FIG. 50 is to be described with reference to FIGS. 52(a) to (g). In FIGS. 52(a) to (g), portions identical with those of the first embodiment to the third embodiment described above carry the same reference numerals.

First, by the step shown in FIGS. 51(a) to (g), the leadframe 10C is manufactured (FIG. 52(a)), and a thermoplastic resin or a thermosetting resin is injection molded or transfer molded to the leadframe 10C, to form the outer resin portion 23 (FIG. 52(b)).

Then, the LED element 21 is mounted over the mounting surface 11a of the main body portion 11 of the leadframe 10C. In this step, the LED element 21 is placed and fixed over the mounting surface 11a (on the reflection metal layer 12C) of the main body portion 11 by using a solder or a die bonding paste (die attaching step) (FIG. 35(c)).

Then, a terminal portion 21a of the LED element 21 and the surface of a second portion 26 of the main body portion 11 are electrically connected to each other by a bonding wire 22 (wire bonding step) (FIG. 52(d)).

Then, an encapsulating resin portion 24 is filled in a concave portion 23a of an outer resin portion 23 and the LED element 21 and the bonding wire 22 are encapsulated by the encapsulating resin portion 24 (FIG. 35(e)).

Then, the leadframe 10C is separated on every LED element 21 by dicing the outer resin portion 23 between each of the LED elements 21 (FIG. 52(f)).

As described above, the semiconductor device 20C shown in FIG. 49 and FIG. 50 can be obtained (FIG. 52(g)).

Function and Effect of this Embodiment

Then, the function and the effect according this embodiment are to be described. In the semiconductor device 20C according to this embodiment, the intermediate layer 15 is disposed between the reflection metal layer 12C and the main body portion 11, and the intermediate layer 15 has the copper layer 16, the nickel layer 17, and the gold layer 18 disposed successively from the side of the main body portion 11. Thus, the following function and effect can be obtained.

When the semiconductor device 20C is manufactured, heat is sometimes applied to the leadframe 10C, for example, during die bonding (FIG. 52(c)) or wire bonding (FIG. 52(d)). Specifically, during die bonding, a heat at about 300° C. to 400° C. is sometimes applied, for example, in a case of solder bonding, and a heat at about 150° C. to 200° C. is sometimes applied, for example, in a case of paste connection. Further, heat at about 150° C. to 250° C. is sometimes applied, for example, during wire bonding.

Figure 53:
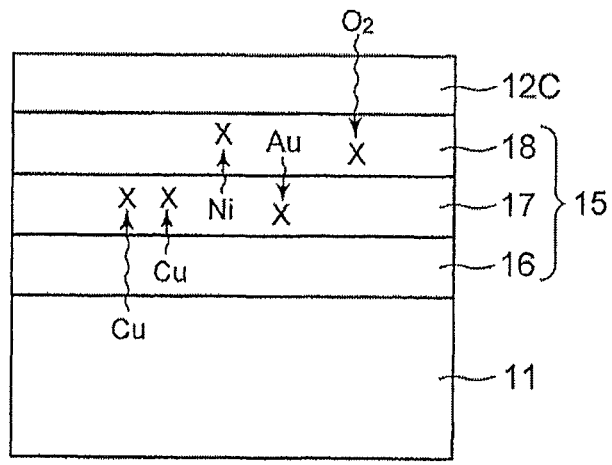
FIG. 53 is a cross sectional view showing the effect of a leadframe according to the fourth embodiment of the present invention.

In this case, as shown in FIG. 53, copper (Cu) from the main body portion 11 or the copper layer 16 forms an alloy with nickel in the upper layer. In this embodiment, copper (Cu) from the main body portion 11 or the copper layer 16 forms an alloy with nickel and is stabilized with concentration gradient. As a result, diffusion thereof is stopped by the nickel layer 17 and does not proceed above the gold layer 18.

If the main body portion comprises a copper alloy and the copper layer 16 is not disposed, diffusion of the components other than copper of the copper alloy is sometimes hindered to cause Kirkendall voids upon formation of the nickel alloy. However, the voids can be prevented by the provision of the copper layer 16.

Accordingly, diffusion of copper (Cu) from the main body portion 11 or the copper layer 16 to the surface of the reflection metal layer 12C is prevented. This can prevent degradation of the solder wettability or the bondability at the surface of the reflection metal layer 12C due to diffusion of copper (Cu).

Further, nickel (Ni) from the nickel layer 17 is diffused (piles up) toward Au thereabove. Pile up means that a slight amount of Ni atoms move between dislocations of Au crystallinity due to inter-crystal movement by thermal vibrations of Au (recrystallization) so that Ni emerges at extremely local site on the surface of Au. Since the diffusion is stopped at the boundary between the gold layer 18 and the reflection metal layer 12C and does not proceed to the reflection metal layer 12C, degradation of the solder wettability and the bondability on the surface of the reflection metal layer 12C due to diffusion of nickel (Ni) can be prevented.

Further, although silver and silver alloy allow oxygen in the air to permeate therethrough, which oxidizes the underlying metal and degrades the bondability, gold does not allow oxygen to permeate therethrough. Accordingly, oxygen ($O_2$) from the air is blocked at the gold layer 18 and does not proceed to the main body portion 11 and the nickel layer 17. Therefore, penetration of oxygen ($O_2$) from the surface of the reflection metal layer 12C to the main body portion 11 can be prevented. This can prevent oxidation of the nickel layer 17 due to oxygen ($O_2$) from the air which may lower the pull strength between the nickel layer 17 and the reflection metal layer 12C thereby causing peeling of the reflection metal layer 12C from the nickel layer 17.

As described above, according to this embodiment, diffusion of copper (Cu) contained in the main body portion 11 or the copper layer 16 to the surface of the reflection metal layer 12C can be prevented, and penetration of oxygen ($O_2$) from the surface of the reflection metal layer 12C to the main body portion 11 can be prevented. This can enhance the heat resistance of the semiconductor device 20C, as well as reduce the thickness of the intermediate layer 15 between the reflection metal layer 12C and the main body portion 11.

Meanwhile, in the semiconductor device 20C according to this embodiment, the reflection metal layer 12C serving as the reflection layer is disposed over the mounting surface 11a of the main body portion 11 as described above. The reflection metal layer 12C comprises the alloy of platinum and silver or the alloy of gold and silver. In view of the above, even when a corrosive gas penetrates into the semiconductor device 20C after lapse of a predetermined time from the manufacture of the semiconductor device 20C, the reflection layer (reflection metal layer 12C) is less discolored or corroded and the reflectance thereof is not lowered in the same manner as in the case of the first embodiment to the third embodiment described above.

Further, according to this embodiment, since the reflection layer comprises a reflection metal layer 12C and has high reflection characteristics, it can efficiently reflect light from the LED element 21.

Further, according to this embodiment, since the reflection metal layer 12C is extremely thin, the increase in cost is less even when a relatively expensive platinum or gold is used. Further, since the reflection metal layer 12C comprises the alloy of platinum and silver or the alloy of gold and silver, the manufacturing cost can be suppressed compared with the use of only platinum or gold as the material for the reflection metal layer 12C.

Further, according to this embodiment, since the thickness of the intermediate layer 15 can be reduced (for example, about 1 µm to 2 µm), the manufacturing cost can be decreased compared with that when a relatively thick silver layer (Ag) layer is used.

Further, according to this embodiment, by applying partial metal processing as shown in FIG. 51(g), manufacturing cost can be decreased compared with that when metal processing is applied over the entire surface.

Further, according to this embodiment, since the reflection metal layer 12C and the intermediate layer 15 are thin and, accordingly, the variation of thickness can be decreased naturally, scars formed by pressing a die to the metal surface can be decreased upon molding of the outer resin portion 23. Thus, burrs caused by resin leakage into the gap between the die and the metal surface can be decreased.

Further, according to this embodiment, since the reflection metal layer 12C and the intermediate layer 15 are thin, the thickness of the semiconductor device 20C can be reduced.

Each of modified embodiments of the semiconductor device according to this embodiment is to be described with reference to FIG. 54 to FIG. 59. In FIG. 54 to FIG. 59, portions identical with those of the embodiments shown in FIG. 6 to FIG. 11, FIG. 21 to FIG. 28, and FIG. 36 to FIG. 43 carry the same reference numerals, and detailed description therefor is to be omitted.

In each of the modified examples shown in FIG. 54 to FIG. 59, an intermediate layer 15 is disposed on the side of the mounting surface 11a of a main body portion 11, and a reflection metal layer 12C serving as a reflection layer for reflecting light from an LED element 21 is disposed on the intermediate layer 15 in the same manner as in the embodiment shown in FIG. 49 and FIG. 50.

Figure 54:
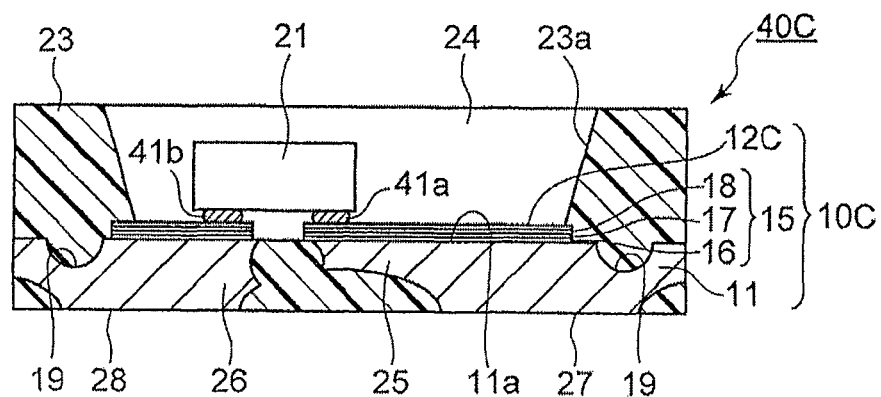
FIG. 54 is a cross sectional view showing a modified example of the semiconductor device according to the fourth embodiment of the present invention.

FIG. 54 is a cross sectional view showing a modified embodiment (SON type) of a semiconductor device according to this embodiment. A semiconductor device 40C shown in FIG. 54 is different in the configurations for each of the layers disposed over the mounting surface 11a of the main body portion 11, and other configurations are substantially identical with the configurations of the semiconductor device 40 shown in FIG. 6, the semiconductor device 40A shown in FIG. 21 and the semiconductor device 40B shown in FIG. 36 described above.

Figure 55:
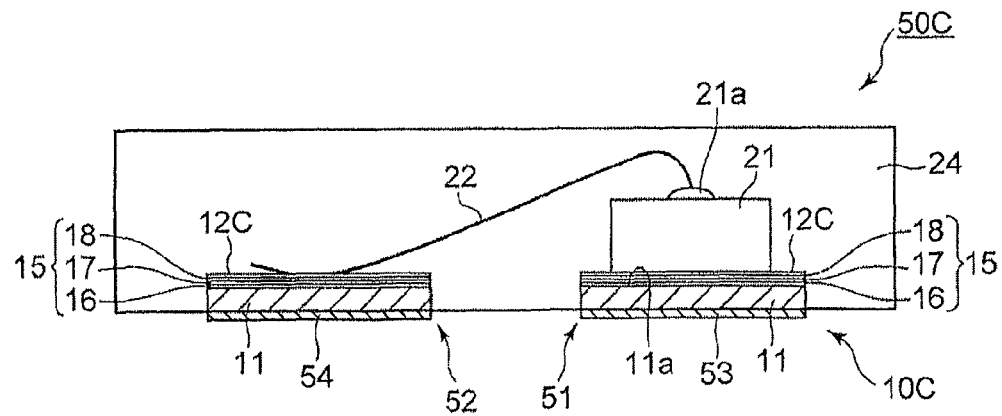
FIG. 55 is a cross sectional view showing a modified example of the semiconductor device according to the fourth embodiment of the present invention.

FIG. 55 is a cross sectional view showing a modified embodiment (LGA type) of a semiconductor device according to this embodiment. A semiconductor device 50C shown in FIG. 55 is different in the configurations for each of the layers disposed over the mounting surface 11a of the main body portion 11, and other configurations are substantially identical with the configurations of the semiconductor device 50 shown in FIG. 7, the semiconductor device 50A shown in FIG. 22, and the semiconductor device 50B shown in FIG. 56B described above.

Figure 56:
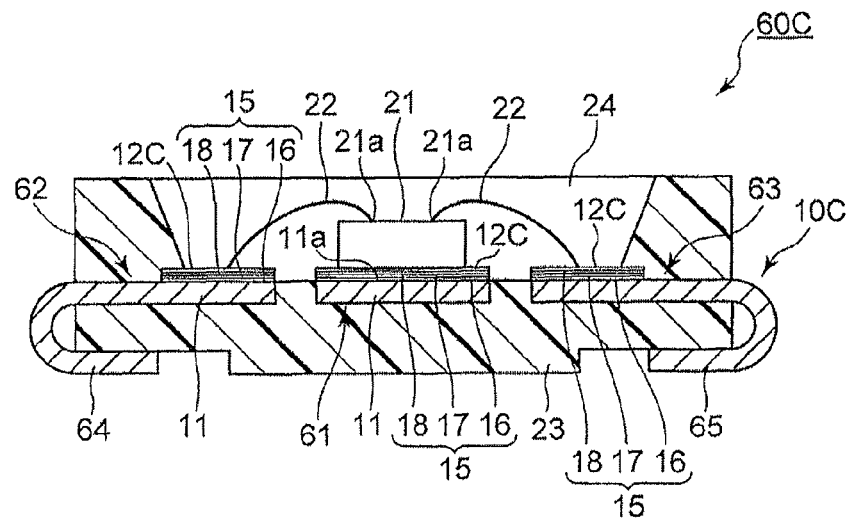
FIG. 56 is a cross sectional view showing a modified example of the semiconductor device according to the fourth embodiment of the present invention.

FIG. 56 is a cross sectional view showing a modified embodiment (PLCC type) of a semiconductor device according to this embodiment. A semiconductor device 60C shown in FIG. 56 is different in the configurations for each of the layers disposed over the mounting surface 11a of the main body portion 11, and other configurations are substantially identical with the configurations of the semiconductor device 60 shown in FIG. 8, the semiconductor device 60A shown in FIG. 23 and the semiconductor device 60B shown in FIG. 38 described above.

Figure 57:
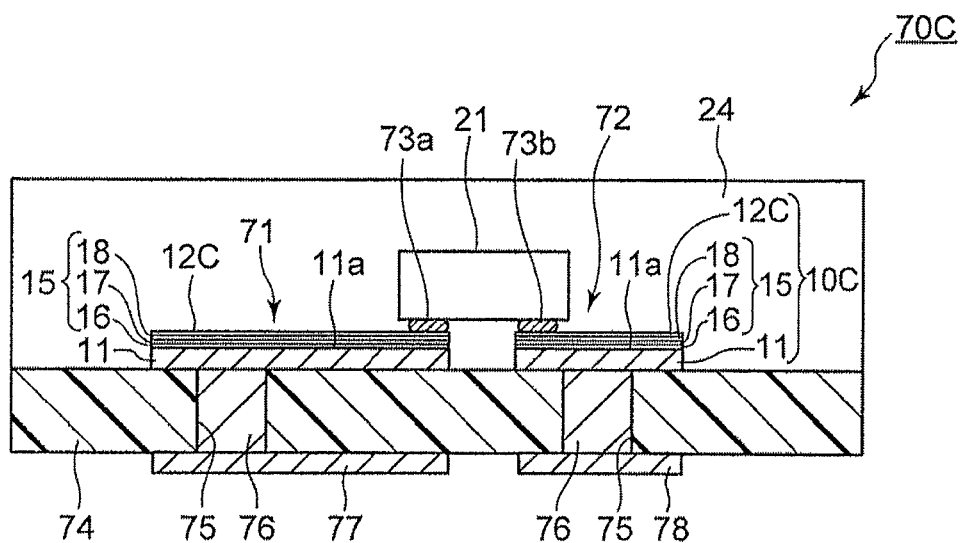
FIG. 57 is a cross sectional view showing a modified example of the semiconductor device according to the fourth embodiment of the present invention.

FIG. 57 is a cross sectional view showing a modified embodiment (substrate type) of a semiconductor device according to this embodiment. A semiconductor device 70C shown in FIG. 57 is different in the configurations for each of the layers disposed over the mounting surface 11a of the main body portion 11, and other configurations are substantially identical with the configurations of the semiconductor device 70 shown in FIG. 9, the semiconductor device 70A shown in FIG. 24, and the semiconductor device 70B shown in FIG. 39 described above.

Figure 58:
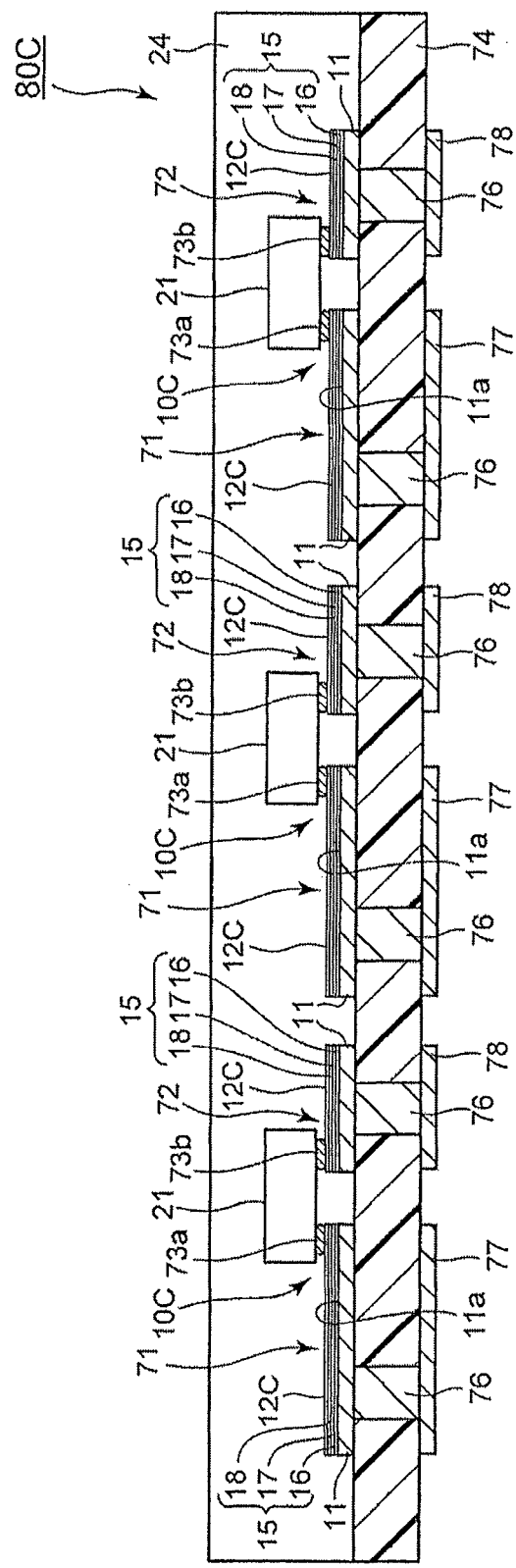
FIG. 58 is a cross sectional view showing a modified example of the semiconductor device according to the fourth embodiment of the present invention.

FIG. 58 is a cross sectional view showing a modified embodiment (module type) of a semiconductor device according to this embodiment. A semiconductor device 80C shown in FIG. 58 is different in the configurations for each of the layers disposed over the mounting surface 11a of the main body portion 11, and other configurations are substantially identical with the configurations of the semiconductor device 80 shown in FIG. 10, the semiconductor device 80A shown in FIG. 25, and the semiconductor device 80B shown in FIG. 40 described above.

Figure 59:
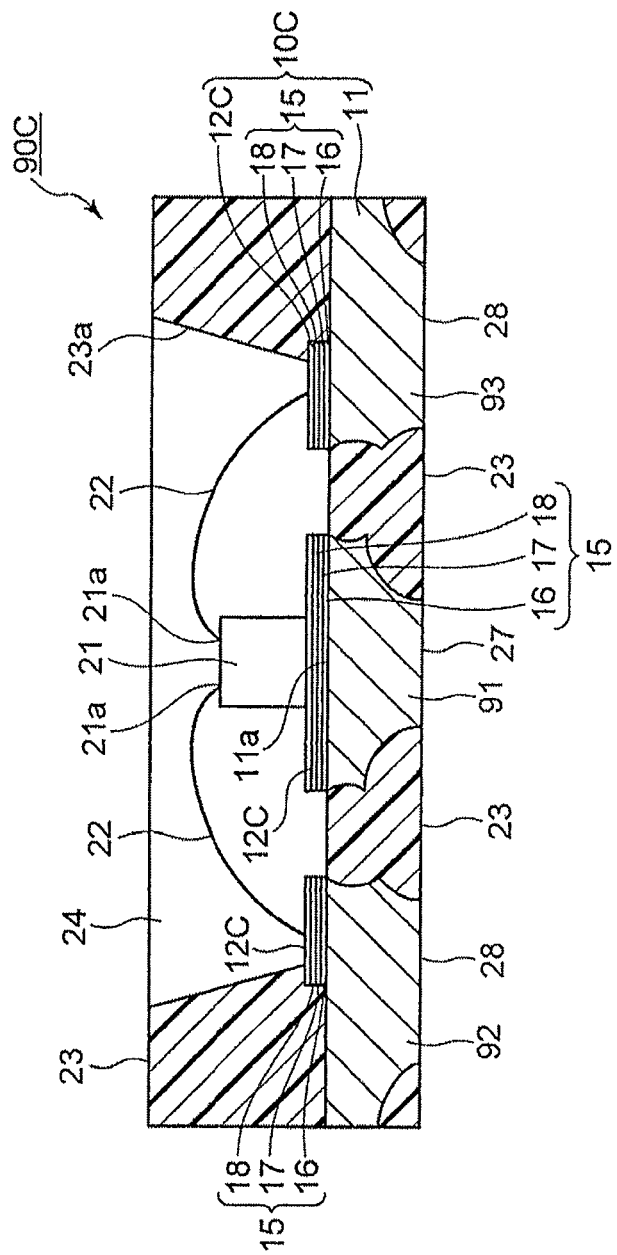
FIG. 59 is a cross sectional view showing a modified example of the semiconductor device according to the fourth embodiment of the present invention.

FIG. 59 is a cross sectional view showing a modified embodiment (SON type) of a semiconductor device according to this embodiment. A semiconductor device 90C shown in FIG. 59 is different in the configurations for each of the layers disposed over the mounting surface 11a of the main body portion 11 and other configurations are substantially identical with the configurations of the semiconductor device 90 shown in FIG. 11, the semiconductor device 90A shown in FIG. 26, and the semiconductor device 90B shown in FIG. 41 described above.

Also in the semiconductor devices 40C, 50C, 60C, 70C, 80C, and 90C (FIG. 54 to FIG. 59) according to each of the modified embodiments of this preferred embodiment described above, substantially identical function and effect with those of the semiconductor device 20C shown in FIG. 49 and FIG. 50 can be obtained.

Example

Then, specific examples of the LED leadframe or LED substrate according to this embodiment are to be described.

Example 4-1

A substrate 10C comprising the configuration shown in FIG. 47 (Example 4-1) was manufactured. In the substrate 10C, the copper layer 16 (Cu), the nickel layer 17 (Ni), the gold layer 18 (Au), and the reflection metal layer 12C (alloy of gold (Au) and silver (Ag)) are stacked successively over the main body portion 11 (copper substrate). The layer configuration is hereinafter indicated as "main body portion (copper substrate)/copper layer (Cu)/nickel layer (Ni)/gold layer (Au)/reflection metal layer (alloy)".

Example 4-2

A substrate 10C comprising the configuration shown in FIG. 48 (Example 4-2) was manufactured. The substrate 10C (Example 4-2) comprises a layer configuration of: main body portion (copper substrate)/nickel layer (Ni)/gold layer (Au)/reflection metal layer (alloy).

Comparative Example 4-1

A substrate was manufactured in which the reflection metal layer 12C was stacked directly on the main body portion 11 without disposing the intermediate layer 15 (Comparative Example 4-1). The substrate (Comparative Example 4-1) has a layer configuration of: main body portion (copper substrate)/reflection metal layer (alloy).

Comparative Example 4-2

A substrate was manufactured in which only the copper layer 16 was interposed between the main body portion 11 and the reflection metal layer 12C (Comparative Example 4-2). The substrate (Comparative Example 4-2) comprises a layer configuration of: main body portion (copper substrate)/copper layer (Cu)/reflection metal layer (alloy).

Comparative Example 4-3

A substrate was manufactured in which only the silver layer (Ag) was interposed between the main body portion 11 and the reflection metal layer 12C (Comparative Example 4-3). The substrate (Comparative Example 4-3) comprises a layer configuration of: main body portion (copper substrate)/silver layer (Ag)/reflection metal layer (alloy).

Comparative Example 4-4

A substrate was manufactured in which the copper layer 16 and the silver layer (Ag) were interposed between the main body portion 11 and the reflection metal layer 12C (Comparative Example 4-4). The substrate (Comparative Example 4-4) comprises a layer configuration of: main body portion (copper substrate)/copper layer (Cu)/silver layer (Ag)/reflection metal layer (alloy).

Comparative Example 4-5

A substrate was manufactured in which only the nickel layer 17 was interposed between the main body portion 11 and the reflection metal layer 12C (Comparative Example 4-5). The substrate (Comparative Example 4-5) comprises a layer configuration of: main body portion (copper substrate)/nickel layer (Ni)/reflection metal layer (alloy).

Comparative Example 4-6

A substrate was manufactured in which the copper layer 16 and the nickel layer 17 were interposed between the main body portion 11 and the reflection metal layer 12C (Comparative Example 4-6). The substrate (Comparative Example 4-6) comprises a layer configuration of: main body portion (copper substrate)/copper layer (Cu)/nickel layer (Ni)/reflection metal layer (alloy).

Comparative Example 4-7

A substrate was manufactured in which the nickel layer 17 and the copper layer were interposed between the main body portion 11 and the reflection metal layer 12C (Comparative Example 4-7). The substrate (Comparative Example 4-7) comprises a layer configuration of: main body portion (copper substrate)/nickel layer (Ni)/copper layer (Cu)/reflection metal layer (alloy).

Comparative Example 4-8

A substrate was manufactured in which the copper layer 16, the nickel layer 17, and the copper layer were interposed between the main body portion 11 and the reflection metal layer 12C (Comparative Example 4-8). The substrate (Comparative Example 4-8) comprises a layer configuration of: main body portion (copper substrate)/copper layer (Cu)/nickel layer (Ni)/copper layer (Cu)/reflection metal layer (alloy).

Then, for each of the substrates (Examples 4-1, 4-2 and Comparative Examples 4-1 to 4-8), pull strength between metals forming each of the layers was investigated. Further, it was verified whether copper contained in the main body portion 11 diffused to the surface of the reflection metal layer 12C or not when each of the substrate was heated. The results are shown in Table 3.

TABLE 3

|  | Layer configuration | Pull strength between metals forming each of layers | Copper diffusion to surface during heating | Overall evaluation |
| --- | --- | --- | --- | --- |
| Example 4-1 | Main body portion (copper substrate)/copper layer (Cu)/nickel layer (Ni)/gold layer (Au)/reflection metal layer (alloy) | ○ (Good) | ○ (Good) | ◉ (Excellent) |
| Example 4-2 | Main body portion (copper substrate)/ nickel layer (Ni)/ gold layer (Au)// | Δ (Fair) between main body portion (copper substrate)/nickel | ○ (Good) | ○ (Good) |

TABLE 3-continued

| | Layer configuration | Pull strength between metals forming each of layers | Copper diffusion to surface during heating | Overall evaluation |
|---|---|---|---|---|
| | reflection metal layer (alloy) | layer (Ni)<br>○ (Good) between nickel layer (Ni)/gold layer (Au)/reflection metal layer (alloy) | | |
| Comparative Example 4-1 | Main body portion (copper substrate)/reflection metal layer (alloy) | X (Poor) | X (Poor) | X (Poor) |
| Comparative Example 4-2 | Main body portion (copper substrate)/copper layer (Cu)/reflection metal layer (alloy) | ○ (Good) | X (Poor) | X (Poor) |
| Comparative Example 4-3 | Main body portion (copper substrate)/silver layer (Ag)/reflection metal layer (alloy) | Δ (Fair) between main body portion (copper substrate)/silver layer (Ag)<br>○ (Good) between silver layer (Ag)/reflection metal layer (alloy) | ○ (Good) silver layer (Ag) exceeding 1 μm<br>X (Poor) Silver layer (Ag) below 1 μm | ○ (Good) |
| Comparative Example 4-4 | Main body portion (copper substrate)/copper layer (Cu)/silver layer (Ag)/reflection metal layer (alloy) | ○ (Good) | ○ (Good) silver layer (Ag) exceeding 1 μm<br>X (Poor) Silver layer (Ag) below 1 μm | ○ (Good) |
| Comparative Example 4-5 | Main body portion (copper substrate)/nickel layer (Ni)/reflection metal layer (alloy) | Δ (Fair) between main body portion (copper substrate)/nickel layer (Ni)<br>X (Poor) between nickel layer (Ni)/reflection metal layer(alloy) | ○ (Good) | X (Poor) |
| Comparative Example 4-6 | Main body portion (copper substrate)/copper layer (Cu)/nickel layer (Ni)/reflection metal layer (alloy) | ○ (Good) between main body portion (copper substrate)/copper layer (Cu)/nickel layer (Ni)<br>X (Poor) between nickel layer (Ni)/reflection metal layer (alloy) | ○ (Good) | X (Poor) |
| Comparative Example 4-7 | Main body portion (copper substrate)/nickel layer (Ni)/copper layer (Cu)/reflection metal layer (alloy) | Δ (Fair) between main body portion (copper substrate)/nickel layer (Ni)<br>○ (Good) between nickel layer (Ni)/copper layer (Cu)/reflection metal layer (alloy) | Δ (Fair) (remarkable when reflection metal layer (alloy) is below 1 μm) | X (Poor) |
| Comparative Example 4-8 | Main body portion (copper substrate)/copper layer (Cu)/nickel layer (Ni)/copper layer (Cu)/reflection metal layer (alloy) | ○ (Good) between main body portion (copper substrate)/copper layer (Cu)/nickel layer (Ni)<br>○ (Good) between | Δ (Fair) (remarkable when reflection metal layer (alloy) is below 1 μm) | X (Poor) |

TABLE 3-continued

| Layer configuration | Pull strength between metals forming each of layers | Copper diffusion to surface during heating | Overall evaluation |
|---|---|---|---|
| nickel layer (Ni)/copper layer (Cu)/ reflection metal layer (alloy) | | | |

◯: good bondability
◎: No diffusion

As shown in Table 3, in the substrates 10C according to Examples 4-1 and 4-2, pull strength between metals forming each of layers was satisfactory and copper was not diffused to the surface of the reflection metal layer 12C during heating.

In the substrates according to Comparative Examples 4-3 and 4-4, the pull strength between metals forming each of the layers was satisfactory and, when the thickness of the silver layer (Ag) exceeds 1 µm, copper was not diffused to the surface of the reflection metal layer 12C during heating. However, when the thickness of the silver layer (Ag) was below 1 µm, a phenomenon of copper diffusion to the surface of the reflection metal layer 12C was observed during heating.

In the substrates according to other comparative examples (Comparative Examples 4-1, 4-2, and 4-5 to 4-8), the pull strength between metals forming each of the layers was partially lower (Comparative Examples 4-3, 4-5, 4-6, and 4-7), or copper diffusion occurred at the surface of the reflection metal layer 12C during heating (Comparative Examples 4-3, 4-4, 4-7, and 4-8).

In each of the substrates (Examples 4-1, 4-2, and Comparative Examples 4-1 to 4-8), while the alloy of gold (Au) and silver (Ag) is used for the reflection metal layer, identical results can be obtained even when the alloy of platinum (Pt) and silver (Ag) is used.

Two types of substrates (Example 4-A, and Comparative Example 4-A) shown below were manufactured.

Example 4-A

A substrate 10C (Example 4-A) was manufactured by stacking the copper layer 16 (0.1 µm thickness), the nickel layer 17 (1 µm thickness), and the gold layer 18 (0.01 µm thickness) successively over the main body portion 11 comprising a copper substrate, and forming the reflection metal layer 12C comprising the alloy of gold and silver on the gold layer 18. In this case, the reflection metal layer 12C has a composition containing 50% by weight of gold and the balance being silver and an evitable impurity.

Comparative Example 4-A

A substrate (Comparative Example 4-1) was manufactured by forming the copper plating layer (0.1 µm thickness) on the main body portion 11 comprising the copper plate, and forming a silver plating layer (3 µm thickness) on the copper plating layer. The substrate (Comparative Example 4-A) was identical with the substrate according to Comparative Example 1-A described above.

<Initial Reflectance>

The reflectance (initial reflectance) at the surface of the two types of the substrates (Example 4-A and Comparative Example 4-A) was measured.

<Reflectance after Heat Resistance Test>

Further, for evaluating the heat resistance of the two types of the substrates (Example 4-A and Comparative Example 4-A), heat resistance test was carried out on each of the substrates. Specifically, each of the substrates was left in an atmosphere at 150° C. for 1008 hours (42 days). Then, the reflectance (reflectance after the heat resistance test) was measured by the same method as in the case of the initial reflectance.

Figure 60:
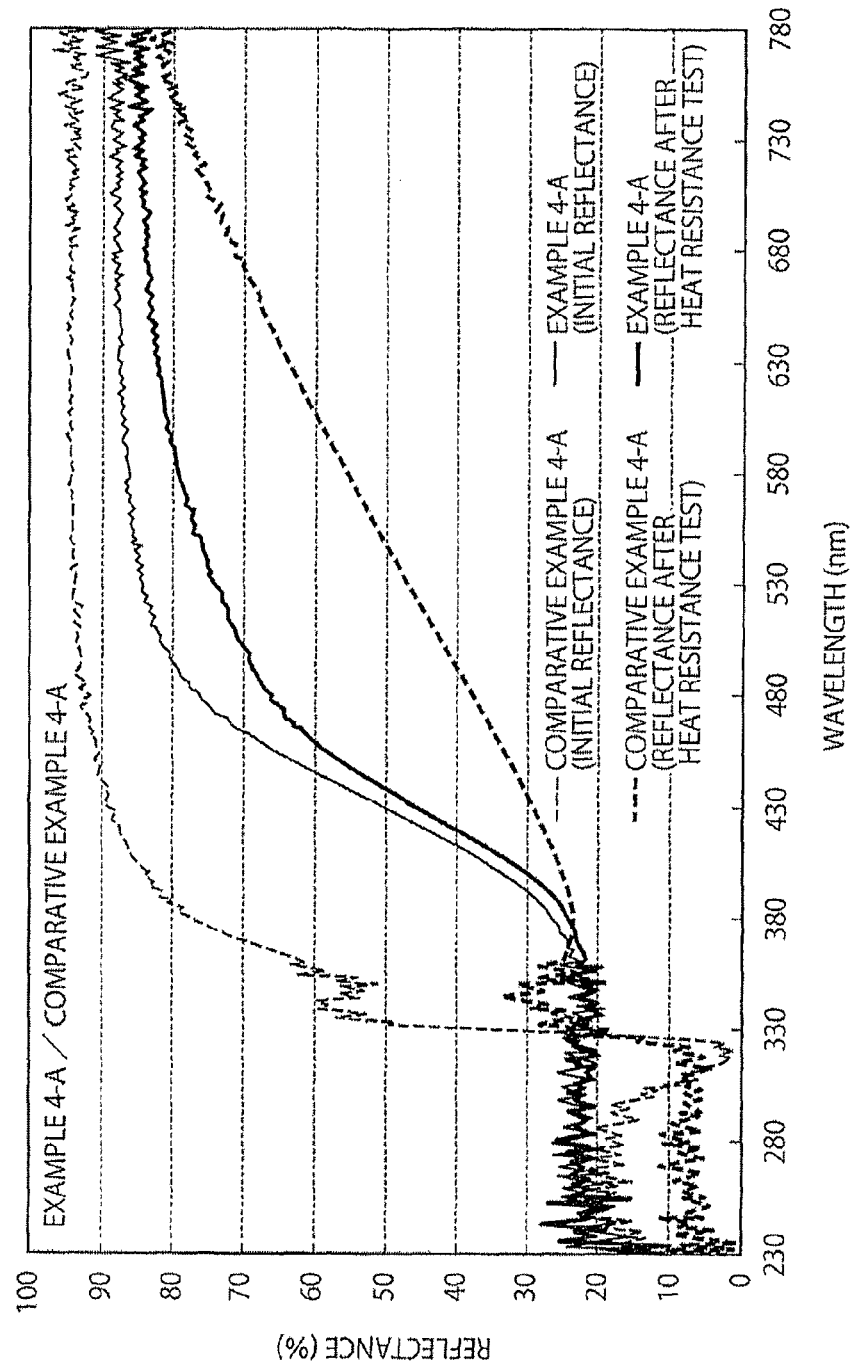
FIG. 60 is a graph comparing the change of the reflectance between Example 4-A and Comparative Example 4-A.

The results are shown in FIG. 60. FIG. 60 is a graph showing the initial reflectance and the reflectance after the heat resistance test in comparison for Example 4-A and Comparative Example 4-A.

As a result, in the substrate of Example 4-A (nickel/gold/ gold-silver alloy), it was found that the reflectance after the heat resistance was not changed greatly from the initial reflectance, the heat resistance of the reflection metal layer 12C was improved, and the reflectance was less likely to be lowered by the heat.

In the substrate of Comparative Example 1-A (silver), the reflectance after the heat resistance test was remarkably lowered from the initial reflectance. Accordingly, it can be said that the reflectance of the silver plating layer may possibly be lowered by the heat.

<Reflectance after Solution Test>

Then, for investigating the sulfurization resistance of the two types of the substrates (Example 4-A and Comparative Example 4-A), a solution test was carried out on each of the substrates and the reflectance after the solution test was measured.

<Reflectance after Gas Test>

Further, for investigating the sulfurization resistance of the two types of the substrates (Example 4-A and Comparative Example 4-A), a gas test was carried out on each of the substrates and the reflectance after the solution test was measured.

<Continuity of Wire Bonding (W/B)>

It was investigated whether wire bonding could be applied continuously on the surface of the two types of the substrates (Example 4-A and Comparative Example 4-A) described above.

<Strength of Wire Bonding (W/B)>

Wire pull strength was investigated when wire bonding was performed on the surface of the two types of the substrates (Example 4-A and Comparative Example 4-A) described above.

<Solder Wettability>

Solder wettability of the two types of the substrates (Example 4-A and Comparative Example 4-A) was investigated.

Measuring methods for the initial reflectance, reflectance after the solution test, the reflectance after the gas test, the continuity of wire bonding (W/B), the wire bonding (W/B) strength, and the solder wettability are identical with those of the first embodiment described above (Example 1-A, Example 1-B, Comparative Example 1-A).

The results are collectively shown in Table 4.

TABLE 4

| Corrosion resistant plating composition | Initial reflectance (wavelength 400 to 460 nm) | Evaluation for sulfurization resistance (wavelength 460 nm) | | W/B evaluation | | Solder wettability Zero cross |
|---|---|---|---|---|---|---|
| | | Reflectance after solution test (U-5) | Reflectance after gas test (1H) | Continuity | Strength | |
| Example 4-A (nickel/gold/gold silver alloy) | 33 to 68% | 59% | 52% | ⊚ (Excellent) | 8.4 g | 1.2 sec |
| Comparative Example 4-A (silver) | 85 to 92% | 22% | 36% | ⊚ (Excellent) | 7.0 g | 0.9 sec |

As a result, in the substrate of Example 4-A (nickel/gold/gold-silver alloy), it was found that both of the reflectance after the solution test and the reflectance after the gas test were scarcely changed from the initial reflectance, and that the reflection metal layer 12C was less likely to be corroded by a corrosive gas such as a hydrogen sulfide gas.

In the substrate of Comparative Example 4-A (silver), both the reflectance after the solution test and the reflectance after the gas test were lowered remarkably from the initial reflectance and it can be said that the silver plating layer may possibly be corroded by a corrosive gas such as a hydrogen sulfide gas.

Further, the two types of substrates (Example 4-A and Comparative Example 4-A) exhibited good results in all of the continuity of the wire bonding (W/B), the wire bonding (W/B) strength, and the solder wettability.

The invention claimed is:

1. An LED resin-attached leadframe for mounting an LED element, comprising:
    a main body portion having a die pad for mounting the LED element, and a lead portion disposed in a spaced relation to the die pad;
    a first metal plating layer disposed on both of the die pad and the lead portion provided on the main body portion;
    a second metal plating layer disposed on the first metal plating layer; and
    a reflector surrounding a portion on which the LED element is mounted and filling a space between the lead portion and the die pad, wherein:
    on the leadframe, a first region is provided between the reflector surrounding the portion on which the LED element is mounted and the die pad, the first region not being covered with the first and second metal plating layers,
    on the leadframe, a second region is provided between the reflector surrounding the portion on which the LED element is mounted and the lead portion, the second region not being covered with the first and second metal plating layers,
    first non-through trench and a second non-through trench are formed on the surface of the leadframe below a planar surface on which the LED element is to be mounted, the first non-through trench and the second non-through trench being located between the leadframe and reflector,
    the first non-through trench is located adjacent to the first region and the second non-through trench is located adjacent to the second region,
    an inside of the first non-through trench and an inside of the second non-through trench are not covered with the first and second metal plating layers, and
    the first region is located between first lateral edges of the first and second metal plating layers and the first non-through trench, and
    the second region is located between second lateral edges of the first and second metal plating layer and the second non-through trench.

2. The LED resin-attached leadframe according to claim 1, wherein
    an underlying plating layer is disposed between the body portion and the first metal plating layer.

3. The LED resin-attached leadframe according to claim 1, wherein
    the main body portion comprises a metal plate,
    a first outer lead portion is formed at a bottom of the die pad, and a second outer lead portion is formed at a bottom of the lead portion, and
    the first outer lead portion and the second outer lead portion are exposed to the outside of the reflector, respectively.

4. The LED resin-attached leadframe according to claim 1, wherein
    on the die pad, the second metal plating layer extends from a portion located adjacent an inner side of the first non-through trench, to an inner end of the die pad facing the lead portion, and
    on the lead portion, the second metal plating layer extends from a portion located adjacent an inner side of the second non-through trench, to an inner end of the lead portion facing the die pad.

5. A semiconductor device comprising:
    an LED resin-attached leadframe including a main body portion having a die pad for mounting an LED element, and a lead portion disposed in a spaced relation to the die pad;

the LED element mounted over the die pad of the main body portion of the leadframe;
an electroconductive portion electrically connecting the leadframe and the LED element;
an encapsulating resin portion for encapsulating the LED element and the electroconductive portion; and
a reflector surrounding a portion on which the LED element is mounted and filling a space between the lead portion and the die pad, wherein
a first metal plating layer is disposed on both of the die pad and the lead portion provided on the main body portion of the LED leadframe,
a second metal plating layer is disposed on the first metal plating layer,
on the leadframe, a first region is provided between the reflector surrounding the portion on which the LED element is mounted and the die pad, the first region not being covered with the first and second metal plating layers,
on the leadframe, a second region is provided between the reflector surrounding the portion on which the LED element is mounted and the lead portion, the second region not being covered with the first and second metal plating layers,
a first non-through trench and a second non-through trench are formed on the surface of the leadframe below a planar surface on which the LED element is mounted, the first non-through trench and the second non-through trench being located between the leadframe and the reflector,
the first non-through trench is located adjacent to the first region and the second non-through trench is located adjacent to the second region,
an inside of the first non-through trench and an inside of the second non-through trench are not covered with the first and second metal plating layers, and
the first region is located between lateral edges of the first and second metal plating layers and the first non-through trench, and
the second region is located between second lateral edges of the first and second metal plating layers and the second non-through trench.

6. The semiconductor device according to claim 5, wherein
an underlying plating layer is disposed between the main body portion and the first metal plating layer.

7. The semiconductor device according to claim 5, wherein
the encapsulating resin portion comprises a silicone resin.

8. The semiconductor device according to claim 5, further comprising
a reflector surrounding the LED element and having a concave portion, wherein
the encapsulating resin portion is filled in the concave portion of the reflector.

9. The semiconductor device according to claim 5, wherein
on the die pad, the second metal plating layer extends from a portion located adjacent an inner side of the first non-though trench, to an inner end of the die pad facing the lead portion, and
on the lead portion, the second metal plating layer extends from a portion located adjacent an inner side of the second non-through trench, to an inner end of the lead portion facing the die pad.

10. A semiconductor device comprising:
a leadframe including a main body portion having a die pad for mounting an LED element, and a lead portion disposed in spaced relation to the die pad;
the LED element mounted over the die pad of the main body portion of the leadframe;
an electroconductive portion electrically connecting the leadframe and the LED element; and
an encapsulating resin portion for encapsulating the LED element and the electroconductive portion; and
a reflector filling a space between the lead portion and the die pad, wherein
a first metal plating layer is disposed on both of the die pad and the lead portion provided on the main body portion of the leadframe,
a second metal plating layer is disposed on the first metal plating layer,
the leadframe comprises an upper surface and a lower surface that is opposite to the upper surface,
the leadframe comprises an exposed surface perpendicular to the upper surface and the lower surface, the exposed surface being exposed to the outside of the semiconductor device, a thickness of the exposed surface being thinner than a thickness of a metal substrate for the main body portion of the leadframe due to a recess formed on the lower-surface side of the leadframe, the recess having a curved surface and being filled with the reflector, and
the encapsulating resin portion covers substantially the whole upper surface side of the leadframe.

11. The semiconductor device according to claim 10, wherein an underlying plating layer is disposed between the body portion and the first metal plating layer.

12. A method for manufacturing an LED leadframe, comprising:
a step of preparing a metal substrate;
a step of forming a resist layer, for the purpose of etching, on the metal substrate;
a step of etching the metal substrate by using the resist layer for etching as an etching resistant film, so as to form a main body portion having a die pad for mounting an LED element, a lead portion disposed in spaced relation to the die pad, and a first non-through trench and a second non-through trench being formed on a surface of the die pad and the lead portion;
a step of removing the resist layer for etching from the main body portion;
a step of forming a resist layer for the purpose of plating, having an opening at a position corresponding to a portion for forming a first metal plating layer and a second metal plating layer, on the surface of the die pad and the lead portion, wherein the first non-through trench and the second non-through trench are covered by the resist layer for plating;
a step of forming the first metal plating layer and the second metal plating layer, by plating, on the die pad and the lead portion inside the opening of the resist layer for plating; and
a step of removing the resist layer for plating from the die pad and the lead portion, wherein:
the first non-through trench is located adjacent to the first region and the second non-through trench is located adjacent to the second region,
an inside of the first non-through trench and an inside of the second non-through trench are not covered with the first and second metal plating layers, and the first region is located between lateral edges of the first and second metal plating layers and the first non-through trench, and the second region is located between second lateral edges of the first and second metal plating layers and the second non-through trench.

* * * * *